United States Patent
Tasaki et al.

(10) Patent No.: US 12,396,318 B2
(45) Date of Patent: Aug. 19, 2025

(54) ORGANIC EL DISPLAY DEVICE, AND ELECTRONIC APPARATUS

(71) Applicant: IDEMITSU KOSAN CO., LTD., Tokyo (JP)

(72) Inventors: Satomi Tasaki, Tokyo (JP); Tetsuya Masuda, Tokyo (JP); Kengo Kishino, Tokyo (JP); Kazuki Nishimura, Tokyo (JP); Yuki Nakano, Tokyo (JP); Yuichiro Kawamura, Tokyo (JP)

(73) Assignee: IDEMITSU KOSAN CO.,LTD., Tokyo (JP)

( * ) Notice: Subject to any disclaimer, the term of this patent is extended or adjusted under 35 U.S.C. 154(b) by 779 days.

(21) Appl. No.: 17/774,047

(22) PCT Filed: Nov. 6, 2020

(86) PCT No.: PCT/JP2020/041597
§ 371 (c)(1),
(2) Date: May 3, 2022

(87) PCT Pub. No.: WO2021/090931
PCT Pub. Date: May 14, 2021

(65) Prior Publication Data
US 2023/0006160 A1    Jan. 5, 2023

(30) Foreign Application Priority Data
Nov. 8, 2019   (JP) .................. 2019-203195

(51) Int. Cl.
*H10K 50/13* (2023.01)
*H10K 50/11* (2023.01)
(Continued)

(52) U.S. Cl.
CPC ............. *H10K 50/13* (2023.02); *H10K 50/11* (2023.02); *H10K 85/615* (2023.02);
(Continued)

(58) Field of Classification Search
CPC ............................ H10K 50/13; H10K 59/35
See application file for complete search history.

(56) References Cited

U.S. PATENT DOCUMENTS

2006/0017377 A1   1/2006   Ryu
2008/0252206 A1   10/2008  Ryu
(Continued)

FOREIGN PATENT DOCUMENTS

JP   2006-041471 A   2/2006
JP   2013-073759 A   4/2013
(Continued)

OTHER PUBLICATIONS

Tao et al., "Highly Efficient Non-Doped Blue Organic Light-Emitting Diodes Based on Fluorene Derivatives with High Thermal Stability," Advanced Functional Materials, vol. 15, No. 10, 2005, pp. 1716-1721.
(Continued)

*Primary Examiner* — Sean M DeGuire
(74) *Attorney, Agent, or Firm* — Foley & Lardner LLP

(57) ABSTRACT

An organic EL display device includes an anode and a cathode and includes a blue organic EL device, a green organic EL device, and a red organic EL device. The blue organic EL device includes a first emitting layer. The green organic EL device includes a second emitting layer. The red organic EL device includes a third emitting layer. The organic EL devices include a fourth emitting layer as a common layer. The fourth emitting layer is in direct contact with each of the emitting layers). The first emitting layer contains a compound represented by a formula (1) and having at least one group represented by a formula (11). The fourth emitting layer contains a second compound represented by a formula (2).
(Continued)

(1)

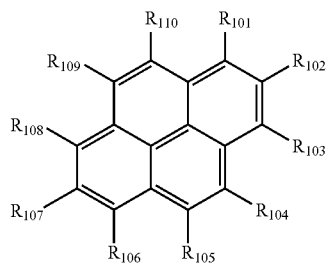

(11)

$*-(L_{101})_{\overline{mx}}-Ar_{101}$ (2)

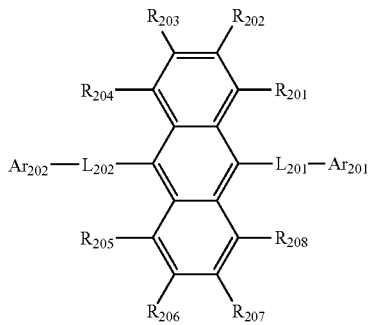

24 Claims, 1 Drawing Sheet

(51) Int. Cl.
  *H10K 85/60* (2023.01)
  *H10K 101/10* (2023.01)
(52) U.S. Cl.
  CPC ....... *H10K 85/622* (2023.02); *H10K 85/6574* (2023.02); *H10K 2101/10* (2023.02)

(56) References Cited

U.S. PATENT DOCUMENTS

| | | |
|---|---|---|
| 2015/0155515 A1 | 6/2015 | Kim et al. |
| 2016/0301014 A1 | 10/2016 | Kawamura et al. |
| 2019/0280209 A1 | 9/2019 | Fujita |
| 2019/0305242 A1 | 10/2019 | Takahashi et al. |
| 2020/0388780 A1 | 12/2020 | Niboshi et al. |

FOREIGN PATENT DOCUMENTS

| | | |
|---|---|---|
| JP | 2013-157552 A | 8/2013 |
| JP | 2014-072122 A | 4/2014 |
| JP | 2019-161218 A | 9/2019 |
| JP | 2019-186521 A | 10/2019 |
| WO | WO-2016/031785 A1 | 3/2016 |
| WO | WO-2019/064333 A1 | 4/2019 |

OTHER PUBLICATIONS

International Searching Authority, "International Search Report," issued in connection with International Patent Application No. PCT/JP2020/041597, dated Dec. 22, 2020.
International Searching Authority, "Written Opinion," issued in connection with International Patent Application No. PCT/JP2020/041597, dated Dec. 22, 2020.
Translation of International Searching Authority, "Written Opinion," issued in connection with International Patent Application No. PCT/JP2020/041597, dated Dec. 22, 2020.

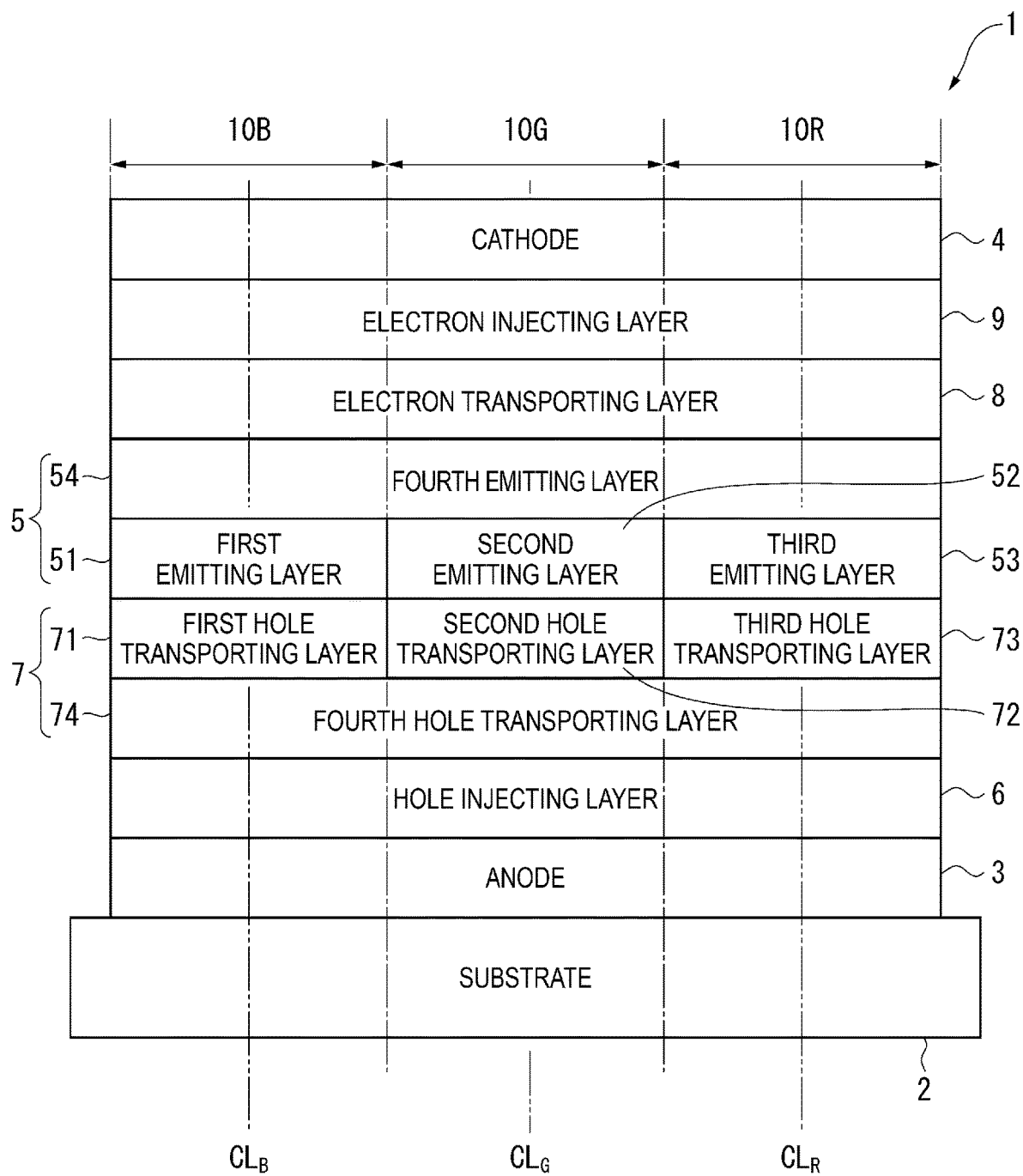

ORGANIC EL DISPLAY DEVICE, AND ELECTRONIC APPARATUS

CROSS-REFERENCE TO RELATED APPLICATIONS

The present application claims priority under 37 U.S.C. § 371 to International Patent Application No. PCT/JP2020/041597, filed Nov. 6, 2020, which claims priority to and the benefit of Japanese Patent Application No. 2019-203195, filed on Nov. 8, 2019. The contents of these applications are hereby incorporated by reference in their entireties.

TECHNICAL FIELD

The present invention relates to an organic EL display device and an electronic device.

BACKGROUND ART

An organic electroluminescence device (hereinafter also referred to as an organic EL device) has a structure in which an emitting layer is provided between an anode and a cathode. Holes are injected from the anode into the emitting layer, and electrons are injected from the cathode into the emitting layer. As a result of recombination of the holes and the electrons in the emitting layer, the organic EL device emits light.

To achieve organic EL devices with higher performance, various studies have been made on compounds used in organic EL devices. The performance of organic EL devices includes, for example, luminance, emission wavelength, chromaticity, luminous efficiency, drive voltage, and lifetime.

For example, Patent Literature 1 discloses an organic electroluminescence device including an anode-side emitting layer containing a pyrene derivative serving as a host material and a cathode-side emitting layer containing an anthracene derivative serving as a host material.

An organic EL display device includes an organic EL device as a pixel. The organic EL device serving as a pixel includes an emitting layer capable of emitting light with a color depending on an emission color.

For example, Patent Literature 2 discloses an organic emitting display including a first subpixel having a red emitting layer, a second subpixel having a green emitting layer, and a third subpixel having a blue emitting layer. In the organic emitting display according to Patent Literature 2, the blue emitting layer of the third subpixel is formed in common also in the first subpixel and the second subpixel.

CITATION LIST

Patent Literatures

Patent Literature 1: JP2019-161218 A
Patent Literature 2: U.S. Patent Application Publication No. 2015/155515

SUMMARY OF THE INVENTION

Problem(s) to be Solved by the Invention

An object of the invention is to provide an organic EL display device that can improve the performance of an organic EL device serving as a pixel without greatly increasing the cost of processing. Another object of the invention is to provide an electronic device including the organic EL display device.

Means for Solving the Problem(s)

According to an aspect of the invention, there is provided an organic EL display device including:
an anode and a cathode disposed opposite each other; and
a blue organic EL device serving as a pixel, a green organic EL device serving as a pixel, and a red organic EL device serving as a pixel;
in which the blue organic EL device includes a first emitting layer disposed between the anode and the cathode;
the green organic EL device includes a second emitting layer disposed between the anode and the cathode;
the red organic EL device includes a third emitting layer disposed between the anode and the cathode;
the blue organic EL device, the green organic EL device, and the red organic EL device include a fourth emitting layer disposed in common across the blue organic EL device, the green organic EL device, and the red organic EL device;
the fourth emitting layer is disposed between the cathode and the first emitting layer, the second emitting layer, and the third emitting layer;
the fourth emitting layer is in direct contact with each of the first emitting layer, the second emitting layer, and the third emitting layer;
the first emitting layer contains a first compound represented by a formula (1) below;
the first compound has at least one group represented by a formula (11) below; and
the fourth emitting layer contains a second compound represented by a formula (2) below.

[Formula 1]

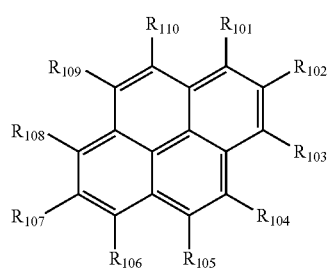

$$(1)$$

$$* \text{—}(L_{101})_{\overline{mx}} \text{Ar}_{101} \qquad (11)$$

In the formula (1):
$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and in the formula (11) represents a bonding position to a pyrene ring in the formula (1).

[Formula 2]

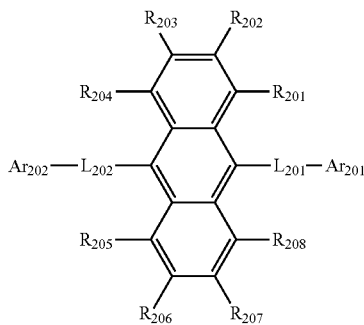

(2)

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{006}$)($R_{007}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the first compound represented by the formula (1) and the second compound represented by the formula (2), $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to another aspect of the invention, there is an organic EL display device including:

an anode and a cathode disposed opposite each other; and a blue organic EL device serving as a pixel, a green organic EL device serving as a pixel, and a red organic EL device serving as a pixel, in which the blue organic EL device includes a first emitting layer disposed between the anode and the cathode;

the green organic EL device includes a second emitting layer disposed between the anode and the cathode;

the red organic EL device includes a third emitting layer disposed between the anode and the cathode;

the blue organic EL device, the green organic EL device, and the red organic EL device include a fourth emitting layer disposed in common across the blue organic EL device, the green organic EL device, and the red organic EL device;

the fourth emitting layer is disposed between the cathode and the first emitting layer, the second emitting layer, and the third emitting layer;

the fourth emitting layer is in direct contact with each of the first emitting layer, the second emitting layer, and the third emitting layer;

the first emitting layer contains a first compound serving as a first host material;

the fourth emitting layer contains a second compound serving as a second host material;

the first host material and the second host material are mutually different;

the first emitting layer contains at least a compound that emits light with a maximum peak wavelength of 500 nm or less;

the fourth emitting layer contains at least a compound that emits light with a maximum peak wavelength of 500 nm or less;

the compound that is contained in the first emitting layer and that emits light with a maximum peak wavelength of 500 nm or less and the compound that is contained in the fourth emitting layer and that emits light with a maximum peak wavelength of 500 nm or less are mutually the same or different; and a triplet energy $T_1(H1)$ of the first host material and a triplet energy $T_1(H2)$ of the second host material satisfy a relationship of a numerical formula (Numerical Formula 1A) below.

$$T_1(H1) > T_1(H2) \quad \text{(Numerical Formula 1A)}$$

According to a still another aspect of the invention, an electronic device including the organic EL display device according to the above aspect of the invention is provided.

According to the above aspect of the invention, an organic EL display device that can improve the performance of an organic EL device serving as a pixel without greatly increasing the cost of processing can be provided. According to the above aspect of the invention, an electronic device including the organic EL display device can be provided.

BRIEF DESCRIPTION OF DRAWING

The FIG. schematically shows an exemplary configuration of an organic EL display device according to an exemplary embodiment of the invention.

DESCRIPTION OF EMBODIMENTS

First Exemplary Embodiment

Organic EL Display Device

An organic EL display device according to the present exemplary embodiment includes an anode and a cathode disposed opposite each other, and includes a blue organic EL device serving as a pixel, a green organic EL device serving as a pixel, and a red organic EL device serving as a pixel, in which the blue organic EL device includes a first emitting layer disposed between the anode and the cathode, the green organic EL device includes a second emitting layer disposed between the anode and the cathode, and the red organic EL device includes a third emitting layer disposed between the anode and the cathode; and the blue organic EL device, the green organic EL device, and the red organic EL device include a fourth emitting layer disposed in common across the blue organic EL device, the green organic EL device, and the red organic EL device.

The fourth emitting layer is disposed between the cathode and the first emitting layer, the second emitting layer, and the third emitting layer, and the fourth emitting layer is in direct contact with each of the first emitting layer, the second emitting layer, and the third emitting layer.

The first emitting layer contains a first compound represented by a formula (1) below, and the first compound has at least one group represented by a formula (11) below.

The fourth emitting layer contains a second compound represented by a formula (2) below.

An exemplary configuration of the organic EL display device according to the first exemplary embodiment will be described with reference to the FIG.

The FIG. illustrates an organic EL display device 1 according to an exemplary embodiment.

The organic EL display device 1 includes electrodes and organic layers supported by a substrate 2.

The organic EL display device 1 includes an anode 3 and a cathode 4 disposed opposite each other.

The organic EL display device 1 includes a blue organic EL device 10B serving as a pixel, a green organic EL device 10G serving as a pixel, and a red organic EL device 10R serving as a pixel.

It should be noted that the FIG. is a schematic view of the organic EL display device 1 and is not intended to limit a size of the organic EL display device 1, a thickness of each layer, and the like. For example, the first emitting layer, the second emitting layer, and the third emitting layer are illustrated as having the same thickness in the FIG., but this does not necessarily mean that these three layers have the same thickness in an actual organic EL display device.

In an exemplary embodiment, each of the blue organic EL device 10B, the green organic EL device 10G, and the red organic EL device 10R includes the anode 3, a hole injecting layer 6, a hole transporting zone 7, an emitting zone 5, an electron transporting layer 8, an electron injecting layer 9, and the cathode 4. Herein, the hole injecting layer 6, the hole transporting zone 7, the emitting zone 5, the electron transporting layer 8, and the electron injecting layer 9 may be collectively referred to as an organic layer.

In an exemplary embodiment, each of the blue organic EL device 10B, the green organic EL device 10G, and the red organic EL device 10R includes the anode 3, the hole injecting layer 6, the hole transporting zone 7, the emitting zone 5, the electron transporting layer 8, the electron injecting layer 9, and the cathode 4 in this order.

In an exemplary embodiment, the blue organic EL device 10B, the green organic EL device 10G, and the red organic EL device 10R serving as pixels are disposed in parallel on the substrate 2.

In an exemplary embodiment, the organic EL display device 1 includes the blue organic EL device 10B serving as a blue pixel, the green organic EL device 10G serving as a green pixel, and the red organic EL device 10R serving as a red pixel. In an exemplary embodiment, the pixels each independently receive a voltage. In the organic EL display device 1, the blue pixel, the green pixel, and the red pixel can be selectively made to emit light. The organic EL display device 1 according to an exemplary embodiment may include a plurality of units each including one blue pixel, one green pixel, and one red pixel. In this case, the plurality of units, each including one blue pixel, one green pixel, and one red pixel, may be repeatedly arranged on a substrate. The number of each pixel included in one unit may be plural. For example, one blue pixel, one green pixel, and two red pixels may constitute one unit. The organic EL display device according to the present exemplary embodiment may include a pixel that emits light with a color other than the colors of the blue pixel, the green pixel, and the red pixel.

Blue Organic EL Device

In an exemplary embodiment, the blue organic EL device 10B includes the anode 3, the hole injecting layer 6, the hole transporting zone 7, a first emitting layer 51, a fourth emitting layer 54, the electron transporting layer 8, the electron injecting layer 9, and the cathode 4 in this order.

In an exemplary embodiment, the blue organic EL device 10B includes the first emitting layer 51 and the fourth emitting layer 54 in the emitting zone 5. The blue organic EL device 10B may include another layer different from the layers illustrated in the FIG.

In an exemplary embodiment, the blue organic EL device 10B includes a first hole transporting layer 71 disposed between the anode 3 and the first emitting layer 51.

In an exemplary embodiment, the first hole transporting layer 71 is preferably in direct contact with the first emitting layer.

In an exemplary embodiment, the blue organic EL device 10B includes a fourth hole transporting layer 74. In this case, the hole transporting zone 7 in the blue organic EL device 10B includes the first hole transporting layer 71 and the fourth hole transporting layer 74.
First Emitting Layer The first emitting layer 51 is in direct contact with the fourth emitting layer 54. In addition, the first emitting layer 51 is in direct contact with the first hole transporting layer 71.

In an exemplary embodiment, the first emitting layer 51 preferably has a film thickness $D_{EM1}$ in a range from 2 nm to 12.5 nm.

The film thickness $D_{EM1}$ of the first emitting layer 51 is more preferably in a range from 2 nm to 10 nm, further preferably in a range from 3 nm to 7 nm.
Method of Measuring Film Thickness of Layer or Zone The film thickness of each layer or zone included in an organic EL device can be measured in the following manner.

A central part of an organic EL device including a target layer or zone is cut in a direction perpendicular to the plane of formation of the target layer or zone (i.e., the thickness direction of an organic layer), and a cross section of the central part is observed with a transmission electron microscope (TEM) to measure a film thickness.

For example, when the film thickness of the first emitting layer 51 is measured, the central part of the blue organic EL device 10B including a target layer is cut in a direction perpendicular to the plane of formation of the first hole transporting layer (i.e., the thickness direction of the first hole transporting layer), and a cross section of the central part is observed with a transmission electron microscope (TEM) to measure a film thickness. The central part of the blue organic EL device 10B is denoted by reference sign $CL_B$ in the FIG., the central part of the green organic EL device 10G is denoted by reference sign $CL_G$ in the FIG., and the central part of the red organic EL device 10R is denoted by reference sign $CL_R$ in the FIG.

The central part of an organic EL device means the central part of a shape of each pixel as viewed when the organic EL device is projected from the electrode side. For example, when the projected shape is rectangular, the central part of the organic EL device means the intersection of the diagonal lines of the rectangle.

Herein, when a zone or layer of interest includes a plurality of layers, the thickness of the zone or layer means the sum of the thicknesses of the plurality of layers.

The first emitting layer contains the first compound represented by the formula (1) as a first host material. The first compound has at least one group represented by the formula (11).

Herein, the "host material" refers to, for example, a material that accounts for "50 mass % or more of the layer". Therefore, for example, the first emitting layer contains the first compound represented by the formula (1) in an amount of 50 mass % or more relative to the total mass of the first emitting layer. For example, the "host material" may account for 60 mass % or more of the layer, 70 mass % or more of the layer, 80 mass % or more of the layer, 90 mass % or more of the layer, or 95 mass % or more of the layer.

In an exemplary embodiment, the first emitting layer also preferably contains a compound that emits light with a maximum peak wavelength in a range from 430 nm to 480 nm.

In an exemplary embodiment, the first emitting layer preferably further contains a third compound that is fluorescent. Herein, a "compound that is fluorescent" is a compound that does not exhibit delayed fluorescence. Thus, the third compound that is fluorescent is a compound that does not exhibit delayed fluorescence.

In an exemplary embodiment, the third compound is preferably a compound that emits light with a maximum peak wavelength in a range from 430 nm to 480 nm, more preferably a compound that emits fluorescence with a maximum peak wavelength in a range from 430 nm to 480 nm.

In an exemplary embodiment, when the first emitting layer contains the first compound and the third compound, the first compound is preferably a host material (also referred to as a matrix material), and the third compound is preferably a dopant material (also referred to as a guest material, an emitter, or a luminescent material).

In an exemplary embodiment, the first emitting layer preferably does not contain a phosphorescent material serving as a dopant material.

In an exemplary embodiment, the first emitting layer preferably does not contain a heavy metal complex or a phosphorescent rare earth metal complex. Here, examples of the heavy metal complex include iridium complexes, osmium complexes, and platinum complexes.

In an exemplary embodiment, the first emitting layer also preferably does not contain a metal complex.

Examples of blue fluorescent compounds usable for the first emitting layer include pyrene derivatives, styrylamine derivatives, chrysene derivatives, fluoranthene derivatives, fluorene derivatives, diamine derivatives, and triarylamine derivatives.

Herein, blue light emission refers to a light emission whose maximum peak wavelength in an emission spectrum is in a range from 430 nm to 500 nm.
First Compound The first compound is a compound represented by the formula (1). The first compound has at least one group represented by the formula (11).

[Formula 3]

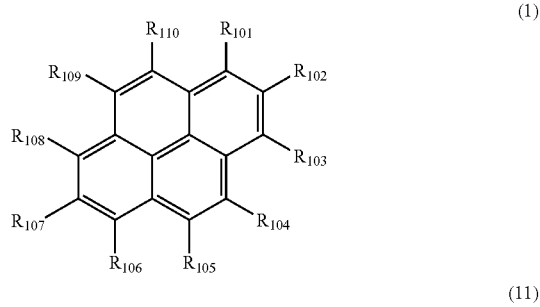

In the formula (1), $R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of R$_{101}$ to R$_{110}$ is a group represented by the formula (11);

when a plurality of groups represented by the formula (11) are present, the plurality of groups represented by the formula (11) are mutually the same or different;

L$_{101}$ is a single bond, a substituted or unsubstituted arylene group having 6 to 50 ring carbon atoms, or a substituted or unsubstituted divalent heterocyclic group having 5 to 50 ring atoms;

In an exemplary embodiment, Ar$_{101}$ is preferably a substituted or unsubstituted aryl group having 6 to 50 ring carbon atoms.

In an exemplary embodiment, Ar$_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In an exemplary embodiment, the first compound is preferably represented by a formula (101) below.

[Formula 4]

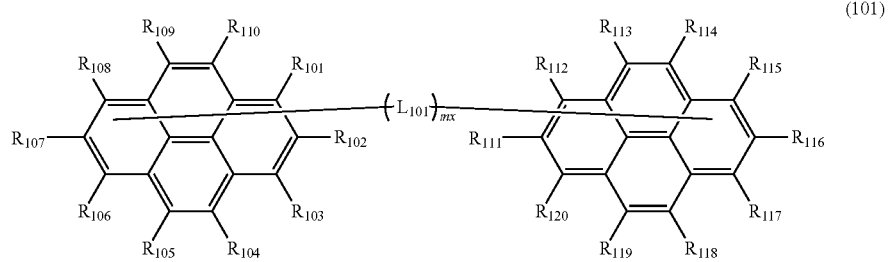

(101)

Ar$_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more L$_{101}$ are present, the two or more L$_{101}$ are mutually the same or different;

when two or more Ar$_{101}$ are present, the two or more Ar$_{101}$ are mutually the same or different; and

* in the formula (11) represents a bonding position to a pyrene ring in the formula (1).

In the first compound represented by the formula (1), R$_{901}$, R$_{902}$, R$_{903}$, R$_{904}$, R$_{905}$, R$_{906}$, R$_{907}$, R$_{801}$, and R$_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of R$_{901}$ are present, the plurality of R$_{902}$ are mutually the same or different;

when a plurality of R$_{902}$ are present, the plurality of R$_{902}$ are mutually the same or different;

when a plurality of R$_{903}$ are present, the plurality of R$_{903}$ are mutually the same or different;

when a plurality of R$_{904}$ are present, the plurality of R$_{904}$ are mutually the same or different;

when a plurality of R$_{905}$ are present, the plurality of R$_{905}$ are mutually the same or different;

when a plurality of R$_{906}$ are present, the plurality of R$_{906}$ are mutually the same or different;

when a plurality of R$_{907}$ are present, the plurality of R$_{907}$ are mutually the same or different;

when a plurality of R$_{801}$ are present, the plurality of R$_{801}$ are mutually the same or different; and when a plurality of R$_{802}$ are present, the plurality of R$_{802}$ are mutually the same or different.

In the formula (101),

R$_{101}$ to R$_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si(R$_{901}$)(R$_{902}$)(R$_{903}$), a group represented by —O—(R$_{904}$), a group represented by —S—(R$_{905}$), a substituted or unsubstituted aralkyl group having 7 to 50 carbon atoms, a group represented by —C(=O)R$_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of R$_{101}$ to R$_{110}$ represents a bonding position to L$_{101}$, and one of Rill to R$_{120}$ represents a bonding position to L$_{101}$;

L$_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4, or 5; and when two or more L$_{101}$ are present, the two or more L$_{101}$ are mutually the same or different.

In an exemplary embodiment, L$_{101}$ is preferably a single bond or a substituted or unsubstituted arylene group having 6 to 50 ring carbon atoms.

In an exemplary embodiment, two or more of R$_{101}$ to R$_{110}$ are preferably groups represented by the formula (11).

In an exemplary embodiment, it is preferable that two or more of R$_{101}$ to R$_{110}$ are groups represented by the formula (11), and Ar$_{101}$ is a substituted or unsubstituted aryl group having 6 to 50 ring carbon atoms.

In an exemplary embodiment, it is preferable that $Ar_{101}$ is not a substituted or unsubstituted pyrenyl group, $L_{101}$ is not a substituted or unsubstituted pyrenylene group, and a substituted or unsubstituted aryl group having 6 to 50 ring carbon atoms for $R_{101}$ to $R_{110}$ not being a group represented by the formula (11) is not a substituted or unsubstituted pyrenyl group.

In an exemplary embodiment, $R_{101}$ to $R_{110}$ that are not groups represented by the formula (11) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In an exemplary embodiment, $R_{101}$ to $R_{110}$ that are not groups represented by the formula (11) are preferably each independently a hydrogen atom, a substituted or unsubstituted alkyl group having 1 to 50 carbon atoms, or a substituted or unsubstituted cycloalkyl group having 3 to 50 ring carbon atoms.

In an exemplary embodiment, $R_{101}$ to $R_{110}$ that are not groups represented by the formula (11) are preferably each a hydrogen atom.

In the first compound, the groups described as "substituted or unsubstituted" are preferably each an "unsubstituted" group.

Method of Producing First Compound

The first compound can be produced by a known method. The first compound can also be produced according to a known method and using known alternative reactions and materials depending on the target compound.

Specific Examples of First Compound

Specific examples of the first compound include the following compounds. It should however be noted that the invention is not limited to these specific examples of the first compound.

[Formula 5]

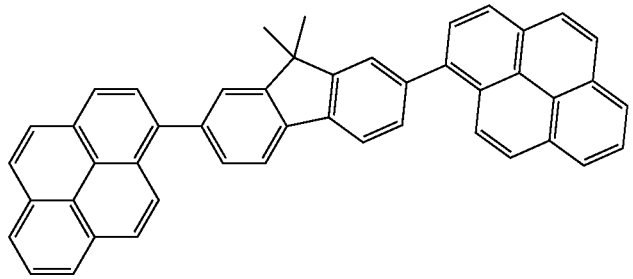

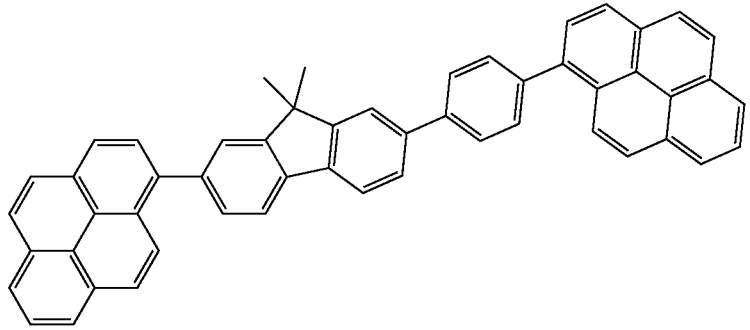

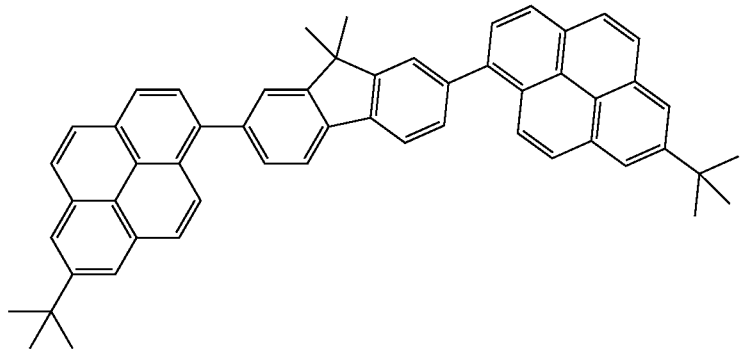

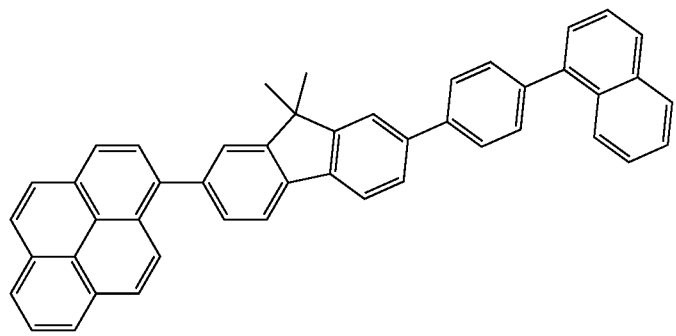
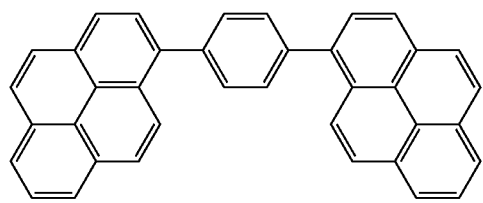
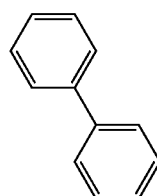
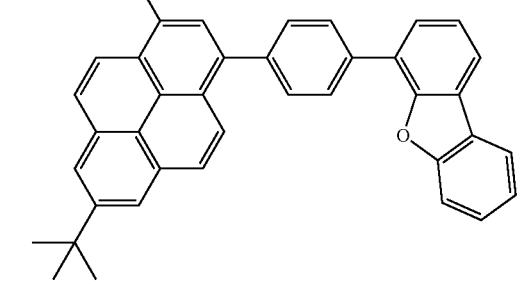
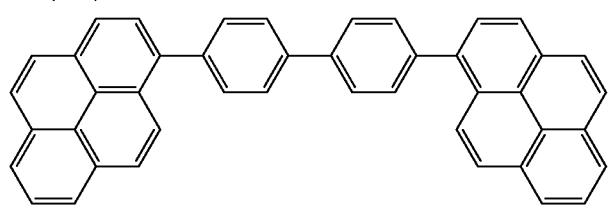
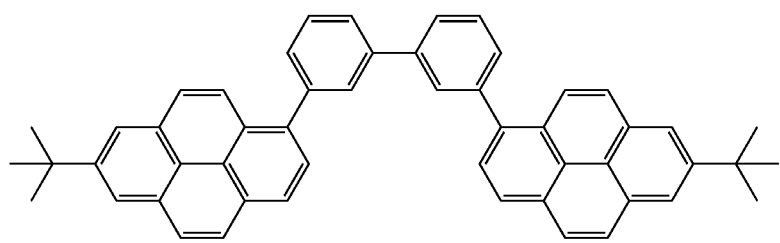
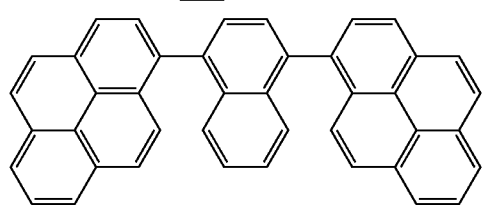

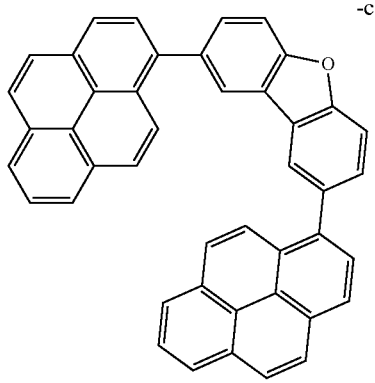

Fourth Emitting Layer

The fourth emitting layer 54 is a layer disposed in common across the blue organic EL device 10B, the green organic EL device 10G, and the red organic EL device 10R. Herein, a layer disposed in common across a plurality of devices may be referred to as a common layer. Herein, a zone disposed in common across a plurality of devices may be referred to as a common zone.

In an exemplary embodiment, the fourth emitting layer 54 as a common layer is disposed between the electron transporting layer 8 and the first emitting layer 51, a second emitting layer 52, and a third emitting layer 53.

In an exemplary embodiment, the fourth emitting layer 54 as a common layer is in direct contact with the first emitting layer 51, the second emitting layer 52, and the third emitting layer 53.

In the blue organic EL device 10B, the first emitting layer 51 and the fourth emitting layer 54 are laminated. By laminating the first emitting layer 51 containing the first compound represented by the formula (1) and the fourth emitting layer 54 containing the second compound represented by the formula (2), the performance of the blue organic EL device 10B as an organic EL device is improved.

In an exemplary embodiment, the fourth emitting layer 54, while being laminated on the first emitting layer 51 to improve the performance of the blue organic EL device 10B, is disposed as a common layer across the green organic EL device 10G and the red organic EL device 10R as well as the blue organic EL device 10B.

The fourth emitting layer 54 is a common layer, and has a uniform film thickness across the blue organic EL device 10B, the green organic EL device 10G, and the red organic EL device 10R. Since the fourth emitting layer 54 is a common layer, the fourth emitting layer 54 of each of the blue organic EL device 10B, the green organic EL device 10G, and the red organic EL device 10R can be formed without changing masks and the like. As a result, the efficiency of the production of the organic EL display device 1 improves.

In an exemplary embodiment, the fourth emitting layer 54 preferably contains the second compound represented by the formula (2) as a second host material. Therefore, for example, the fourth emitting layer 54 contains the second compound represented by the formula (2) in an amount of 50 mass % or more relative to the total mass of the fourth emitting layer 54.

In an exemplary embodiment, the fourth emitting layer also preferably contains a compound that emits light with a maximum peak wavelength in a range from 430 nm to 480 nm.

In an exemplary embodiment, the fourth emitting layer preferably further contains a fourth compound that is fluorescent.

In an exemplary embodiment, the fourth compound is preferably a compound that emits light with a maximum peak wavelength in a range from 430 nm to 480 nm, more preferably a compound that emits fluorescence with a maximum peak wavelength in a range from 430 nm to 480 nm.

The maximum peak wavelength of a compound is measured as follows. A toluene solution of a target compound at a concentration in a range from $10^{-6}$ mol/L to $10^{-5}$ mol/L is prepared and put in a quartz cell, and an emission spectrum (ordinate axis: luminous intensity, abscissa axis: wavelength) of this sample is measured at normal temperature (300 K). The emission spectrum can be measured using a spectrophotometer (device name: F-7000) manufactured by Hitachi High-Tech Science Corporation. It should be noted that the device for measuring the emission spectrum is not limited to the device used here.

In the emission spectrum, the peak wavelength at a maximum luminous intensity is a maximum emission peak wavelength. Herein, a maximum peak wavelength of fluorescence emission is also referred to as a maximum fluorescence peak wavelength (FL-peak).

In an exemplary embodiment, when the fourth emitting layer 54 contains the second compound and the fourth compound, the second compound is preferably a host material (also referred to as a matrix material), and the fourth compound is preferably a dopant material (also referred to as a guest material, an emitter, or a luminescent material).

The fourth compound and the third compound have the same structure or different structures.

In an exemplary embodiment, the fourth emitting layer 54 preferably does not contain a phosphorescent material serving as a dopant material.

In an exemplary embodiment, the fourth emitting layer 54 preferably does not contain a heavy metal complex or a phosphorescent rare earth metal complex. Here, examples of the heavy metal complex include iridium complexes, osmium complexes, and platinum complexes.

In an exemplary embodiment, the fourth emitting layer 54 also preferably does not contain a metal complex.

Examples of blue fluorescent compounds usable for the fourth emitting layer include pyrene derivatives, styrylamine derivatives, chrysene derivatives, fluoranthene derivatives, fluorene derivatives, diamine derivatives, and triarylamine derivatives.

In an exemplary embodiment, the fourth emitting layer 54 preferably has a film thickness $D_{EM4}$ larger than the film thickness $D_{EM1}$ of the first emitting layer 51.

In an exemplary embodiment, the film thickness $D_{EM4}$ of the fourth emitting layer 54 and the film thickness $D_{EM1}$ of the first emitting layer 51 preferably satisfy the relationship of a numerical formula (Numerical Formula 2) below.

$$5 \le D_{EM4} - D_{EM1} \le 28 \quad \text{(Numerical Formula 2)}$$

In an exemplary embodiment, the film thickness $D_{EM4}$ of the fourth emitting layer 54 is preferably in a range from 12.5 nm to 30 nm.

The film thickness $D_{EM4}$ of the fourth emitting layer 54 is more preferably in a range from 15 nm to 25 nm, further preferably in a range from 15 nm to 20 nm.

Second Compound

The second compound represented by the formula (2) according to the present exemplary embodiment will be described.

[Formula 6]

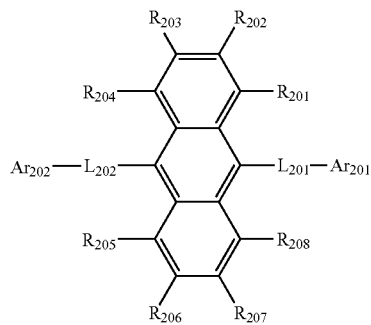

(2)

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the present exemplary embodiment, $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In an exemplary embodiment, it is preferable that $L_{201}$ and $L_{202}$ are each independently a single bond, or a substituted or unsubstituted arylene group having 6 to 50 ring carbon atoms, and $Ar_{201}$ and $Ar_{202}$ are each independently a substituted or unsubstituted aryl group having 6 to 50 ring carbon atoms.

In an exemplary embodiment, $Ar_{201}$ and $Ar_{202}$ are preferably each independently a phenyl group, a naphthyl group, a phenanthryl group, a biphenyl group, a terphenyl group, a diphenylfluorenyl group, a dimethylfluorenyl group, a benzodiphenylfluorenyl group, a benzodimethylfluorenyl group, a dibenzofuranyl group, a dibenzothienyl group, a naphthobenzofuranyl group, or a naphthobenzothienyl group.

In an exemplary embodiment, $R_{201}$ to $R_{208}$ that are not groups represented by the formula (21) in the second compound represented by the formula (2) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In an exemplary embodiment, it is preferable that $L_{101}$ is a single bond or an unsubstituted arylene group having 6 to 22 ring carbon atoms, and $Ar_{101}$ is a substituted or unsubstituted aryl group having 6 to 22 ring carbon atoms.

In an exemplary embodiment, $R_{201}$ to $R_{208}$ in the second compound represented by the formula (2) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In an exemplary embodiment, $R_{201}$ to $R_{208}$ in the second compound represented by the formula (2) are preferably each a hydrogen atom.

In an exemplary embodiment, the second compound is also preferably a compound represented by the formula (2) where $L_{202}$ is a single bond and $Ar_{202}$ is an unsubstituted phenyl group.

In an exemplary embodiment, the second compound is also preferably a compound represented by the formula (2) where $L_{202}$ is a single bond and $Ar_{202}$ is an unsubstituted 2-naphthyl group.

In an exemplary embodiment, the second compound is also preferably a compound represented by the formula (2) where $L_{202}$ is a single bond and $Ar_{202}$ is an unsubstituted 1-naphthyl group.

In an exemplary embodiment, the second compound is also preferably a compound represented by the formula (2) where $L_{202}$ is an unsubstituted p-phenylene group and $Ar_{202}$ is an unsubstituted phenyl group.

In an exemplary embodiment, the second compound is also preferably a compound represented by the formula (2) where $L_{202}$ is an unsubstituted m-phenylene group and $Ar_{202}$ is an unsubstituted phenyl group.

In an exemplary embodiment, the second compound is also preferably a compound represented by the formula (2) where $L_{202}$ is an unsubstituted o-phenylene group and $Ar_{202}$ is an unsubstituted phenyl group.

In an exemplary embodiment, the second compound is also preferably a compound represented by the formula (2) where $L_{202}$ is an unsubstituted p-phenylene group and $Ar_{202}$ is an unsubstituted 1-naphthyl group.

In an exemplary embodiment, the second compound is also preferably a compound represented by the formula (2) where $L_{202}$ is an unsubstituted p-phenylene group and $Ar_{202}$ is an unsubstituted 2-naphthyl group.

In an exemplary embodiment, the second compound is also preferably a compound represented by the formula (2) where $L_{202}$ is an unsubstituted 1,4-naphthalenediyl group and $Ar_{202}$ is an unsubstituted phenyl group.

In an exemplary embodiment, the second compound is also preferably a compound represented by the formula (2) where $L_{202}$ is an unsubstituted m-phenylene group and $Ar_{202}$ is an unsubstituted 2-naphthyl group.

In an exemplary embodiment, the second compound is also preferably a compound represented by a formula (2X) below.

[Formula 7]

$$\text{(2X)}$$

(structure showing anthracene core with substituents $R_{203}$, $R_{204}$, $R_{205}$, $R_{206}$, $R_{207}$, $R_{208}$, $R_{201}$, and groups $Ar_{203}$–$L_{203}$, $Ar_{202}$–$L_{202}$, $L_{201}$–$Ar_{201}$)

In the formula (2X):

$R_{201}$ and 8203 to $R_{208}$ represent the same as $R_{201}$ and $R_{203}$ to $R_{208}$, respectively, in the formula (2);

$L_{201}$, $L_{202}$, $Ar_{201}$, and $Ar_{202}$ represent the same as $L_{201}$, $L_{202}$, $Ar_{201}$, and $Ar_{202}$, respectively, in the formula (2);

$L_{203}$ represents the same as $L_{201}$ in the formula (2);

$L_{201}$, $L_{202}$, and $L_{203}$ are mutually the same or different;

$Ar_{203}$ represents the same as $Ar_{201}$ in the formula (2); and $Ar_{201}$, $Ar_{202}$, and $Ar_{203}$ are mutually the same or different.

In an exemplary embodiment, the second compound is also preferably a compound represented by the formula (2X) where $L_{202}$ is a single bond and $Ar_{202}$ is an unsubstituted phenyl group.

In an exemplary embodiment, the second compound is also preferably a compound represented by the formula (2X) where $L_{202}$ is a single bond and $Ar_{202}$ is an unsubstituted 2-naphthyl group.

In an exemplary embodiment, the second compound is also preferably a compound represented by the formula (2X) where $L_{202}$ is a single bond and $Ar_{202}$ is an unsubstituted 1-naphthyl group.

In an exemplary embodiment, the second compound is also preferably a compound represented by the formula (2X) where $L_{202}$ is an unsubstituted p-phenylene group and $Ar_{202}$ is an unsubstituted phenyl group.

In an exemplary embodiment, the second compound is also preferably a compound represented by the formula (2X) where $L_{202}$ is an unsubstituted m-phenylene group and $Ar_{202}$ is an unsubstituted phenyl group.

In an exemplary embodiment, the second compound is also preferably a compound represented by the formula (2X) where $L_{202}$ is an unsubstituted o-phenylene group and $Ar_{202}$ is an unsubstituted phenyl group.

In an exemplary embodiment, the second compound is also preferably a compound represented by the formula (2X) where $L_{202}$ is an unsubstituted p-phenylene group and $Ar_{202}$ is an unsubstituted 1-naphthyl group.

In an exemplary embodiment, the second compound is also preferably a compound represented by the formula (2X) where $L_{202}$ is an unsubstituted p-phenylene group and $Ar_{202}$ is an unsubstituted 2-naphthyl group.

In an exemplary embodiment, the second compound is also preferably a compound represented by the formula (2X) where $L_{202}$ is an unsubstituted 1,4-naphthalenediyl group and $Ar_{202}$ is an unsubstituted phenyl group.

In an exemplary embodiment, the second compound is also preferably a compound represented by the formula (2X) where $L_{202}$ is an unsubstituted m-phenylene group and $Ar_{202}$ is an unsubstituted 2-naphthyl group.

In an exemplary embodiment, the second compound is also preferably a compound represented by the formula (2X) where $L_{201}$ is a single bond and $Ar_m$ is an unsubstituted phenyl group.

In an exemplary embodiment, the second compound is also preferably a compound represented by the formula (2X) where $L_{201}$ is a single bond and $Ar_{201}$ is an unsubstituted 2-naphthyl group.

In an exemplary embodiment, the second compound is also preferably a compound represented by the formula (2X) where $L_{201}$ is a single bond and $Ar_{201}$ is an unsubstituted 1-naphthyl group.

In an exemplary embodiment, the second compound is also preferably a compound represented by the formula (2X) where $L_{201}$ is an unsubstituted p-phenylene group and $Ar_{2oi}$ is an unsubstituted phenyl group.

In an exemplary embodiment, the second compound is also preferably a compound represented by the formula (2X) where $L_{201}$ is an unsubstituted m-phenylene group and $Ar_{201}$ is an unsubstituted phenyl group.

In an exemplary embodiment, the second compound is also preferably a compound represented by the formula (2X) where $L_{201}$ is an unsubstituted o-phenylene group and $Ar_{201}$ is an unsubstituted phenyl group.

In an exemplary embodiment, the second compound is also preferably a compound represented by the formula (2X) where $L_{201}$ is an unsubstituted p-phenylene group and $Ar_{201}$ is an unsubstituted 1-naphthyl group.

In an exemplary embodiment, the second compound is also preferably a compound represented by the formula (2X)

where $L_{201}$ is an unsubstituted p-phenylene group and $Ar_{201}$ is an unsubstituted 2-naphthyl group.

In an exemplary embodiment, the second compound is also preferably a compound represented by the formula (2X) where $L_{201}$ is an unsubstituted 1,4-naphthalenediyl group and $Ar_{201}$ is an unsubstituted phenyl group.

In an exemplary embodiment, the second compound is also preferably a compound represented by the formula (2X) where $L_{201}$ is an unsubstituted m-phenylene group and $Ar_{201}$ is an unsubstituted 2-naphthyl group.

In the second compound, the groups described as "substituted or unsubstituted" are preferably each an "unsubstituted" group.

Method of Producing Second Compound

The second compound can be produced by a known method. The second compound can also be produced in accordance with a known method and using known alternative reactions and materials according to the target compound.

Specific Examples of Second Compound

Specific examples of the second compound include the following compounds. It should however be noted that the invention is not limited to these specific examples of the second compound.

[Formula 8]

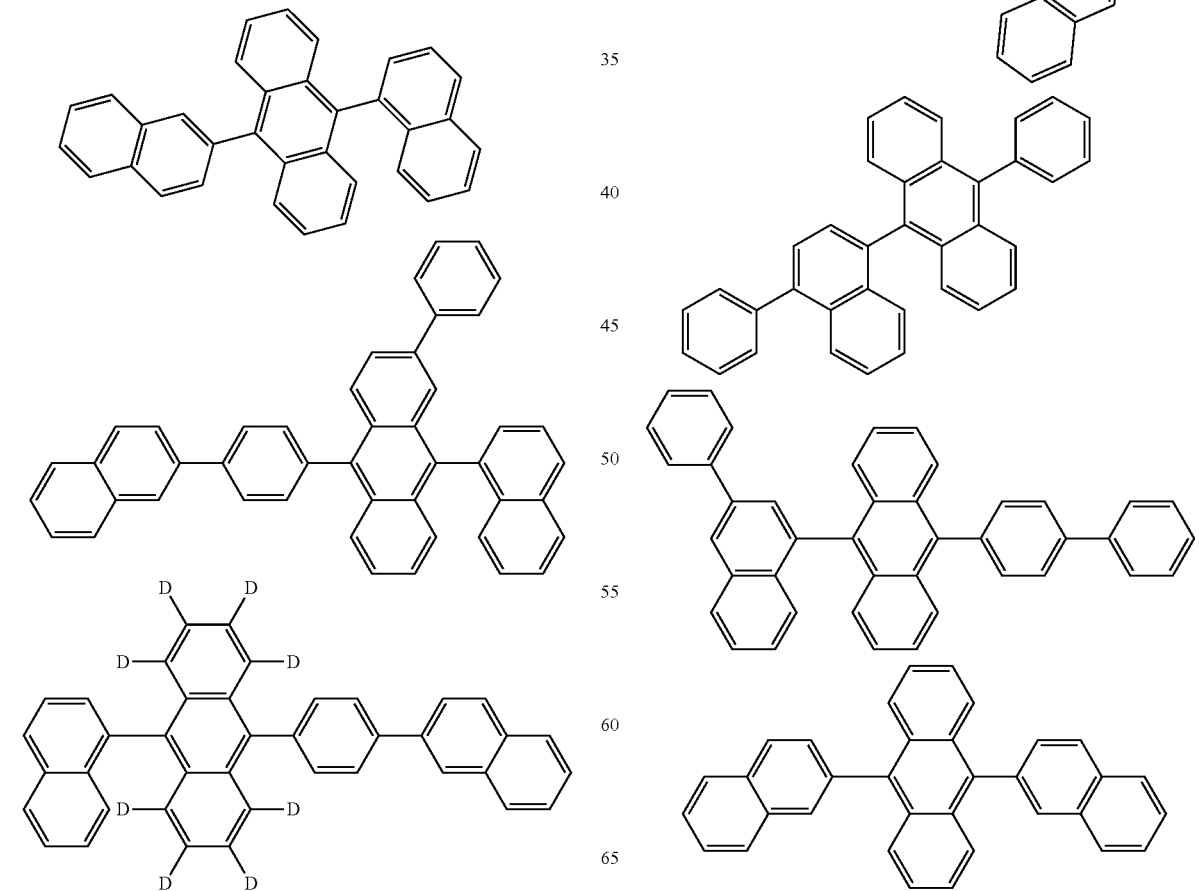

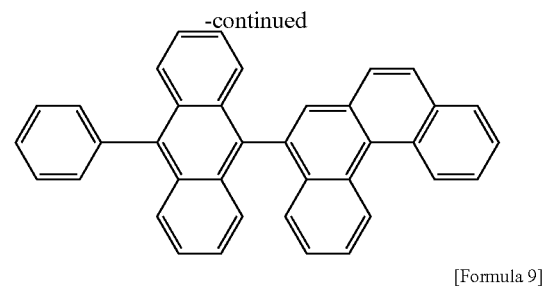

[Formula 9]

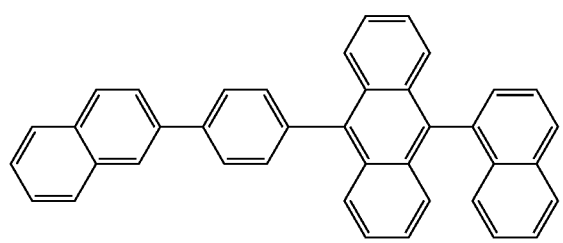

Green Organic EL Device

In an exemplary embodiment, the green organic EL device 10G includes the anode 3, the hole injecting layer 6, the hole transporting zone 7, the second emitting layer 52, the fourth emitting layer 54, the electron transporting layer 8, the electron injecting layer 9, and the cathode 4 in this order.

In an exemplary embodiment, the green organic EL device 10G includes the second emitting layer 52 and the fourth emitting layer 54 in the emitting zone 5.

The green organic EL device 10G may include another layer different from the layers illustrated in the FIG.

In an exemplary embodiment, the green organic EL device 10G includes a second hole transporting layer 72 disposed between the anode 3 and the second emitting layer 52.

In an exemplary embodiment, the hole transporting zone 7 in the green organic EL device 10G includes the second hole transporting layer 72 and the fourth hole transporting layer 74.

Second Emitting Layer

In an exemplary embodiment, the second emitting layer 52 is in direct contact with the fourth emitting layer 54. In addition, the second emitting layer 52 is in direct contact with the second hole transporting layer 72.

In an exemplary embodiment, the second emitting layer 52 preferably contains the second host material.

Herein, the "host material" refers to, for example, a material that accounts for "50 mass % or more of the layer". Therefore, for example, the second emitting layer 52 contains the second host material in an amount of 50 mass % or more relative to the total mass of the second emitting layer 52.

In an exemplary embodiment, the second emitting layer 52 preferably contains the second host material (also referred to as the matrix material) and a luminescent compound serving as a dopant material (also referred to as a guest material, an emitter, or a luminescent material).

In an exemplary embodiment, the second emitting layer 52 can contain, as the dopant material, at least one of a fluorescent compound which emits fluorescence or a phosphorescent compound which emits phosphorescence. The fluorescent compound is a compound that can emit light in a singlet state, and the phosphorescent compound is a compound that can emit light in a triplet state.

In an exemplary embodiment, examples of green fluorescent compounds usable for the second emitting layer 52 include aromatic amine derivatives.

Examples of green phosphorescent compounds usable for the second emitting layer 52 include iridium complexes.

Herein, green light emission refers to a light emission whose maximum peak wavelength in an emission spectrum is in a range from 500 nm to 560 nm.

In an exemplary embodiment, the second emitting layer 52 preferably contains a fifth compound that is phosphorescent.

Red Organic EL Device

In an exemplary embodiment, the red organic EL device 10R includes the anode 3, the hole injecting layer 6, the hole transporting zone 7, the third emitting layer 53, the fourth emitting layer 54, the electron transporting layer 8, the electron injecting layer 9, and the cathode 4 in this order.

In an exemplary embodiment, the red organic EL device 10R includes the third emitting layer 53 and the fourth emitting layer 54 in the emitting zone 5.

The red organic EL device 10R may include another layer different from the layers illustrated in the FIG.

In an exemplary embodiment, the red organic EL device 10R includes a third hole transporting layer 73 disposed between the anode 3 and the third emitting layer 53.

In an exemplary embodiment, the hole transporting zone 7 in the red organic EL device 10R includes the third hole transporting layer 73 and the fourth hole transporting layer 74.

Third Emitting Layer

In an exemplary embodiment, the third emitting layer 53 is in direct contact with the fourth emitting layer 54. The third hole transporting layer 73 is in direct contact with the third emitting layer 53.

In an exemplary embodiment, the third emitting layer 53 preferably contains a third host material.

Herein, the "host material" refers to, for example, a material that accounts for "50 mass % or more of the layer". Therefore, for example, the third emitting layer contains the third host material in an amount of 50 mass % or more relative to the total mass of the third emitting layer.

In an exemplary embodiment, the third emitting layer 53 preferably contains the third host material (also referred to as the matrix material) and a luminescent compound serving as a dopant material (also referred to as a guest material, an emitter, or a luminescent material).

The third emitting layer 53 can contain, as the dopant material, at least one of a fluorescent compound which emits fluorescence or a phosphorescent compound which emits phosphorescence. The fluorescent compound is a compound that can emit light in a singlet state, and the phosphorescent compound is a compound that can emit light in a triplet state.

Examples of red fluorescent compounds usable for the third emitting layer 53 include tetracene derivatives and diamine derivatives. Examples of red phosphorescent compounds usable for the third emitting layer 53 include metal complexes such as iridium complexes, platinum complexes, terbium complexes, and europium complexes.

Herein, red light emission refers to a light emission whose maximum peak wavelength in an emission spectrum is in a range from 600 nm to 660 nm.

The host material contained in the second emitting layer 52 or the third emitting layer 53 is preferably, for example, a compound for dispersing the above-described highly luminescent substance (dopant material) in the emitting layer. The host material is preferably a substance that has a higher lowest unoccupied molecular orbital level (LUMO level)

and a lower highest occupied molecular orbital level (HOMO level) than the highly luminescent substance.

Examples of the host material include the following compounds (1) to (4):
(1) metal complexes such as aluminum complexes, beryllium complexes, and zinc complexes;
(2) heterocyclic compounds such as oxadiazole derivatives, benzimidazole derivatives, and phenanthroline derivatives;
(3) fused aromatic compounds such as carbazole derivatives, anthracene derivatives, phenanthrene derivatives, pyrene derivatives, and chrysene derivatives; and
(4) aromatic amine compounds such as triarylamine derivatives and fused polycyclic aromatic amine derivatives.

In an exemplary embodiment, the third emitting layer 53 preferably contains a sixth compound that is phosphorescent.

The configuration of the organic EL display device 1 according to an exemplary embodiment will be further described. In the following description, the reference numerals may be omitted.

Anode

In an exemplary embodiment, the anode 3 is disposed opposite to the cathode 4.

In an exemplary embodiment, the anode 3 is typically a non-common layer. In an exemplary embodiment, for example, when the anode 3 is a non-common layer, the anodes of the blue organic EL device 10B, the green organic EL device 10G, and the red organic EL device 10R are physically divided from each other.

In an exemplary embodiment, the anode 3 on the substrate 2 is preferably formed using a metal, an alloy, an electrically conductive compound, a mixture thereof, or the like having a large work function (specifically, 4.0 eV or more). Specific examples include indium oxide-tin oxide (ITO: indium tin oxide), indium oxide-tin oxide containing silicon or silicon oxide, indium oxide-zinc oxide, indium oxide containing tungsten oxide and zinc oxide, and graphene. Other examples include gold (Au), platinum (Pt), nickel (Ni), tungsten (W), chromium (Cr), molybdenum (Mo), iron (Fe), cobalt (Co), copper (Cu), palladium (Pd), titanium (Ti), and nitrides of metal materials (e.g., titanium nitride).

These materials are typically formed into films by sputtering. For example, indium oxide-zinc oxide can be formed by sputtering using a target obtained by adding zinc oxide in a range from 1 mass % to 10 mass % to indium oxide. For example, indium oxide containing tungsten oxide and zinc oxide can be formed by sputtering using a target containing indium oxide, tungsten oxide in a range from 0.5 mass % to 5 mass %, and zinc oxide in a range from 0.1 mass % to 1 mass %. Alternatively, a vacuum deposition method, a coating method, an inkjet method, a spin coating method, or other methods may be used.

In an exemplary embodiment, among the organic layers formed on the anode 3, the hole injecting layer 6 formed in contact with the anode 3 is formed using a composite material that facilitates hole injection irrespective of the work function of the anode 3, and thus materials usable as electrode materials (e.g., metals, alloys, electrically conductive compounds, mixtures thereof, and elements belonging to group 1 or 2 of the periodic table of the elements) can be used.

The elements belonging to group 1 or 2 of the periodic table of the elements, which are materials having small work functions: specifically, for example, alkali metals such as lithium (Li) and cesium (Cs), alkaline earth metals such as magnesium (Mg), calcium (Ca), and strontium (Sr), and alloys thereof (e.g., MgAg and AlLi); and rare earth metals such as europium (Eu) and ytterbium (Yb), and alloys thereof can also be used. When the anode is formed using an alkali metal, an alkaline earth metal, or an alloy thereof, a vacuum deposition method or a sputtering method can be used. Furthermore, when a silver paste or the like is used, a coating method, an inkjet method, or other methods can be used.

Cathode

In an exemplary embodiment, the cathode 4 is disposed opposite to the anode 3.

In an exemplary embodiment, the cathode 4 may be a common layer or a non-common layer.

In an exemplary embodiment, the cathode 4 is preferably a common layer disposed in common across the blue organic EL device 10B, the green organic EL device 10G, and the red organic EL device 10R.

In an exemplary embodiment, the cathode 4 is in direct contact with the electron injecting layer 9.

In an exemplary embodiment, when the cathode 4 is a common layer, a film thickness of the cathode 4 is uniform across the blue organic EL device 10B, the green organic EL device 10G, and the red organic EL device 10R. When the cathode 4 is a common layer, the cathode 4 for each of the blue organic EL device 10B, the green organic EL device 10G, and the red organic EL device 10R can be formed without changing masks and the like. As a result, the efficiency of the production of the organic EL display device 1 improves.

In an exemplary embodiment, the cathode 4 is preferably formed using a metal, an alloy, an electrically conductive compound, a mixture thereof, or the like having a small work function (specifically, 3.8 eV or less). Specific examples of such cathode materials include elements belonging to group 1 or 2 of the periodic table of the elements, that is, alkali metals such as lithium (Li) and cesium (Cs), alkaline earth metals such as magnesium (Mg), calcium (Ca), and strontium (Sr), and alloys thereof (e.g., MgAg and AlLi); and rare earth metals such as europium (Eu) and ytterbium (Yb), and alloys thereof.

When the cathode 4 is formed using an alkali metal, an alkaline earth metal, or an alloy thereof, a vacuum deposition method or a sputtering method can be used. When a silver paste or the like is used, a coating method, an inkjet method, or other methods can be used.

In an exemplary embodiment, by providing the electron injecting layer 9, the cathode can be formed using various conductive materials such as Al, Ag, ITO, graphene, and indium oxide-tin oxide containing silicon or silicon oxide regardless of whether the work function is large or small. These conductive materials can be formed into films using a sputtering method, an inkjet method, a spin coating method, or other methods.

Hole Injecting layer

In an exemplary embodiment, the hole injecting layer 6 is preferably disposed in common across the blue organic EL device 10B, the green organic EL device 10G, and the red organic EL device 10R.

In an exemplary embodiment, the hole injecting layer 6 is disposed between the fourth hole transporting layer 74 and the anode 3.

In an exemplary embodiment, the hole injecting layer 6 is in direct contact with the fourth hole transporting layer 74.

In an exemplary embodiment, when the hole injecting layer 6 is a common layer, a film thickness of the hole injecting layer 6 is uniform across the blue organic EL device 10B, the green organic EL device 10G, and the red organic EL device 10R. Since the hole injecting layer 6 is a common layer, the hole injecting layer 6 for each of the blue organic EL device 10B, the green organic EL device 10G, and the red organic EL device 10R can be formed without changing masks and the like. As a result, the efficiency of the production of the organic EL display device 1 improves.

The hole injecting layer 6 is a layer containing a substance having high hole injectability. Examples of the substance having high hole injectability include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

Examples of the substance having high hole injectability also include aromatic amine compounds such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1), and dipyrazino[2,3-f:20,30-h]quinoxaline-2,3,6,7,10,11-hexacarbonitrile (HAT-CN), which are low-molecular organic compounds.

The substance having high hole injectability may be a high-molecular compound (e.g., an oligomer, a dendrimer, or a polymer). Examples include high-molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Acid-added high-molecular compounds such as poly(3,4-ethylenedioxythiophene)/poly(styrenesulfonic acid) (PEDOT/PSS) and polyaniline/poly(styrenesulfonic acid) (PAni/PSS) can also be used.

Hole Transporting Zone

In an exemplary embodiment, the hole transporting zone 7 is disposed between the emitting zone 5 and the anode 3.

In an exemplary embodiment, the hole transporting zone 7 may include the first hole transporting layer 71, the second hole transporting layer 72, the third hole transporting layer 73, and the fourth hole transporting layer 74.

In an exemplary embodiment, the first hole transporting layer 71 is included in the blue organic EL device 10B, the second hole transporting layer 72 is included in the green organic EL device 10G, and the third hole transporting layer 73 is included in the red organic EL device 10R. In an exemplary embodiment, the first hole transporting layer 71, the second hole transporting layer 72, and the third hole transporting layer 73 are non-common layers.

In an exemplary embodiment, the fourth hole transporting layer 74 is preferably disposed in common across the blue organic EL device 10B, the green organic EL device 10G, and the red organic EL device 10R.

In an exemplary embodiment, the fourth hole transporting layer 74 as a common layer is disposed between the hole injecting layer 6 and the first hole transporting layer 71, the second hole transporting layer 72, and the third hole transporting layer 73.

In an exemplary embodiment, the fourth hole transporting layer 74 as a common layer is in direct contact with the first hole transporting layer 71, the second hole transporting layer 72, and the third hole transporting layer 73.

In an exemplary embodiment, the fourth hole transporting layer 74 is a common layer, and a film thickness of the fourth hole transporting layer 74 is uniform across the blue organic EL device 10B, the green organic EL device 10G, and the red organic EL device 10R. Since the fourth hole transporting layer 74 is a common layer, the fourth hole transporting layer 74 of each of the blue organic EL device 10B, the green organic EL device 10G, and the red organic EL device 10R can be formed without changing masks and the like. As a result, the efficiency of the production of the organic EL display device 1 improves.

In an exemplary embodiment, a film thickness $D_{HT1}$ of the first hole transporting layer 71, a film thickness $D_{HT2}$ of the second hole transporting layer 72, and a film thickness $D_{HT3}$ of the third hole transporting layer 73 preferably satisfy the relationship of a numerical formula (Numerical Formula 1) below.

$$D_{HT1} < D_{HT2} < D_{HT3} \qquad \text{(Numerical Formula 1)}$$

Hole Transporting Layer

In an exemplary embodiment, the hole transporting layers (the first hole transporting layer 71, the second hole transporting layer 72, the third hole transporting layer 73, and the fourth hole transporting layer 74) are layers containing a substance having high hole transportability. For the hole transporting layers, aromatic amine compounds, carbazole derivatives, anthracene derivatives, and the like can be used. Specifically, for example, aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB) can be used. The above-described substances mostly have a hole mobility of $10^{-6}$ cm$^2$/(V·s) or more.

For the hole transporting layers, carbazole derivatives such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and anthracene derivatives such as t-BuDNA, DNA, and DPAnth may be used. High-molecular compounds such as poly(N-vinylcarbazole) (abbreviation: PVK) and poly(4-vinyltriphenylamine) (abbreviation: PVTPA) can also be used.

It should be noted that any other substance whose hole transportability is higher than its electron transportability may be used. The layer containing a substance having high hole transportability may be not only a monolayer but also a laminate of two or more layers formed of the above-described substances.

Electron Transporting Layer

In an exemplary embodiment, the electron transporting layer 8 is disposed between the emitting zone 5 and the cathode 4.

In an exemplary embodiment, the electron transporting layer 8 is disposed in common across the blue organic EL device 10B, the green organic EL device 10G, and the red organic EL device 10R.

In an exemplary embodiment, the electron transporting layer 8 is disposed between the fourth emitting layer 54 and the electron injecting layer 9.

In an exemplary embodiment, the electron transporting layer 8 is in direct contact with the fourth emitting layer 54. The electron transporting layer 8 is in direct contact with the electron injecting layer 9.

In an exemplary embodiment, the electron transporting layer 8 is a common layer, and a film thickness of the electron transporting layer 8 is uniform across the blue organic EL device 10B, the green organic EL device 10G, and the red organic EL device 10R. Since the electron transporting layer 8 is a common layer, the electron transporting layer 8 for each of the blue organic EL device 10B, the green organic EL device 10G, and the red organic EL device 10R can be formed without changing masks and the like. As a result, the efficiency of the production of the organic EL display device 1 improves.

In an exemplary embodiment, the electron transporting layer 8 is a layer containing a substance having high electron transportability. For the electron transporting layer, 1) metal complexes such as aluminum complexes, beryllium complexes, and zinc complexes, 2) heteroaromatic compounds such as imidazole derivatives, benzimidazole derivatives, azine derivatives, carbazole derivatives, and phenanthroline derivatives, and 3) high-molecular compounds can be used. Specific examples of usable low-molecular organic compounds include metal complexes such as Alq, tris(4-methyl-8-quinolinolato)aluminum (abbreviation: Almq$_3$), bis(10-hydroxybenzo[h]quinolinato)beryllium (abbreviation: BeBq$_2$), BAlq, Znq, ZnPBO, and ZnBTZ. In addition to the metal complexes, heteroaromatic compounds such as 2-(4-biphenyl)-5-(4-tert-butylphenyl)-1,3,4-oxadiazole (abbreviation: PBD), 1,3-bis[5-(ptert-butylphenyl)-1,3,4-oxadiazol-2-yl]benzene (abbreviation: OXD-7), 3-(4-tert-butylphenyl)-4-phenyl-5-(4-biphenyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), bathocuproine (abbreviation: BCP), and 4,4'-bis(5-methylbenzoxazol-2-yl)stilbene (abbreviation: BzOs) can also be used. In the present exemplary embodiment, for example, azine compounds and benzimidazole compounds are suitable for use for the electron transporting layer. The above-described substances mostly have an electron mobility of $10^{-6}$ cm$^2$/(V·s) or more. It should be noted that any substance other than the above whose electron transportability is higher than its hole transportability may be used as the electron transporting layer. The electron transporting layer may be a monolayer or a laminate of two or more layers formed of the above-described substances.

For the electron transporting layer, high-molecular compounds can also be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), and the like can be used.

Electron Injecting Layer

In an exemplary embodiment, the electron injecting layer 9 is disposed in common across the blue organic EL device 10B, the green organic EL device 10G, and the red organic EL device 10R.

In an exemplary embodiment, the electron injecting layer 9 is disposed between the electron transporting layer 8 and the cathode 4.

In an exemplary embodiment, the electron injecting layer 9 is in direct contact with the electron transporting layer 8.

In an exemplary embodiment, the electron injecting layer 9 is a common layer, and a film thickness of the electron injecting layer 9 is uniform across the blue organic EL device 10B, the green organic EL device 10G, and the red organic EL device 10R. Since the electron injecting layer 9 is a common layer, the electron injecting layer 9 for each of the blue organic EL device 10B, the green organic EL device 10G, and the red organic EL device 10R can be formed without changing masks and the like. As a result, the efficiency of the production of the organic EL display device 1 improves.

The electron injecting layer 9 is a layer containing a substance having high electron injectability. For the electron injecting layer, alkali metals, alkaline earth metals, and compounds thereof, such as lithium (Li), cesium (Cs), calcium (Ca), lithium fluoride (LiF), cesium fluoride (CsF), calcium fluoride (CaF$_2$), and lithium oxides (LiOx), can be used. In addition, substances having electron transportability incorporated with an alkali metal, an alkaline earth metal, or a compound thereof: specifically, for example, Alq incorporated with magnesium (Mg) may be used. In this case, electrons can be more efficiently injected from the cathode.

Alternatively, a composite material formed of a mixture of an organic compound and an electron donor may be used for the electron injecting layer. Such a composite material has high electron injectability and electron transportability because the electron donor generates electrons in the organic compound. In this case, the organic compound is preferably a material that transports the generated electrons very well, and specifically, for example, the above-described substances constituting the electron transporting layer (e.g., metal complexes and heteroaromatic compounds) can be used. The electron donor may be any substance that exhibits electron-donating properties to the organic compound. Specifically, alkali metals, alkaline earth metals, and rare earth metals are preferred, and examples include lithium, cesium, magnesium, calcium, erbium, and ytterbium. In addition, alkali metal oxides and alkaline earth metal oxides are preferred, and examples include lithium oxide, calcium oxide, and barium oxide. Lewis bases such as magnesium oxide can also be used. Organic compounds such as tetrathiafulvalene (abbreviation: TTF) can also be used.

In an exemplary embodiment, layers other than the first emitting layer 51, the second emitting layer 52, the third emitting layer 53, the first hole transporting layer 71, the second hole transporting layer 72, and the third hole transporting layer 73 are preferably disposed in common across the blue organic EL device 10B, the green organic EL device 10G, and the red organic EL device 10R. As the number of non-common layers in the organic EL display device 1 decreases, the production efficiency increases.

Method for Manufacturing Organic EL Display Device

A method for manufacturing the organic EL display device 1 according to an exemplary embodiment will be described.

First, the anode 3 is formed on the substrate 2.

Next, the hole injecting layer 6 as a common layer is formed over the anode 3. The hole injecting layers 6 of the blue organic EL device 10B, the green organic EL device 10G, and the red organic EL device 10R are formed of the same material and have the same film thickness.

Next, the fourth hole transporting layer 74 as a common layer is formed over the hole injecting layer 6. The fourth hole transporting layers 74 of the blue organic EL device 10B, the green organic EL device 10G, and the red organic EL device 10R are formed of the same material and have the same film thickness.

Next, the first hole transporting layer 71 having a predetermined film thickness is formed on a region that is on the fourth hole transporting layer 74 and corresponds to the anode 3 of the blue organic EL device 10B using a predetermined mask for film formation (a mask for a blue organic EL device). Subsequently to the formation of the first hole transporting layer 71, the first emitting layer 51 is formed on the first hole transporting layer 71.

Next, the second hole transporting layer 72 having a predetermined film thickness is formed on a region that is on the fourth hole transporting layer 74 and corresponds to the anode 3 of the green organic EL device 10G using a predetermined mask for film formation (a mask for a green organic EL device). Subsequently to the formation of the second hole transporting layer 72, the second emitting layer 52 is formed on the second hole transporting layer 72.

Next, the third hole transporting layer 73 having a predetermined film thickness is formed on a region that is on the fourth hole transporting layer 74 and corresponds to the anode 3 of the red organic EL device 10R using a predetermined mask for film formation (a mask for a red organic EL device). Subsequently to the formation of the third hole transporting layer 73, the third emitting layer 53 is formed on the third hole transporting layer 73.

The first hole transporting layer 71, the second hole transporting layer 72, and the third hole transporting layer 73 are formed of materials that are mutually different.

The first emitting layer 51, the second emitting layer 52, and the third emitting layer 53 are formed of materials that are mutually different.

It should be noted that the order of the formation of the non-common layers of the blue organic EL device 10B, the green organic EL device 10G, and the red organic EL device 10R subsequent to the formation of the fourth hole transporting layer 74 is not particularly limited.

For example, the non-common layers may be formed in the following order: after the fourth hole transporting layer 74 is formed, the second hole transporting layer 72 and the second emitting layer 52 of the green organic EL device 10G are formed; the third hole transporting layer 73 and the third emitting layer 53 of the red organic EL device 10R are then formed; and the first hole transporting layer 71 and the first emitting layer 51 of the blue organic EL device 10B are then formed.

Alternatively, for example, the non-common layers may be formed in the following order: after the fourth hole transporting layer 74 is formed, the third hole transporting layer 73 and the third emitting layer 53 of the red organic EL device 10R are formed; the second hole transporting layer 72 and the second emitting layer 52 of the green organic EL device 10G are then formed; and the first hole transporting layer 71 and the first emitting layer 51 of the blue organic EL device 10B are then formed.

After the formation of the first emitting layer 51, the second emitting layer 52, and the third emitting layer 53, the fourth emitting layer 54 as a common layer is formed over the first emitting layer 51, the second emitting layer 52, and the third emitting layer 53. The fourth emitting layers 54 are formed of the same material and have the same film thickness.

Next, the electron transporting layer 8 as a common layer is formed over the fourth emitting layer 54 that has been formed on the first emitting layer 51, the second emitting layer 52, and the third emitting layer 53. The fourth hole transporting layers 74 of the blue organic EL device 10B, the green organic EL device 10G, and the red organic EL device 10R are formed of the same material and have the same film thickness.

Next, the electron injecting layer 9 as a common layer is formed on the electron transporting layer 8. The electron injecting layers 9 of the blue organic EL device 10B, the green organic EL device 10G, and the red organic EL device 10R are formed of the same material and have the same film thickness.

Next, the cathode 4 as a common layer is formed on the electron injecting layer 9. The cathodes 4 of the blue organic EL device 10B, the green organic EL device 10G, and the red organic EL device 10R are formed of the same material and have the same film thickness.

In the above manner, the organic EL display device 1 illustrated in the FIG. is manufactured.

The method of forming the layers of the organic EL devices included in the organic EL display device mentioned herein is not limited except as specified above and may be a known method such as a dry film-forming method or a wet film-forming method. Examples of the dry film-forming method include a vacuum deposition method, a sputtering method, a plasma method, and an ion-plating method. Examples of the wet film-forming method include a spin coating method, a dipping method, a flow coating method, and an inkjet method.

Film Thickness

The film thicknesses of the organic layers of the organic EL devices of the present exemplary embodiment are not limited except as specified above. In general, an excessively small film thickness is likely to cause defects such as pinholes, and an excessively large film thickness leads to the necessity of applying a high voltage and a consequent reduction in efficiency; thus, the film thicknesses of the organic layers of the organic EL devices preferably range from several nanometers to 1 μm.

According to the present exemplary embodiment, an organic EL display device that can improve the performance of an organic EL device serving as a pixel without greatly increasing the cost of processing can be provided.

In an organic EL display device of the related art including a blue pixel, a green pixel, and a red pixel, a blue organic EL device serving as the blue pixel, a green organic EL device serving as the green pixel, and a red organic EL device serving as the red pixel each include a hole transporting layer and an emitting layer as non-common layers. In the case of such an organic EL display device of the related art, if a non-common emitting layer for a blue pixel is further formed on the first hole transporting layer 71 and the first emitting layer 51 as in the organic EL display device 1 according to the present exemplary embodiment, the cost of processing will greatly increase. Specifically, when organic layers are formed by vacuum deposition, the cost of processing greatly increases since three non-common layers are formed in succession.

By contrast, in the organic EL display device 1 according to the present exemplary embodiment, the fourth emitting layer 54 further laminated on the first emitting layer 51 is not a non-common layer for the blue organic EL device 10B alone but a common layer formed across the blue organic EL device 10B, the green organic EL device 10G, and the red organic EL device 10R. Thus, the organic EL display device 1 according to the present exemplary embodiment has high luminous efficiency and can be manufactured without greatly increasing the cost of processing. The fourth emitting layer 54 contains the second compound represented by the formula (2), and if the fourth emitting layer 54 is formed as a common layer on the second emitting layer 52 of the green organic EL device 10G and the third emitting layer 53 of the red organic EL device 10R, the second emitting layer 52 and the third emitting layer 53 are emittable, and the green organic EL device 10G and the red organic EL device 10R exhibit performance comparable to that in the case where the fourth emitting layer 54 is not disposed as a common layer.

Second Exemplary Embodiment

Organic EL Display Device

The configuration of an organic EL display device according to a second exemplary embodiment will be described.

The organic EL display device according to the second exemplary embodiment is different in the first emitting layer and the fourth emitting layer from the organic EL display device according to the first exemplary embodiment but is otherwise the same as the organic EL display device according to the first exemplary embodiment. Thus, in the description of the second exemplary embodiment, the same components as those in the first exemplary embodiment are denoted by the same reference signs and names, and will not be elaborated or will be briefly described. In the second exemplary embodiment, organic EL display device configurations, materials, and compounds that are not specified may be the same as the organic EL display device configurations, materials, and compounds described in the first exemplary embodiment.

The organic EL display device according to the present exemplary embodiment includes an anode and a cathode disposed opposite each other and includes a blue organic EL device serving as a pixel, a green organic EL device serving as a pixel, and a red organic EL device serving as a pixel. The blue organic EL device includes a first emitting layer disposed between the anode and the cathode. The green organic EL device includes a second emitting layer disposed between the anode and the cathode. The red organic EL device includes a third emitting layer disposed between the anode and the cathode. The blue organic EL device, the green organic EL device, and the red organic EL device include a fourth emitting layer disposed in common across the blue organic EL device, the green organic EL device, and the red organic EL device. The fourth emitting layer is disposed between the cathode and the first emitting layer, the second emitting layer, and the third emitting layer, and the fourth emitting layer is in direct contact with each of the first emitting layer, the second emitting layer, and the third emitting layer.

The first emitting layer contains a first compound serving as a first host material; the fourth emitting layer contains a second compound serving as a second host material; the first host material and the second host material are mutually different; the first emitting layer contains at least a compound that emits light with a maximum peak wavelength of 500 nm or less; the fourth emitting layer contains at least a compound that emits light with a maximum peak wavelength of 500 nm or less; the compound that is contained in the first emitting layer and that emits light with a maximum peak wavelength of 500 nm or less and the compound that is contained in the fourth emitting layer and that emits light with a maximum peak wavelength of 500 nm or less are mutually the same or different; and a triplet energy $T_1(H1)$ of the first host material and a triplet energy $T_1(H2)$ of the second host material satisfy the relationship of a numerical formula (Numerical Formula 1A) below.

$$T_1(H1) > T_1(H2) \quad \text{(Numerical Formula 1A)}$$

Triplet-triplet-annihilation (also referred to as TTA) is conventionally known as a technique for improving the luminous efficiency of an organic electroluminescence device. TTA is a mechanism in which triplet excitons collide with each other to generate singlet excitons. The TTA mechanism is also referred to as a TTF mechanism. TTF is the abbreviation of triplet-triplet fusion.

The TTF phenomenon will be described. Holes injected from an anode and electrons injected from a cathode recombine together in the emitting layer to generate excitons. As is conventionally known, the spin state at this time is in the ratio of 25% singlet excitons to 75% triplet excitons. In a conventionally known fluorescent device, 25% singlet excitons emit light when relaxed to the ground state, whereas the remaining 75% triplet excitons return to the ground state through a thermal deactivation process without emitting light. Therefore, the theoretical limit of the internal quantum efficiency of conventional fluorescent devices has been said to be 25%.

Meanwhile, the behavior of triplet excitons generated inside organic substances has been theoretically examined. According to S. M. Bachilo et al. (J. Phys. Formula A, 104, 7711 (2000)), assuming that higher excitons such as quintet excitons readily return to the triplet state, when the density of triplet excitons (hereinafter denoted by $^3A^*$) has increased, the triplet excitons collide with each other to cause a reaction represented by the following formula. Here, $^1A$ represents the ground state, and $^1A^*$ represents lowest singlet excitons.

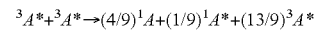

That is, $5^3A^* \rightarrow 4^1A + 1A^*$: among the 75% triplet excitons initially generated, 1/5, that is, 20% is expected to change into singlet excitons. Therefore, the ratio of singlet excitons making a contribution as light is 40%: 25% (initially generated) plus 15% (75%×1/5). At this time, the ratio of TTF-derived luminous intensity (TTF ratio) relative to the entire luminous intensity is 15/40, that is, 37.5%. If it is assumed that the 75% triplet excitons initially generated collide with each other to generate singlet excitons (one singlet exciton is generated from two triplet excitons), internal quantum efficiency as high as 62.5%: 25% (initially generated singlet excitons) plus 37.5% (75%×1/2), is achieved. At this time, the TTF ratio is 37.5/62.5=60%.

In the organic EL display device according to the present exemplary embodiment, triplet excitons resulting from recombination of holes and electrons in the first emitting layer are less likely to be quenched at the interface between the first emitting layer and an organic layer in direct contact with the first emitting layer even if carriers are excessively present at the interface. For example, when a recombination region is present locally at the interface between the first emitting layer and the hole transporting layer or electron blocking layer, excessive electrons may cause quenching. On the other hand, when the recombination region is present locally at the interface between the first emitting layer and the electron transporting layer or hole blocking layer, excessive holes may cause quenching.

The organic EL display device according to the present exemplary embodiment includes at least two emitting layers (i.e., the first emitting layer and the fourth emitting layer)

satisfying the predetermined relationship, and the triplet energy $T_1(H1)$ of the first host material in the first emitting layer and the triplet energy $T_1(H2)$ of the second host material in the fourth emitting layer satisfy the relationship of the numerical formula (Numerical Formula 1A) above.

Due to the presence of the first emitting layer and the fourth emitting layer satisfying the relationship of the numerical formula (Numerical Formula 1A) above, triplet excitons generated in the first emitting layer move to the fourth emitting layer without being quenched by excessive carriers, and reverse movement of the triplet excitons from the fourth emitting layer to the first emitting layer can be suppressed. As a result, the TTF mechanism is exhibited in the fourth emitting layer to efficiently generate singlet excitons, leading to improved luminous efficiency.

Due to this configuration: in which the organic EL display device includes, as different regions, the first emitting layer that mainly generates triplet excitons and the fourth emitting layer that mainly exhibits the TTF mechanism by utilizing the triplet excitons moved from the first emitting layer; and in which a compound having a triplet energy smaller than that of the first host material in the first emitting layer is used as the second host material in the fourth emitting layer to make a difference in triplet energy, the luminous efficiency is improved.

In the organic EL display device according to the present exemplary embodiment, the triplet energy $T_1(H1)$ of the first host material and the triplet energy $T_1(H2)$ of the second host material preferably satisfy the relationship of a numerical formula (Numerical Formula 5) below.

$$T_1(H1) - T_1(H2) > 0.03 \ eV \qquad \text{(Numerical Formula 5)}$$

Emission Wavelength of Organic EL Device

The blue organic EL device of the organic EL display device according to the present exemplary embodiment preferably emits light with a maximum peak wavelength of 500 nm or less when the device is driven.

The blue organic EL device of the organic EL display device according to the present exemplary embodiment more preferably emits light with a maximum peak wavelength in a range from 430 nm to 480 nm when the device is driven.

The maximum peak wavelength of light emitted by the organic EL device when the device is driven is measured in the following manner. A voltage is applied to the organic EL device such that a current density is 10 mA/cm$^2$, where a spectral radiance spectrum is measured with a CS—2000 spectroradiometer (manufactured by Konica Minolta Inc.). In the spectral radiance spectrum obtained, a peak wavelength of an emission spectrum at a maximum luminous intensity is measured to determine the maximum peak wavelength (unit: nm).

First Emitting Layer

The first emitting layer contains the first host material. The first host material is a compound different from the second host material contained in the fourth emitting layer.

The first emitting layer contains at least a compound that emits light with a maximum peak wavelength of 500 nm or less. The "compound that emits light with a maximum peak wavelength of 500 nm or less" may be the first host material or a compound different from the first host material. The compound that is contained in the first emitting layer and that emits light with a maximum peak wavelength of 500 nm or less is preferably a compound that emits fluorescence with a maximum peak wavelength of 500 nm or less.

In the present exemplary embodiment, the compound that emits light with a maximum peak wavelength of 500 nm or less is preferably a compound that emits fluorescence with a maximum peak wavelength of 500 nm or less.

In the organic EL display device according to the present exemplary embodiment, it is preferable that the first emitting layer further contains a first dopant material, and the first dopant material is a fluorescent compound.

In the organic EL display device according to the present exemplary embodiment, the first dopant material is preferably a compound not including, in a molecule, an azine ring structure.

In the organic EL display device according to the present exemplary embodiment, the first dopant material is preferably not a boron-containing complex, and the first dopant material is more preferably not a complex.

In the organic EL display device according to the present exemplary embodiment, the first emitting layer preferably does not contain a metal complex. Also, in the organic EL display device according to the present exemplary embodiment, the first emitting layer preferably does not contain a boron-containing complex.

In the organic EL display device according to the present exemplary embodiment, the first emitting layer preferably does not contain a phosphorescent material (dopant material).

In addition, the first emitting layer preferably does not contain a heavy metal complex or a phosphorescent rare earth metal complex. Here, examples of the heavy metal complex include iridium complexes, osmium complexes, and platinum complexes.

In the organic EL display device according to the present exemplary embodiment, the first dopant material is preferably a compound that emits light with a maximum peak wavelength of 500 nm or less, more preferably a compound that emits fluorescence with a maximum peak wavelength of 500 nm or less. The method of measuring the maximum peak wavelength of the compound is as described above.

In an emission spectrum of the first dopant material, when a peak at a maximum luminous intensity is a maximum peak and the height of the maximum peak is 1, the heights of other peaks appearing in the emission spectrum are preferably less than 0.6. The peaks in the emission spectrum are local maximum values.

In the emission spectrum of the first dopant material, the number of peaks is preferably less than three.

In the organic EL display device according to the present exemplary embodiment, the first emitting layer preferably emits light with a maximum peak wavelength of 500 nm or less when the device is driven.

The maximum peak wavelength of light emitted from the emitting layer when the device is driven can be measured by the method described below.

Maximum Peak Wavelength λp of Light Emitted from Emitting Layer when Device is Driven A maximum peak wavelength $\lambda p_1$ of light emitted from the first emitting layer when the device is driven is measured as follows: an organic EL device is produced using the same material as that of the first emitting layer for the fourth emitting layer; a voltage is applied to the device such that a current density of the organic EL device is 10 mA/cm$^2$, where a spectral radiance spectrum is measured with a CS—2000 spectroradiometer (manufactured by Konica Minolta Inc.); and the maximum peak wavelength $\lambda p_1$ (unit: nm) is calculated from the spectral radiance spectrum obtained.

A maximum peak wavelength $\lambda p_2$ of light emitted from the fourth emitting layer when the device is driven is measured as follows: an organic EL device is produced using the same material as that of the fourth emitting layer for the first emitting layer; a voltage is applied to the device such that a current density of the organic EL device is 10 mA/cm², where a spectral radiance spectrum is measured with a CS—2000 spectroradiometer (manufactured by Konica Minolta Inc.); and the maximum peak wavelength $\lambda p_2$ (unit: nm) is calculated from the spectral radiance spectrum obtained.

In the organic EL display device according to the present exemplary embodiment, a singlet energy $S_1(H1)$ of the first host material and a singlet energy $S_1(D1)$ of the first dopant material preferably satisfy the relationship of a numerical formula (Numerical Formula 20) below.

$$S_1(H1) > S_1(D1) \quad \text{(Numerical Formula 20)}$$

The singlet energy $S_1$ means an energy difference between the lowest singlet state and the ground state.

When the first host material and the first dopant material satisfy the relationship of the numerical formula (Numerical Formula 20) above, singlet excitons generated on the first host material readily transfer energy from the first host material to the first dopant material, thus contributing to fluorescent emission of the first dopant material.

In the organic EL display device according to the present exemplary embodiment, the triplet energy $T_1(H1)$ of the first host material and a triplet energy $T_1(D1)$ of the first dopant material preferably satisfy the relationship of a numerical formula (Numerical Formula 2A) below.

$$T_1(D1) > T_1(H1) \quad \text{(Numerical Formula 2A)}$$

When the first host material and the first dopant material satisfy the relationship of the numerical formula (Numerical Formula 2A) above, triplet excitons generated in the first emitting layer move not on the first dopant material having a higher triplet energy but on the first host material and thus readily move to the fourth emitting layer.

The organic EL display device according to the present exemplary embodiment preferably satisfies the relationship of a numerical formula (Numerical Formula 2B) below.

$$T_1(D1) > T_1(H1) > T_1(H2) \quad \text{(Numerical Formula 2B)}$$

Triplet Energy $T_1$

The triplet energy $T_1$ can be measured by, for example, the following method.

A target compound is dissolved in EPA (diethyl ether:isopentane:ethanol=5:5:2 (volume ratio)) at a concentration in a range from $10^{-5}$ mol/L to $10^{-4}$ mol/L, and the solution is placed in a quartz cell to prepare a measurement sample. For this measurement sample, a phosphorescence spectrum (ordinate axis: phosphorescent luminous intensity, abscissa axis: wavelength) is measured at a low temperature (77K). A tangent is drawn to the rise on the short-wavelength side of the phosphorescence spectrum, and on the basis of a wavelength value $\lambda_{edge}$ [nm] at the intersection of the tangent and the abscissa axis, the amount of energy is calculated from the following conversion equation (F1) to determine the triplet energy $T_1$.

$$T_1[eV] = 1239.85/\lambda_{edge} \quad \text{Conversion equation (F1):}$$

The tangent to the rise on the short-wavelength side of the phosphorescence spectrum is drawn as follows. While moving on a spectrum curve from the short-wavelength side of the phosphorescence spectrum to the local maximum value closest to the short-wavelength side among local maximum values of the spectrum, a tangent at each point on the curve is imagined toward long-wavelength side. As the curve rises (i.e., as the value on the ordinate axis increases), the inclination of the tangent increases. A tangent drawn at a point where the inclination is at its maximum (i.e., a tangent at an inflection point) is employed as the tangent to the rise on the short-wavelength side of the phosphorescence spectrum.

Local maximum points with peak intensities that are 15% or less of the maximum peak intensity of the spectrum are not regarded as the above-mentioned local maximum value closest to the short-wavelength side, and a tangent drawn at a point that is closest to the local maximum value closest to the short-wavelength side and where the inclination is at its maximum is employed as the tangent to the rise on the short-wavelength side of the phosphorescence spectrum.

For phosphorescence measurement, an F-4500 spectrophotofluorometer body manufactured by Hitachi High-Tech Corporation can be used. Any other measuring device may be used, and a combination of a cooling unit, a container for use at low temperatures, an excitation light source, and a light-receiving unit may be used for the measurement.

Singlet Energy $S_1$

The singlet energy $S_1$ can be measured by, for example, the following method using a solution (also referred to as a solution method).

A toluene solution of a target compound at a concentration in a range from $10^{-5}$ mol/L to $10^{-4}$ mol/L is prepared and put in a quartz cell, and an absorption spectrum (ordinate axis: absorption intensity, abscissa axis: wavelength) of this sample is measured at normal temperature (300K). A tangent is drawn to the fall on the long-wavelength side of the absorption spectrum, and a wavelength value $\lambda_{edge}$ [nm] at the intersection of the tangent and the abscissa axis is substituted into the following conversion equation (F2) to calculate the singlet energy.

$$S_1[eV] = 1239.85/\lambda_{edge} \quad \text{Conversion equation (F2):}$$

A non-limiting example of an absorption spectrum measuring device is a spectrophotometer (device name: U3310) manufactured by Hitachi, Ltd.

The tangent to the fall on the long-wavelength side of the absorption spectrum is drawn as follows. While moving on a spectrum curve from a local maximum value closest to the long-wavelength region among local maximum values of the absorption spectrum toward the long-wavelength side, a tangent at each point on the curve is imagined. As the curve falls (i.e., as the value on the ordinate axis decreases), the inclination of the tangent decreases and then increases in a repeated manner. A tangent drawn at a point where the inclination is at its local minimum and that is closest to the long-wavelength region (except where the absorbance is 0.1 or less) is employed as the tangent to the fall on the long-wavelength side of the absorption spectrum.

Local maximum points with absorbance values of 0.2 or less are not regarded as the local maximum value closest to the long-wavelength region.

In the organic EL display device according to the present exemplary embodiment, it is also preferred that an electron mobility $\mu H1$ of the first host material and an electron mobility $\mu H2$ of the second host material satisfy the relationship of a numerical formula (Numerical Formula 6) below.

$$\mu H2 > \mu H1 \quad \text{(Numerical Formula 6)}$$

When the first host material and the second host material satisfy the relationship of the numerical formula (Numerical Formula 6) above, the recombination performance of holes and electrons in the first emitting layer is improved.

The electron mobility can be measured by the following method using impedance spectroscopy.

A measurement target layer having a thickness of 100 nm to 200 nm is held between an anode and a cathode, to which a small alternating voltage of 100 mV or less is applied while a bias DC voltage is applied. The value (absolute value and phase) of an alternating current flowing at this time is measured. This measurement is performed while varying the frequency of the alternating voltage, and a complex impedance (Z) is calculated from the current value and the voltage value. At this time, the frequency dependency of the imaginary part (ImM) of a modulus M=iωZ (i: imaginary unit, ω: angular frequency) is determined, and the reciprocal number of a frequency ω at which ImM is at its maximum is defined as a response time of electrons carried in the measurement target layer. The electron mobility is calculated by the following equation.

Electron mobility=(film thickness of measurement target layer)$^2$/(response time voltage)

In the organic EL display device according to the present exemplary embodiment, the first dopant material is preferably contained in an amount of more than 1.1 mass % in the first emitting layer. In other words, the first emitting layer contains the first dopant material preferably in an amount of more than 1.1 mass % relative to the total mass of the first emitting layer, more preferably in an amount of 1.2 mass % or more relative to the total mass of the first emitting layer, further preferably in an amount of 1.5 mass % or more relative to the total mass of the first emitting layer.

The first emitting layer contains the first dopant material preferably in an amount of 10 mass % or less relative to the total mass of the first emitting layer, more preferably in an amount of 7 mass % or less relative to the total mass of the first emitting layer, further preferably in an amount of 5 mass % or less relative to the total mass of the first emitting layer.

In the organic EL display device according to the present exemplary embodiment, the first emitting layer contains the first compound serving as the first host material preferably in an amount of 60 mass % or more relative to the total mass of the first emitting layer, more preferably in an amount of 70 mass % or more relative to the total mass of the first emitting layer, further preferably in an amount of 80 mass % or more relative to the total mass of the first emitting layer, even more preferably in an amount of 90 mass % or more relative to the total mass of the first emitting layer, yet more preferably in an amount of 95 mass % or more relative to the total mass of the first emitting layer.

The first emitting layer preferably contains the first host material in an amount of 99 mass % or less relative to the total mass of the first emitting layer.

When the first emitting layer contains the first host material and the first dopant material, the upper limit of the total content ratio of the first host material and the first dopant material is 100 mass %.

In the present exemplary embodiment, it is not excluded that the first emitting layer contains a material other than the first host material and the first dopant material.

The first emitting layer may contain only one first host material or two or more first host materials. The first emitting layer may contain only one first dopant material or two or more first dopant materials.

In the organic EL display device according to the present exemplary embodiment, the film thickness of the first emitting layer is preferably 3 nm or more, more preferably 5 nm or more. When the film thickness of the first emitting layer is 3 nm or more, it is thick enough to cause recombination of holes and electrons in the first emitting layer.

In the organic EL display device according to the present exemplary embodiment, the film thickness of the first emitting layer is preferably 15 nm or less, more preferably 10 nm or less. When the film thickness of the first emitting layer is 15 nm or less, it is thin enough to allow triplet excitons to move to the fourth emitting layer.

In the organic EL display device according to the present exemplary embodiment, the film thickness of the first emitting layer is more preferably in a range from 3 nm to 15 nm.

Fourth Emitting Layer

The fourth emitting layer contains the second host material. The second host material is a compound different from the first host material contained in the first emitting layer.

The fourth emitting layer contains at least a compound that emits light with a maximum peak wavelength of 500 nm or less. The "compound that emits light with a maximum peak wavelength of 500 nm or less" may be the second host material or a compound different from the second host material. The compound that is contained in the fourth emitting layer and that emits light with a maximum peak wavelength of 500 nm or less is preferably a compound that emits fluorescence with a maximum peak wavelength of 500 nm or less.

The method of measuring the maximum peak wavelength of the compound is as described above.

In the organic EL display device according to the present exemplary embodiment, it is preferable that the fourth emitting layer further contains a second dopant material, and the second dopant material is a fluorescent compound.

In the organic EL display device according to the present exemplary embodiment, the second dopant material is preferably a compound that emits light with a maximum peak wavelength of 500 nm or less, more preferably a compound that emits fluorescence with a maximum peak wavelength of 500 nm or less.

In the organic EL display device according to the present exemplary embodiment, the fourth emitting layer preferably emits light with a maximum peak wavelength of 500 nm or less when the device is driven.

In the organic EL display device according to the present exemplary embodiment, a full width at half maximum of a maximum peak of the second dopant material is preferably in a range from 1 nm to 20 nm.

In the organic EL display device according to the present exemplary embodiment, the second dopant material preferably has a Stokes shift of more than 7 nm.

When the Stokes shift of the second dopant material is more than 7 nm, the decrease in luminous efficiency due to self-absorption is readily prevented.

Self-absorption is a phenomenon where light emitted from a compound is absorbed by the same compound and that causes a decrease in luminous efficiency. Since self-absorption is often observed in a compound having a small Stokes shift (i.e., having a large overlap between an absorption spectrum and a fluorescence spectrum), it is preferable to use a compound having a large Stokes shift (having a small overlap between an absorption spectrum and a fluorescence spectrum) in order to suppress self-absorption. The Stokes shift can be measured by the method described in EXAMPLES.

In the organic EL display device according to the present exemplary embodiment, a triplet energy $T_1$ (D2) of the second dopant material and the triplet energy $T_1$ (H2) of the second host material preferably satisfy the relationship of a numerical formula (Numerical Formula 3) below.

$$T_1(D2) > T_1(H2) \qquad \text{(Numerical Formula 3)}$$

In the organic EL display device according to the present exemplary embodiment, when the second dopant material and the second host material satisfy the relationship of the numerical formula (Numerical Formula 3) above, triplet excitons generated in the first emitting layer transfer energy not to molecules of the second dopant material having a higher triplet energy but to molecules of the second host material when moving to the fourth emitting layer. Triplet excitons generated as a result of recombination of holes and electrons on the second host material do not move to the second dopant material having a higher triplet energy. Triplet excitons generated as a result of recombination on the molecules of the second dopant material rapidly transfer energy to the molecules of the second host material.

The triplet excitons on the second host material efficiently collide with each other due to the TTF phenomenon without moving to the second dopant material, thereby generating singlet excitons.

In the organic EL display device according to the present exemplary embodiment, a singlet energy $S_1(H2)$ of the second host material and a singlet energy $S_1(D2)$ of the second dopant material preferably satisfy the relationship of a numerical formula (Numerical Formula 4) below.

$$S_1(H2) > S_1(D2) \quad \text{(Numerical Formula 4)}$$

In the organic EL display device according to the present exemplary embodiment, when the second dopant material and the second host material satisfy the relationship of the numerical formula (Numerical Formula 4) above, the singlet energy of the second dopant material is smaller than the singlet energy of the second host material, and thus the singlet excitons generated due to the TTF phenomenon transfer energy from the second host material to the second dopant material, thus contributing to fluorescent emission of the second dopant material.

In the organic EL display device according to the present exemplary embodiment, the second dopant material is preferably a compound not including, in a molecule, an azine ring structure.

In the organic EL display device according to the present exemplary embodiment, the second dopant material is preferably not a boron-containing complex, and the second dopant material is more preferably not a complex.

In the organic EL display device according to the present exemplary embodiment, the fourth emitting layer preferably does not contain a metal complex. Also, in the organic EL display device according to the present exemplary embodiment, the fourth emitting layer preferably does not contain a boron-containing complex.

In the organic EL display device according to the present exemplary embodiment, the fourth emitting layer preferably does not contain a phosphorescent material (dopant material).

In addition, the fourth emitting layer preferably does not contain a heavy metal complex or a phosphorescent rare earth metal complex. Here, examples of the heavy metal complex include iridium complexes, osmium complexes, and platinum complexes.

In the organic EL display device according to the present exemplary embodiment, the second dopant material is preferably contained in an amount of more than 1.1 mass % in the fourth emitting layer. In other words, the fourth emitting layer contains the second dopant material preferably in an amount of more than 1.1 mass % relative to the total mass of the fourth emitting layer, more preferably in an amount of 1.2 mass % or more relative to the total mass of the fourth emitting layer, further preferably in an amount of 1.5 mass % or more relative to the total mass of the fourth emitting layer.

The fourth emitting layer contains the second dopant material preferably in an amount of 10 mass % or less relative to the total mass of the fourth emitting layer, more preferably in an amount of 7 mass % or less relative to the total mass of the fourth emitting layer, further preferably in an amount of 5 mass % or less relative to the total mass of the fourth emitting layer.

The fourth emitting layer contains the second compound serving as the second host material preferably in an amount of 60 mass % or more relative to the total mass of the fourth emitting layer, more preferably in an amount of 70 mass % or more relative to the total mass of the fourth emitting layer, further preferably in an amount of 80 mass % or more relative to the total mass of the fourth emitting layer, even more preferably in an amount of 90 mass % or more relative to the total mass of the fourth emitting layer, yet more preferably in an amount of 95 mass % or more relative to the total mass of the fourth emitting layer.

The fourth emitting layer preferably contains the second host material in an amount of 99 mass % or less relative to the total mass of the fourth emitting layer.

When the fourth emitting layer contains the second host material and the second dopant material, the upper limit of the total content ratio of the second host material and the second dopant material is 100 mass %.

In the present exemplary embodiment, it is not excluded that the fourth emitting layer contains a material other than the second host material and the second dopant material.

The fourth emitting layer may contain only one second host material or two or more second host materials. The fourth emitting layer may contain only one second dopant material or two or more second dopant materials.

In the organic EL display device according to the present exemplary embodiment, the film thickness of the fourth emitting layer is preferably 5 nm or more, more preferably 15 nm or more. When the film thickness of the fourth emitting layer is 5 nm or more, it is easy to inhibit the triplet excitons that have moved from the first emitting layer to the fourth emitting layer from returning to the first emitting layer again. In addition, when the film thickness of the fourth emitting layer is 5 nm or more, the triplet excitons can be sufficiently separated from the recombination part in the first emitting layer.

In the organic EL display device according to the present exemplary embodiment, the film thickness of the fourth emitting layer is preferably 20 nm or less. When the film thickness of the fourth emitting layer is 20 nm or less, the density of triplet excitons in the fourth emitting layer can be increased to further facilitate the TTF phenomenon.

In the organic EL display device according to the present exemplary embodiment, the film thickness of the fourth emitting layer is preferably in a range from 5 nm to 20 nm.

In the organic EL display device according to the present exemplary embodiment, a triplet energy $T_1(DX)$ of the compound that is contained in the first emitting layer and that emits light with a maximum peak wavelength of 500 nm or less or the compound that is contained in the fourth emitting layer and that emits light with a maximum peak wavelength of 500 nm or less, the triplet energy $T_1(H1)$ of the first host material, and the triplet energy $T_1(H2)$ of the second host material preferably satisfy the relationship of a numerical formula (Numerical Formula 10) below.

$$2.6\ eV > T_1(DX) > T_1(H1) > T_1(H2) \quad \text{(Numerical Formula 10)}$$

When the first emitting layer contains the first dopant material, the triplet energy $T_1(D1)$ of the first dopant material preferably satisfies the relationship of a numerical formula (Numerical Formula 10A) below.

$2.6\ eV > T_1(D1) > T_1(H1) > T_1(H2)$ (Numerical Formula 10A)

When the fourth emitting layer contains the second dopant material, the triplet energy $T_1(D2)$ of the second dopant material preferably satisfies the relationship of a numerical formula (Numerical Formula 10B) below.

$2.6\ eV > T_1(D2) > T_1(H1) > T_1(H2)$ (Numerical Formula 10B)

In the organic EL display device according to the present exemplary embodiment, the triplet energy $T_1(DX)$ of the compound that is contained in the first emitting layer and that emits light with a maximum peak wavelength of 500 nm or less or the compound that is contained in the fourth emitting layer and that emits light with a maximum peak wavelength of 500 nm or less and the triplet energy $T_1(H1)$ of the first host material preferably satisfy the relationship of a numerical formula (Numerical Formula 11) below.

$0\ eV < T_1(DX) - T_1(H1) < 0.6\ eV$ (Numerical Formula 11)

When the first emitting layer contains the first dopant material, the triplet energy $T_1(D1)$ of the first dopant material preferably satisfies the relationship of a numerical formula (Numerical Formula 11A) below.

$0\ eV < T_1(D1) - T_1(H1) < 0.6\ eV$ (Numerical Formula 11A)

When the fourth emitting layer contains the second dopant material, the triplet energy $T_1(D2)$ of the second dopant material preferably satisfies the relationship of a numerical formula (Numerical Formula 11B) below.

$0\ eV < T_1(D2) - T_1(H2) < 0.8\ eV$ (Numerical Formula 11B)

In the organic EL display device according to the present exemplary embodiment, the triplet energy $T_1(H1)$ of the first host material preferably satisfies the relationship of a numerical formula (Numerical Formula 12) below.

$T_1(H1) > 2.0\ eV$ (Numerical Formula 12)

In the organic EL display device according to the present exemplary embodiment, the triplet energy $T_1(H1)$ of the first host material also preferably satisfies the relationship of a numerical formula (Numerical Formula 12A) below or the relationship of a numerical formula (Numerical Formula 12B) below.

$T_1(H1) > 2.10\ eV$ (Numerical Formula 12A)

$T_1(H1) > 2.15\ eV$ (Numerical Formula 12B)

In the organic EL display device according to the present exemplary embodiment, when the triplet energy $T_1(H1)$ of the first host material satisfies the relationship of the numerical formula (Numerical Formula 12A) above or the numerical formula (Numerical Formula 12B) above, triplet excitons generated in the first emitting layer readily move to the fourth emitting layer, and reverse movement from the fourth emitting layer to the first emitting layer is readily suppressed. As a result, singlet excitons are efficiently generated in the fourth emitting layer, leading to improved luminous efficiency.

In the organic EL display device according to the present exemplary embodiment, the triplet energy $T_1(H1)$ of the first host material also preferably satisfies the relationship of a numerical formula (Numerical Formula 12C) below or the relationship of a numerical formula (Numerical Formula 12D) below.

$2.08\ eV > T_1(H1) > 1.87\ eV$ (Numerical Formula 12C)

$2.05\ eV > T_1(H1) > 1.90\ eV$ (Numerical Formula 12D)

In the organic EL display device according to the present exemplary embodiment, when the triplet energy $T_1(H1)$ of the first host material satisfies the relationship of the numerical formula (Numerical Formula 12C) above or the numerical formula (Numerical Formula 12D) above, the energy of triplet excitons generated in the first emitting layer is small, which is expected to prolong the lifetime of the organic EL display device.

In the organic EL display device according to the present exemplary embodiment, a triplet energy $T_1(F1)$ of the compound that is contained in the first emitting layer and that emits light with a maximum peak wavelength of 500 nm or less also preferably satisfies the relationship of a numerical formula (Numerical Formula 14A) below or the relationship of a numerical formula (Numerical Formula 14B) below.

$2.60\ eV > T_1(F1)$ (Numerical Formula 14A)

$2.50\ eV > T_1(F1)$ (Numerical Formula 14B)

When the first emitting layer contains the compound that satisfies the relationship of the numerical formula (Numerical Formula 14A) or (Numerical Formula 14B) above, the organic EL display device has a long lifetime.

In the organic EL display device according to the present exemplary embodiment, a triplet energy $T_1(F2)$ of the compound that is contained in the fourth emitting layer and that emits light with a maximum peak wavelength of 500 nm or less also preferably satisfies the relationship of a numerical formula (Numerical Formula 14C) below or the relationship of a numerical formula (Numerical Formula 14D) below.

$2.60\ eV > T_1(F2)$ (Numerical Formula 14C)

$2.50\ eV > T_1(F2)$ (Numerical Formula 14D)

When the fourth emitting layer contains the compound that satisfies the relationship of the numerical formula (Numerical Formula 14C) or (Numerical Formula 14D) above, the organic EL display device has a long lifetime.

In the organic EL display device according to the present exemplary embodiment, the triplet energy $T_1(H2)$ of the second host material preferably satisfies the relationship of a numerical formula (Numerical Formula 13) below.

$T_1(H2) \geq 1.9\ eV$ (Numerical Formula 13)

In the organic EL display device according to the present exemplary embodiment, the first emitting layer and the fourth emitting layer are preferably in direct contact with each other.

Herein, the layer structure in which "the first emitting layer and the fourth emitting layer are in direct contact with each other" may include, for example, any of the following embodiments (LS1), (LS2), and (LS3).

(LS1) An embodiment in which a region where the first host material and the second host material coexist is generated in a process of depositing the compound of the first emitting layer and depositing the compound of the fourth emitting layer, the region being present at the interface between the first emitting layer and the fourth emitting layer.

(LS2) An embodiment in which the first emitting layer and the fourth emitting layer each contain a luminescent compound, and a region where the first host material, the second host material, and the luminescent compound coexist is generated in a process of depositing the compound of the first emitting layer and depositing the compound of the fourth emitting layer, the region being present at the interface between the first emitting layer and the fourth emitting layer.

(LS3) An embodiment in which the first emitting layer and the fourth emitting layer each contain a luminescent compound, and a region composed of the luminescent compound, a region composed of the first host material, or a region composed of the second host material is generated in a process of depositing the compound of the first emitting layer and depositing the compound of the fourth emitting layer, the region being present at the interface between the first emitting layer and the fourth emitting layer.

The organic EL display device according to the present exemplary embodiment also preferably further includes a diffusion layer.

When the organic EL display device according to the present exemplary embodiment includes a diffusion layer, the diffusion layer is preferably disposed between the first emitting layer and the fourth emitting layer.

First Host Material and Second Host Material

In the organic EL display device according to the present exemplary embodiment, the first host material is, for example, the first compound represented by the formula (1) or a first compound represented by a formula (1X), a formula (12X), a formula (13X), a formula (14X), a formula (15X) or, a formula (16X) below, and the second host material is, for example, the second compound represented by the formula (2). The first compound can also be used as the first host material and the second host material, and in this case, the compound represented by the formula (1), the formula (1X), the formula (12X), the formula (13X), the formula (14X), the formula (15X), or the formula (16X) used as the second host material may be referred to as the second compound for convenience.

First Compound

In the organic EL display device according to the present exemplary embodiment, in addition to the first compound described in the first exemplary embodiment, the compound represented by the formula (1X), the formula (12X), the formula (13X), the formula (14X), the formula (15X), or the formula (16X) can also be used as the first compound.

Compound Represented by Formula (1X)

In the organic EL display device according to the present exemplary embodiment, the first compound is also preferably a compound represented by the formula (1X).

[Formula 10]

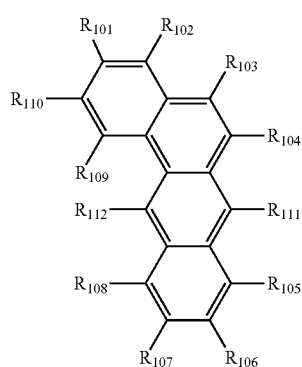

(1X)

-continued

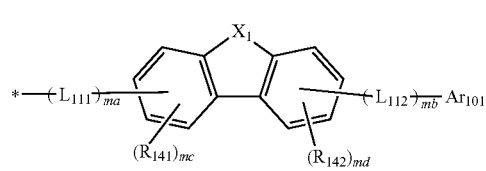

(11X)

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and in the formula (11X) represents a bonding position to the benz[a]anthracene ring in the formula (1X).

In the organic EL display device according to the present exemplary embodiment, the group represented by the formula (11X) is preferably a group represented by a formula (111X) below.

[Formula 11]

(111X)

In the formula (111X), $X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;
mb is 1, 2, 3, or 4;
ma+mb is 2, 3, or 4;
$Ar_{101}$ represents the same as $Ar_{101}$ in the formula (11);
$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si$(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;
mc is 3;
three $R_{141}$ are mutually the same or different;
and is 3; and
three $R_{142}$ are mutually the same or different.

Among carbon atom positions *1 to *8 in a cyclic structure represented by a formula (111aX) below in the group represented by the formula (111X), $L_{111}$ is bonded to one of the positions *1 to *4, and $R_{141}$ is bonded to the remaining three of the positions *1 to *4; and $L_{112}$ is bonded to one of the positions *5 to *8, and $R_{142}$ is bonded to the remaining three of the positions *5 to *8.

[Formula 12]

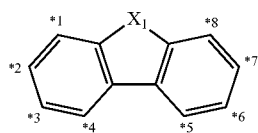

(111aX)

For example, in the group represented by the formula (111X), when $L_{111}$ is bonded to a carbon atom at position *2 in the cyclic structure represented by the formula (111aX), and $L_{112}$ is bonded to a carbon atom at position *7 in the cyclic structure represented by the formula (111aX), the group represented by the formula (111X) is represented by a formula (111bX) below.

[Formula 13]

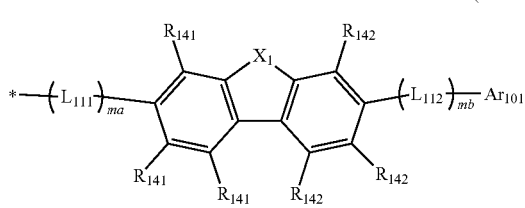

(111bX)

In the formula (111bX):
$X_1$, $L_{111}$, $L_{112}$, ma, mb, $Ar_{101}$, $R_{141}$, $R_{142}$, $R_{143}$, $R_{144}$, and $R_{145}$ represent the same as $X_1$, $L_{111}$, $L_{112}$, ma, mb, $Ar_{101}$, $R_{141}$, $R_{142}$, $R_{143}$, $R_{144}$, and $R_{145}$, respectively in the formula (111X);
a plurality of $R_{141}$ are mutually the same or different; and
a plurality of $R_{142}$ are mutually the same or different.

In the organic EL display device according to the present exemplary embodiment, the group represented by the formula (111X) is preferably a group represented by the formula (111bX).

In the compound represented by the formula (1X), it is preferable that ma is 1 or 2, and mb is 1 or 2.

In the compound represented by the formula (1X), it is preferable that ma is 1, and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group, a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 14]

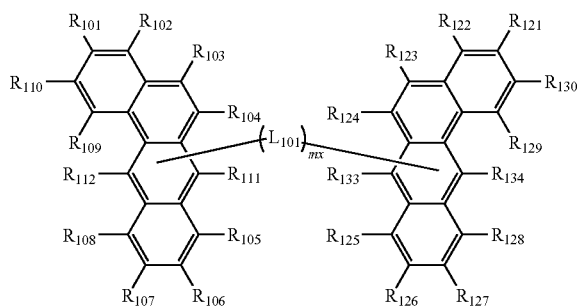

(101X)

In the formula (101X):
one of $R_{111}$ and $R_{112}$ represents a bonding position to $L_{101}$, and one of $R_{133}$ and $R_{134}$ represents a bonding position to $L_{101}$;
$R_{101}$ to $R_{110}$, $R_{121}$ to $R_{130}$, $R_{111}$ or $R_{112}$ that is not a bonding position to $L_{101}$, and $R_{133}$ or $R_{134}$ that is not a bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si$(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.)

In the compound represented by the formula (1X), $L_{101}$ is preferably a single bond, or a substituted or unsubstituted arylene group having 6 to 50 ring carbon atoms.

The compound represented by the formula (1X) is also preferably represented by a formula (102X) below.

[Formula 15]

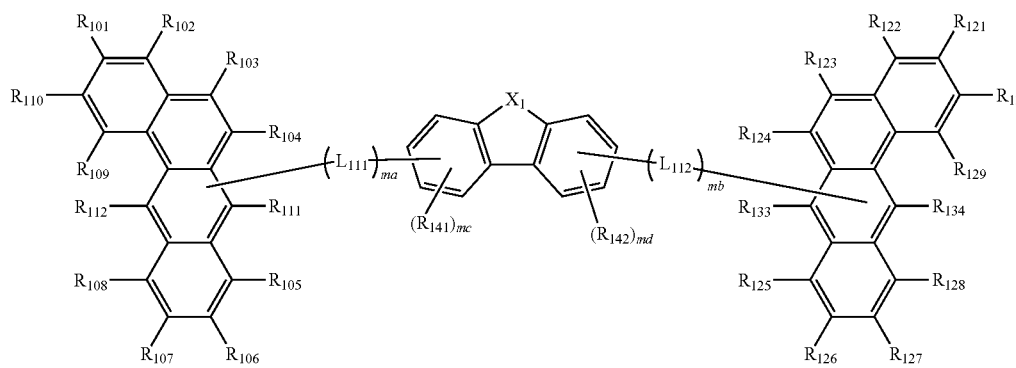

In the formula (102X):

one of $R_{111}$ and $R_{112}$ represents a bonding position to $L_{111}$, and one of $R_{133}$ and $R_{134}$ represents a bonding position to $L_{112}$;

$R_{101}$ to $R_{110}$, $R_{121}$ to $R_{130}$, $R_{111}$ or $R_{112}$ that is not a bonding position to $L_{111}$, and $R_{133}$ or $R_{134}$ that is not a bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

and is 3; and three $R_{142}$ are mutually the same or different.

When the compound represented by the formula (1X) is represented by the formula (102X), it is preferable that ma is 1 or 2, and mb is 1 or 2.

When the compound represented by the formula (1X) is represented by the formula (102X), it is preferable that ma is 1, and mb is 1.

In the compound represented by the formula (1X), the group represented by the formula (11X) is also preferably a group represented by a formula (11AX) below or a group represented by a formula (11BX) below.

[Formula 16]

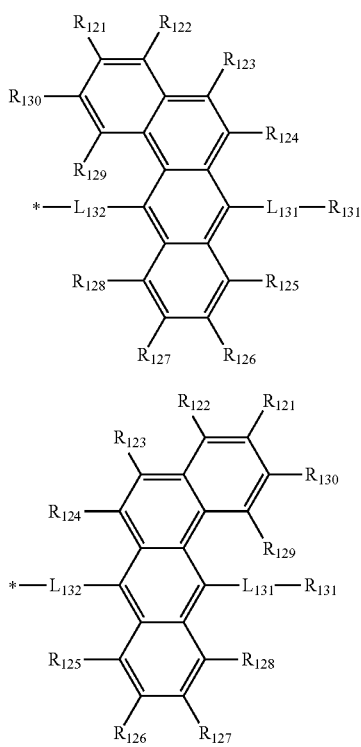

(11AX)

(11BX)

In the formula (11AX) and the formula (11BX):
$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;
when a plurality of groups represented by the formula (11AX) are present, the plurality of groups represented by the formula (11AX) are mutually the same or different;
when a plurality of groups represented by the formula (11BX) are present, the plurality of groups represented by the formula (11BX) are mutually the same or different;
$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and
in the formula (11AX) and the formula (11BX) each * represent a bonding position to the benz[a]anthracene ring in the formula (1X).

The compound represented by the formula (1X) is also preferably represented by a formula (103X) below.

[Formula 17]

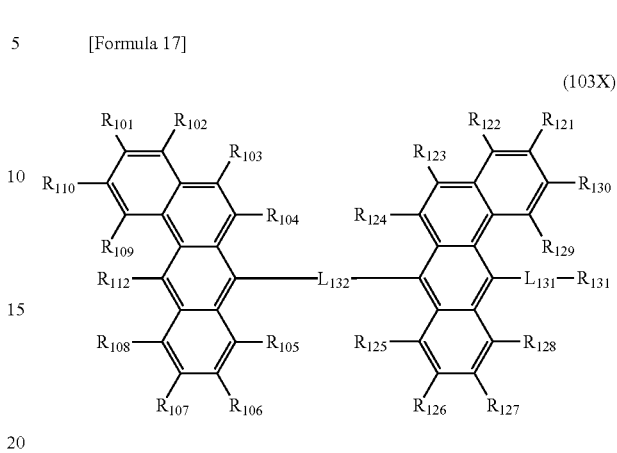

(103X)

In the formula (103X), $R_{101}$ to $R_{110}$ and $R_{112}$ represent the same as $R_{101}$ to $R_{110}$ and $R_{112}$, respectively, in the formula (1X), and $R_{121}$ to $R_{131}$, $L_{131}$, and $L_{132}$ represent the same as $R_{121}$ to $R_{131}$, $L_{131}$, and $L_{132}$, respectively, in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are also preferably groups represented by the formula (11).

In the compound represented by the formula (1X), it is preferable that two or more of $R_{101}$ to $R_{112}$ are groups represented by the formula (11X), and $Ar_{101}$ in the formula (11X) is a substituted or unsubstituted aryl group having 6 to 50 ring carbon atoms.

In the compound represented by the formula (1X), it is also preferable that $Ar_{101}$ is not a substituted or unsubstituted benz[a]anthryl group, $L_{101}$ is not a substituted or unsubstituted benz[a]anthrylene group, and $R_{101}$ to $R_{110}$ that are not groups represented by the formula (11X) and are substituted or unsubstituted aryl groups having 6 to 50 ring carbon atoms are not substituted or unsubstituted benz[a]anthryl groups.

In the compound represented by the formula (1X), $R_{101}$ to $R_{112}$ that are not groups represented by the formula (11X) are preferably independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ that are not groups represented by the formula (11X) are preferably each a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ that are not groups represented by the formula (11X) are preferably each a hydrogen atom.

Compound Represented by Formula (12X)

In the organic EL display device according to the present exemplary embodiment, the first compound is also preferably a compound represented by a formula (12X) below.

[Formula 18]

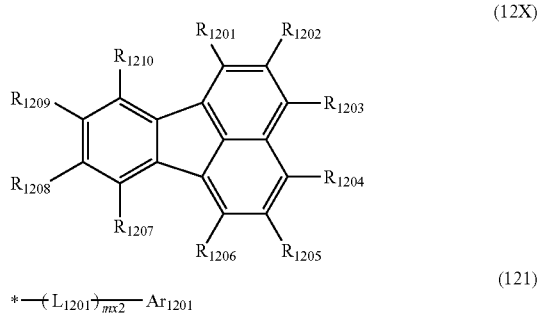

(12X)

*—(L$_{1201}$)$_{mx2}$—Ar$_{1201}$    (121)

In the formula (12X):
at least one combination of adjacent two or more of R$_{1201}$ to R$_{1210}$ are bonded to each other to form a substituted or unsubstituted monocyclic ring, or bonded to each other to form a substituted or unsubstituted fused ring;
R$_{1201}$ to R$_{1210}$ that do not form the substituted or unsubstituted monocyclic ring or the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si(R$_{901}$)(R$_{902}$)(R$_{903}$), a group represented by —O—(R$_{904}$), a group represented by —S—(R$_{905}$), a substituted or unsubstituted aralkyl group having 7 to 50 carbon atoms, a group represented by —C(=O)R$_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);
a substituent for substituting the substituted or unsubstituted monocyclic ring, a substituent for substituting a substituted or unsubstituted fused ring, and at least one of R$_{1201}$ to R$_{1210}$ are the group represented by the formula (121);
when a plurality of groups represented by the formula (121) are present, the plurality of groups represented by the formula (121) are mutually the same or different;
L$_{1201}$ is a single bond, a substituted or unsubstituted arylene group having 6 to 50 ring carbon atoms, or a substituted or unsubstituted divalent heterocyclic group having 5 to 50 ring atoms;
Ar$_{1201}$ is a substituted or unsubstituted aryl group having 6 to 50 ring carbon atoms, or a substituted or unsubstituted heterocyclic group having 5 to 50 ring atoms;
mx2 is 0, 1, 2, 3, 4, or 5;
when two or more L$_{1201}$ are present, the two or more L$_{1201}$ are mutually the same or different;
when two or more Ar$_{1201}$ are present, the two or more Ar$_{1201}$ are mutually the same or different; and in the formula (121) represents a bonding position to the ring represented by the formula (12X).

In the formula (12X), combinations of adjacent two or more of R$_{1201}$ to R$_{1210}$ refer to a combination of R$_{1201}$ and R$_{1202}$, a combination of R$_{1202}$ and R$_{1203}$, a combination of R$_{1203}$ and R$_{1204}$, a combination of R$_{1204}$ and R$_{1205}$, a combination of R$_{1205}$ and R$_{1206}$, a combination of R$_{1207}$ and R$_{1208}$, a combination of R$_{1208}$ and R$_{1209}$, and a combination of R$_{1209}$ and R$_{1210}$.

Compound Represented by Formula (13X)

In the organic EL display device according to the present exemplary embodiment, the first compound is also preferably a compound represented by a formula (13X) below.

[Formula 19]

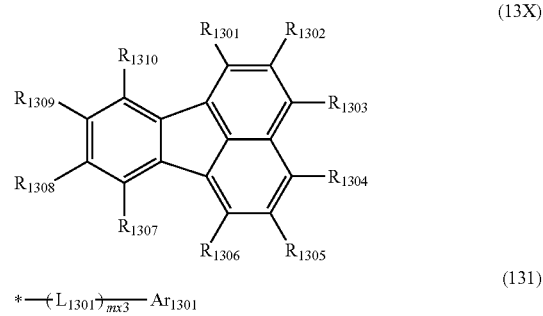

(13X)

*—(L$_{1301}$)$_{mx3}$—Ar$_{1301}$    (131)

In the formula (13X):
R$_{1301}$ to R$_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si(R$_{901}$)(R$_{902}$)(R$_{903}$), a group represented by —O—(R$_{904}$), a group represented by —S—(R$_{905}$), a substituted or unsubstituted aralkyl group having 7 to 50 carbon atoms, a group represented by —C(=O)R$_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);
at least one of R$_{1301}$ to R$_{1310}$ is a group represented by the formula (131);
when a plurality of groups represented by the formula (131) are present, the plurality of groups represented by the formula (131) are mutually the same or different;
L$_{1301}$ is a single bond, a substituted or unsubstituted arylene group having 6 to 50 ring carbon atoms, or a substituted or unsubstituted divalent heterocyclic group having 5 to 50 ring atoms;
Ar$_{1301}$ is a substituted or unsubstituted aryl group having 6 to 50 ring carbon atoms, or a substituted or unsubstituted heterocyclic group having 5 to 50 ring atoms;
mx3 is 0, 1, 2, 3, 4, or 5;
when two or more L$_{1301}$ are present, the two or more L$_{1301}$ are mutually the same or different;
when two or more Ar$_{1301}$ are present, the two or more Ar$_{1301}$ are mutually the same or different; and in the formula (131) represents a bonding position to the fluoranthene ring in the formula (13X).

In the organic EL display device according to the present exemplary embodiment, none of the combinations of adjacent two or more of $R_{1301}$ to $R_{1310}$ that are not groups represented by the formula (131) are bonded to each other. The combinations of adjacent two in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL display device according to the present exemplary embodiment, the first compound is also preferably a compound represented by a formula (14X) below.

[Formula 20]

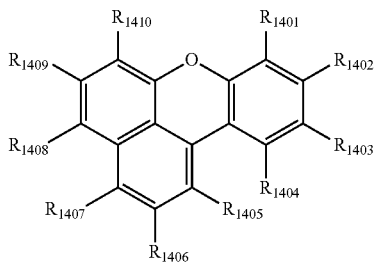

(14X)

$$* \!-\! (L_{1401})_{\overline{mx4}} \!-\! Ar_{1401} \quad (141)$$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and in the formula (141) represents a bonding position to the ring represented by the formula (14X).

Compound Represented by Formula (15X)

In the organic EL display device according to the present exemplary embodiment, the first compound is also preferably a compound represented by a formula (15X) below.

[Formula 21]

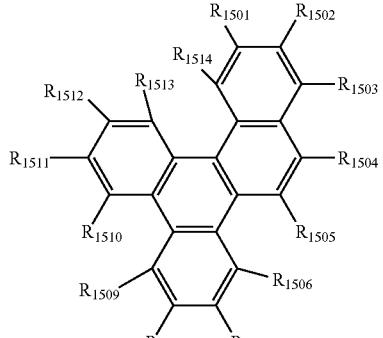

(15X)

$$* \!-\! (L_{1501})_{\overline{mx5}} \!-\! Ar_{1501} \quad (151)$$

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and in the formula (151) represents a bonding position to the ring represented by the formula (15X).

Compound Represented by Formula (16X)

In the organic EL display device according to the present exemplary embodiment, the first compound is also preferably a compound represented by a formula (16X) below.

[Formula 22]

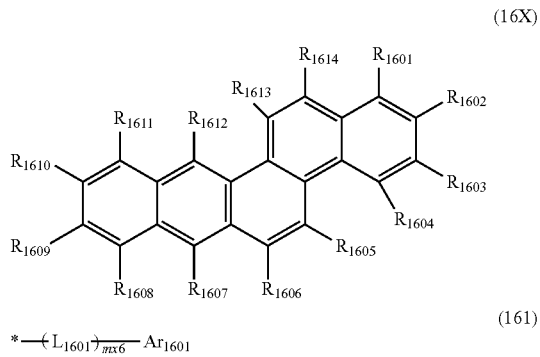

(16X)

(161)

$*\!-\!(L_{1601})_{\overline{mx6}}\!-\!Ar_{1601}$

In the formula (16X):

$R_{1601}$ to 81614 are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and in the formula (161) represents a bonding position to the ring represented by the formula (16X).

In the organic EL display device according to the present exemplary embodiment, it is also preferable that the first host material has, in a molecule, a linking structure including a benzene ring and a naphthalene ring linked to each other through a single bond; the benzene ring and the naphthalene ring in the linking structure are each independently further fused or not fused with a monocyclic ring or a fused ring; and the benzene ring and the naphthalene ring in the linking structure are further linked to each other through a cross-link at at least one position other than the single bond.

When the first host material has such a linking structure including a cross-link, degradation in chromaticity of the organic EL display device can be expected to be suppressed.

The first host material in this case may have any structure as long as it has, in a molecule, a linking structure including a benzene ring and a naphthalene ring linked to each other through a single bond (also referred to as a benzene-naphthalene linking structure) as represented by a formula (X1) or formula (X2) below as a minimum unit. The benzene ring may be further fused with a monocyclic ring or a fused ring, and the naphthalene ring may be further fused with a monocyclic ring or a fused ring. For example, also when the first host material has, in a molecule, a linking structure including a naphthalene ring and a naphthalene ring linked to each other through a single bond (also referred to as a naphthalene-naphthalene linking structure) as represented by a formula (X3), formula (X4), or formula (X5) below, it can be said that a benzene-naphthalene linking structure is included because one of the naphthalene rings includes a benzene ring.

[Formula 23]

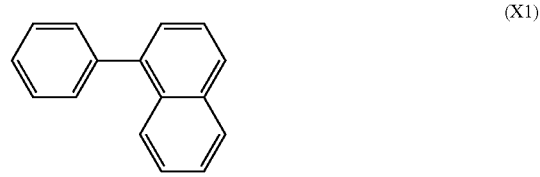

(X1)

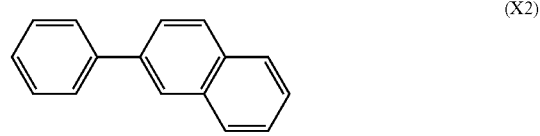

(X2)

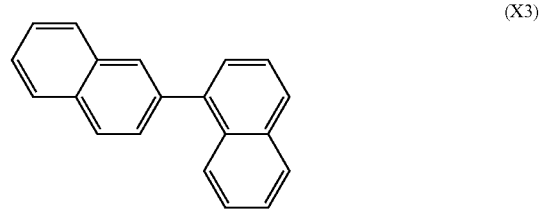

(X3)

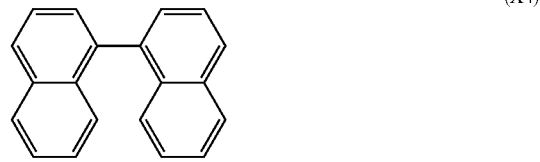

(X4)

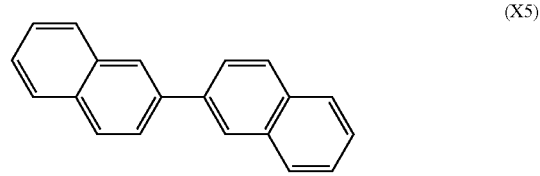

(X5)

In the organic EL display device according to the present exemplary embodiment, the cross-link also preferably includes a double bond. That is, the benzene ring and the naphthalene ring are also preferably further linked to each other through a cross-linking structure including a double bond at a position other than the single bond.

When the benzene ring and the naphthalene ring in the benzene-naphthalene linking structure are further linked to each other through a cross-link at at least one position other than the single bond, for example, in the case of the formula (X1), a linking structure (fused ring) represented by a formula (X11) below is formed, and in the case of the formula (X3), a linking structure (fused ring) represented by a formula (X31) below is formed.

When the benzene ring and the naphthalene ring in the benzene-naphthalene linking structure are further linked to each other through a cross-link including a double bond at a position other than the single bond, for example, in the case of the formula (X1), a linking structure (fused ring) represented by a formula (X12) below is formed; in the case of the formula (X2), a linking structure (fused ring) represented by a formula (X21) or formula (X22) below is formed; in the case of the formula (X4), a linking structure (fused ring) represented by a formula (X41) below is formed; and in the case of the formula (X5), a linking structure (fused ring) represented by a formula (X51) below is formed.

When the benzene ring and the naphthalene ring in the benzene-naphthalene linking structure are further linked to each other through a cross-link including a heteroatom (e.g., an oxygen atom) at at least one position other than the single bond, for example, in the case of the formula (X1), a linking structure (fused ring) represented by a formula (X13) below is formed.

[Formula 24]

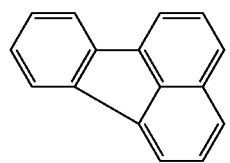
(X11)

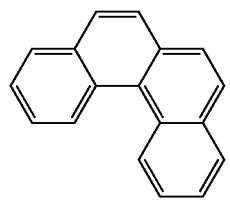
(X12)

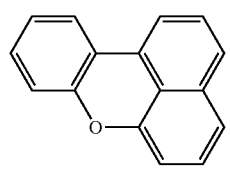
(X13)

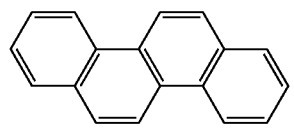
(X21)

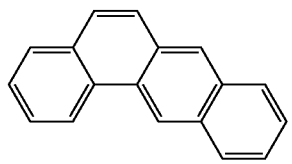
(X22)

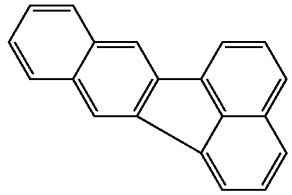
(X31)

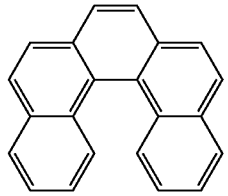
(X41)

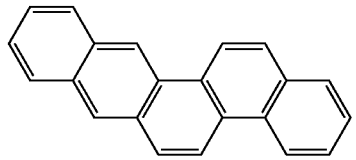
(X51)

In the organic EL display device according to the present exemplary embodiment, it is also preferable that the first host material has, in a molecule, a biphenyl structure in which a first benzene ring and a second benzene ring are linked to each other through a single bond, and the first benzene ring and the second benzene ring in the biphenyl structure are further linked to each other through a cross-link at at least one position other than the single bond.

In the organic EL display device according to the present exemplary embodiment, the first benzene ring and the second benzene ring in the biphenyl structure is also preferably further linked to each other through the cross-link at one position other than the single bond. When the first host material has such a biphenyl structure including a cross-link, degradation in chromaticity of the organic EL display device can be expected to be suppressed.

In the organic EL display device according to the present exemplary embodiment, the cross-link also preferably includes a double bond.

In the organic EL display device according to the present exemplary embodiment, the cross-link also preferably does not include a double bond.

The first benzene ring and the second benzene ring in the biphenyl structure are also preferably further linked to each other through the cross-link at two positions other than the single bond.

In the organic EL display device according to the present exemplary embodiment, it is also preferable that the first benzene ring and the second benzene ring in the biphenyl structure are further linked to each other through the cross-link at two positions other than the single bond, and the cross-link does not include a double bond. When the first host material has such a biphenyl structure including a cross-link, degradation in chromaticity of the organic EL display device can be expected to be suppressed.

For example, when the first benzene ring and the second benzene ring in the biphenyl structure represented by a formula (BP1) below are further linked to each other through a cross-link at at least one position other than the single bond, the biphenyl structure becomes a linking structure (fused ring) such as formulae (BP11) to (BP15) below.

[Formula 25]

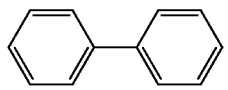
(BP1)

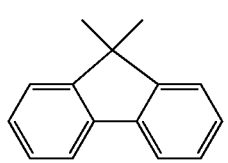
(BP11)

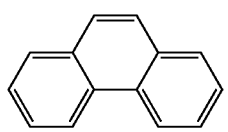
(BP12)

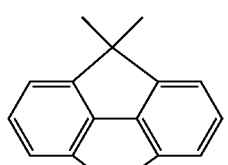
(BP13)

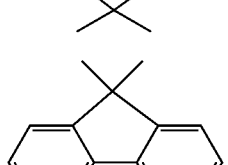
(BP14)

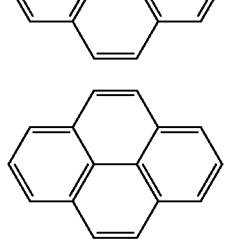
(BP15)

The formula (BP11) is a structure in which the first benzene ring and the second benzene ring are linked to each other through a cross-link not including a double bond at one position other than the single bond.

The formula (BP12) is a structure in which the first benzene ring and the second benzene ring are linked to each other through a cross-link including a double bond at one position other than the single bond.

The formula (BP13) is a structure in which the first benzene ring and the second benzene ring are linked to each other through cross-links not including a double bond at two positions other than the single bond.

The formula (BP14) is a structure in which the first benzene ring and the second benzene ring are linked to each other through a cross-link not including a double bond at one of two positions other than the single bond and linked to each other through a cross-link including a double bond at the other of the two positions other than the single bond.

The formula (BP15) is a structure in which the first benzene ring and the second benzene ring are linked to each other through cross-links each including a double bond at two positions other than the single bond.

In the first compound and the second compound, the groups described as "substituted or unsubstituted" are preferably each an "unsubstituted" group.

Method of Producing First Compound

The first compound usable in the organic EL display device according to the present exemplary embodiment can be produced by a known method. The first compound can also be produced in accordance with a known method and using known alternative reactions and materials according to the target compound.

Specific Examples of First Compound

Specific examples of the first compound usable in the organic EL display device according to the present exemplary embodiment include the specific examples of the first compound described in the first exemplary embodiment and the following compounds. It should however be noted that the invention is not limited to these specific examples of the first compound.

Herein, in the specific examples of the compound, D represents a deuterium atom, Me represents a methyl group, and tBu represents a tert-butyl group.

[Formula 26]

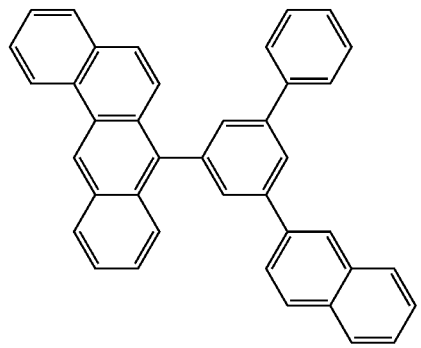

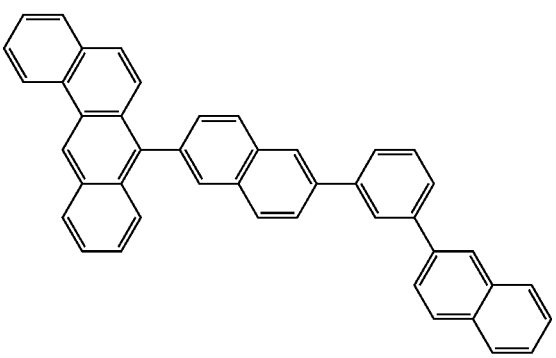

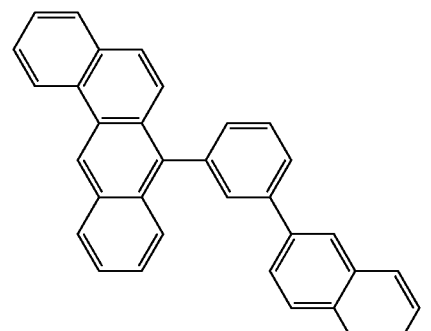
[Formula 27]
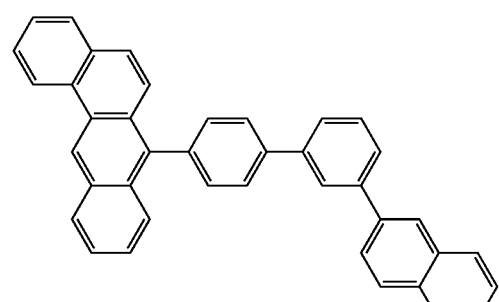
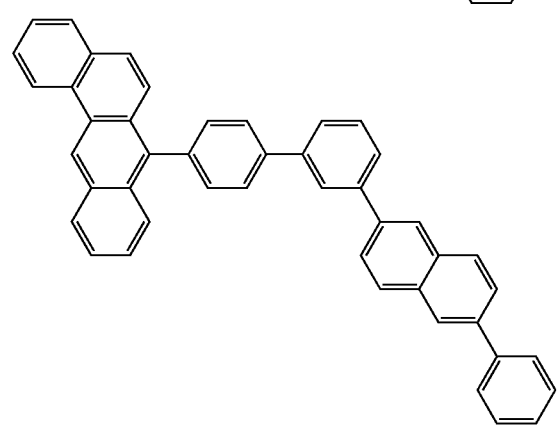
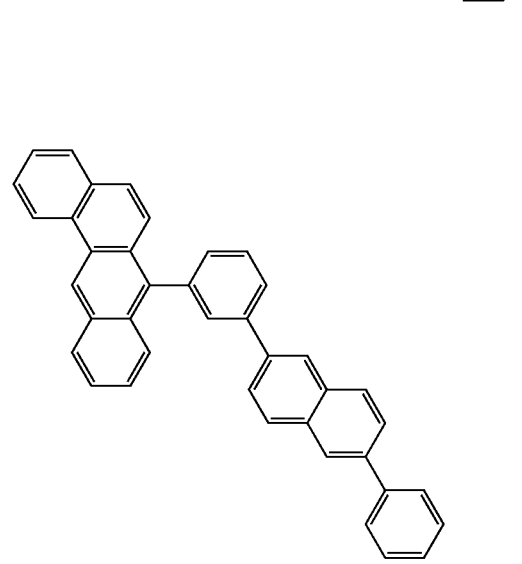
[Formula 28]
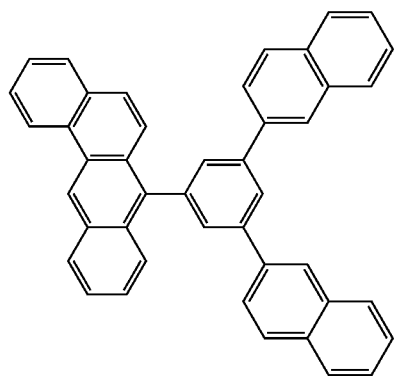
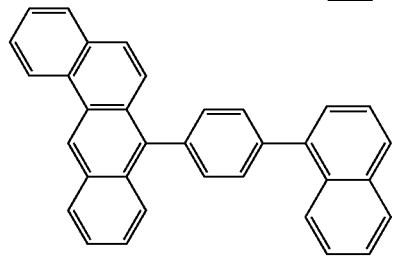
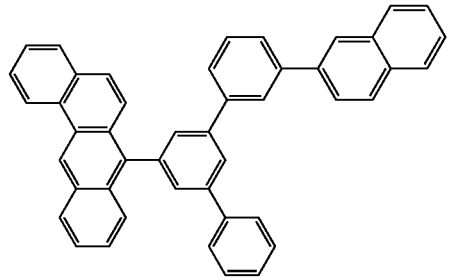
[Formula 29]
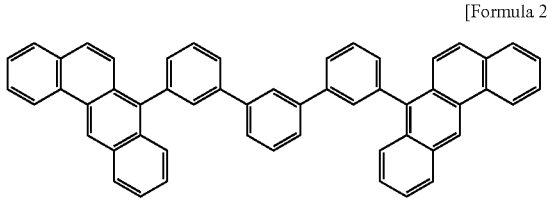
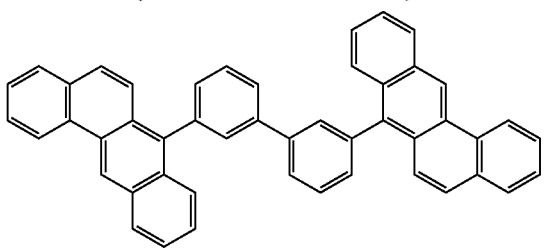
[Formula 30]
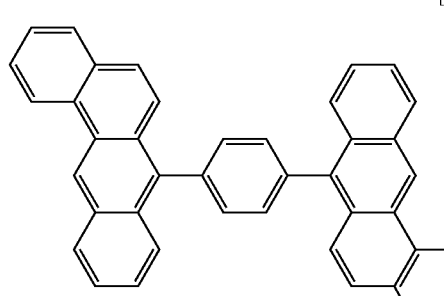

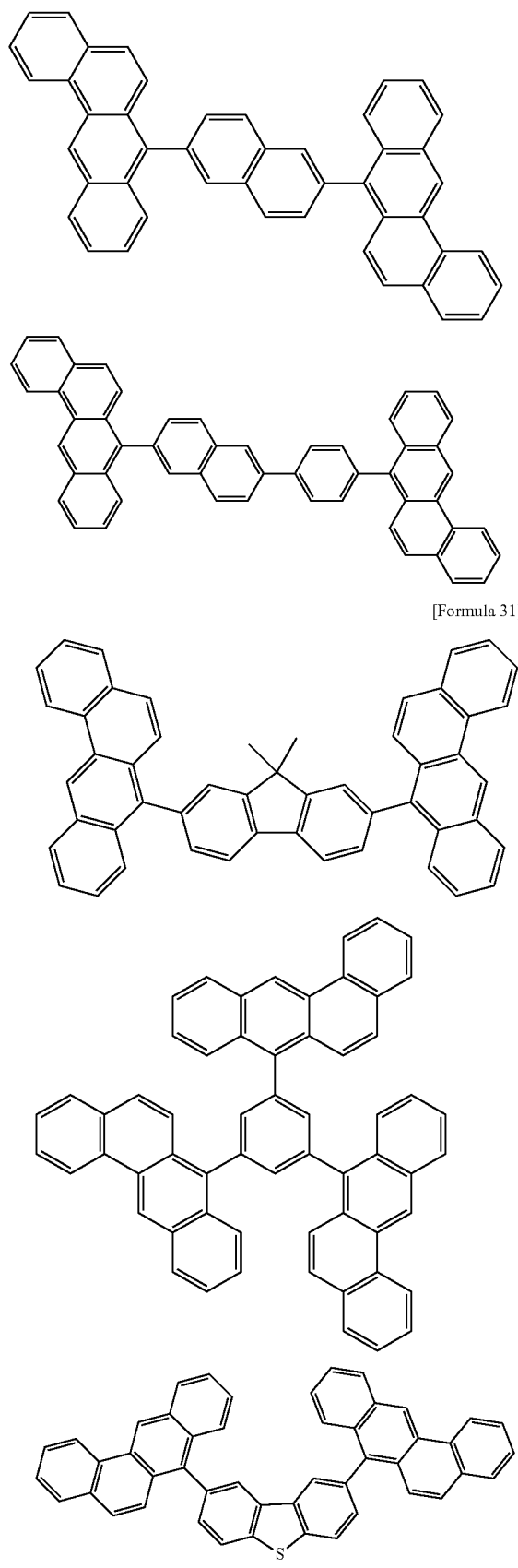
[Formula 31]
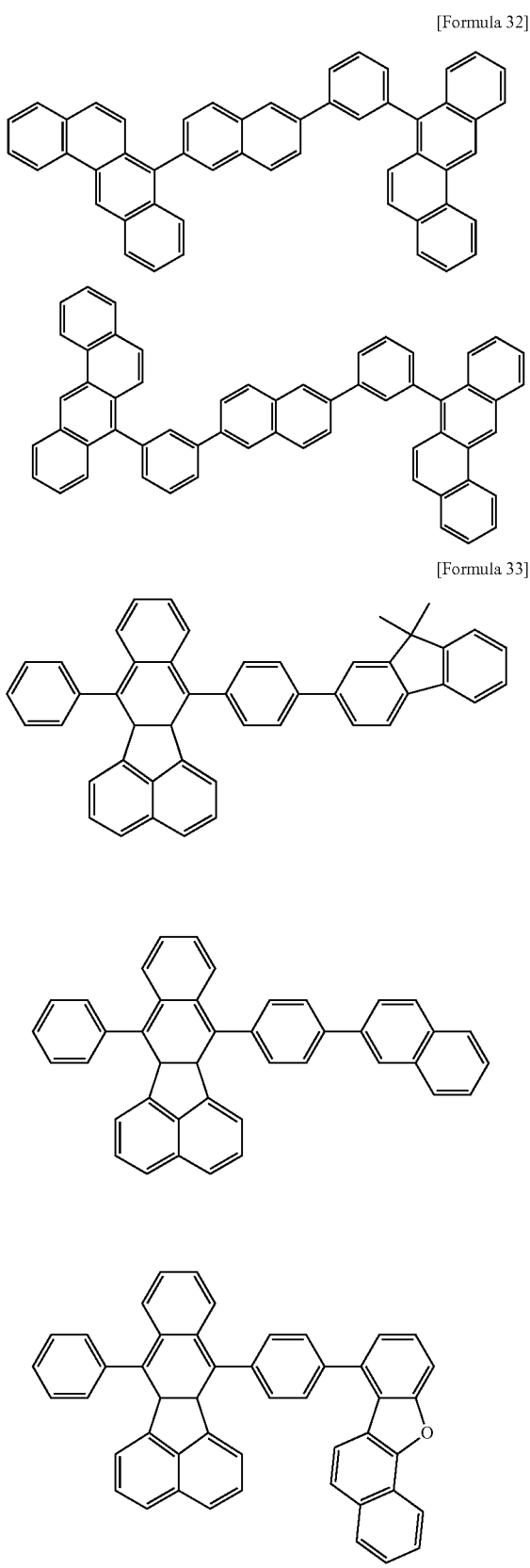
[Formula 32]
[Formula 33]

67
-continued
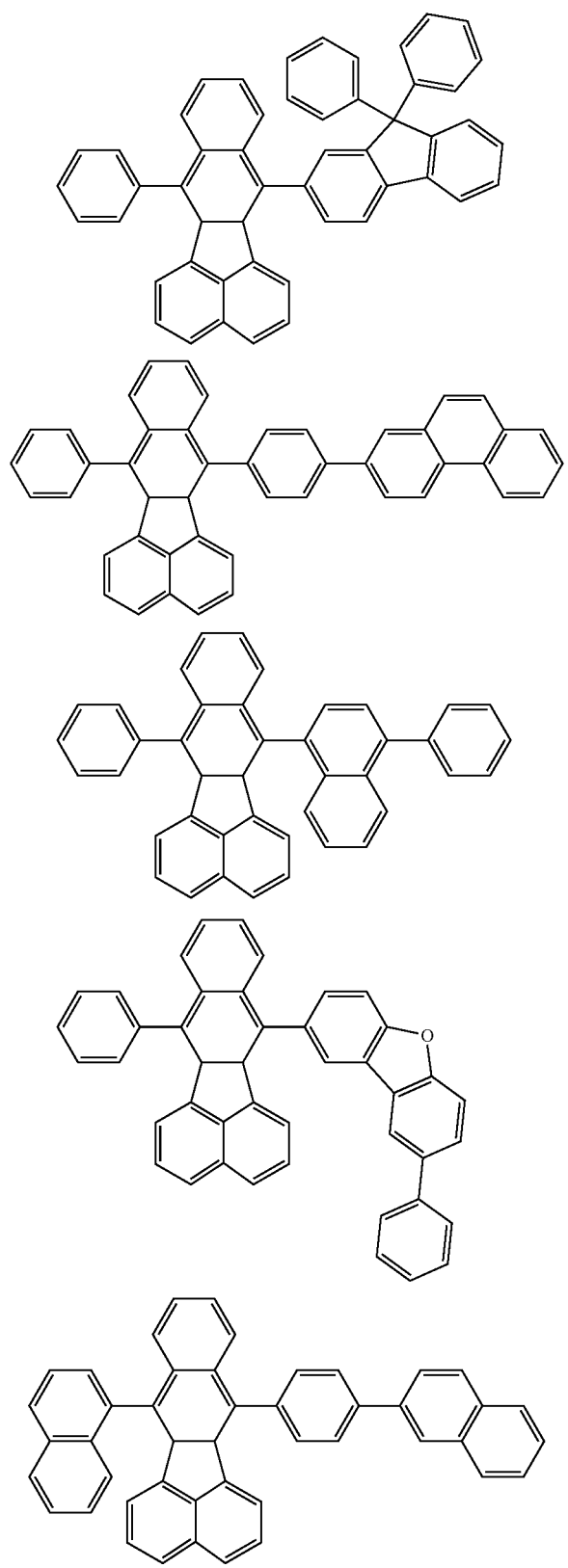
68
-continued
[Formula 34]
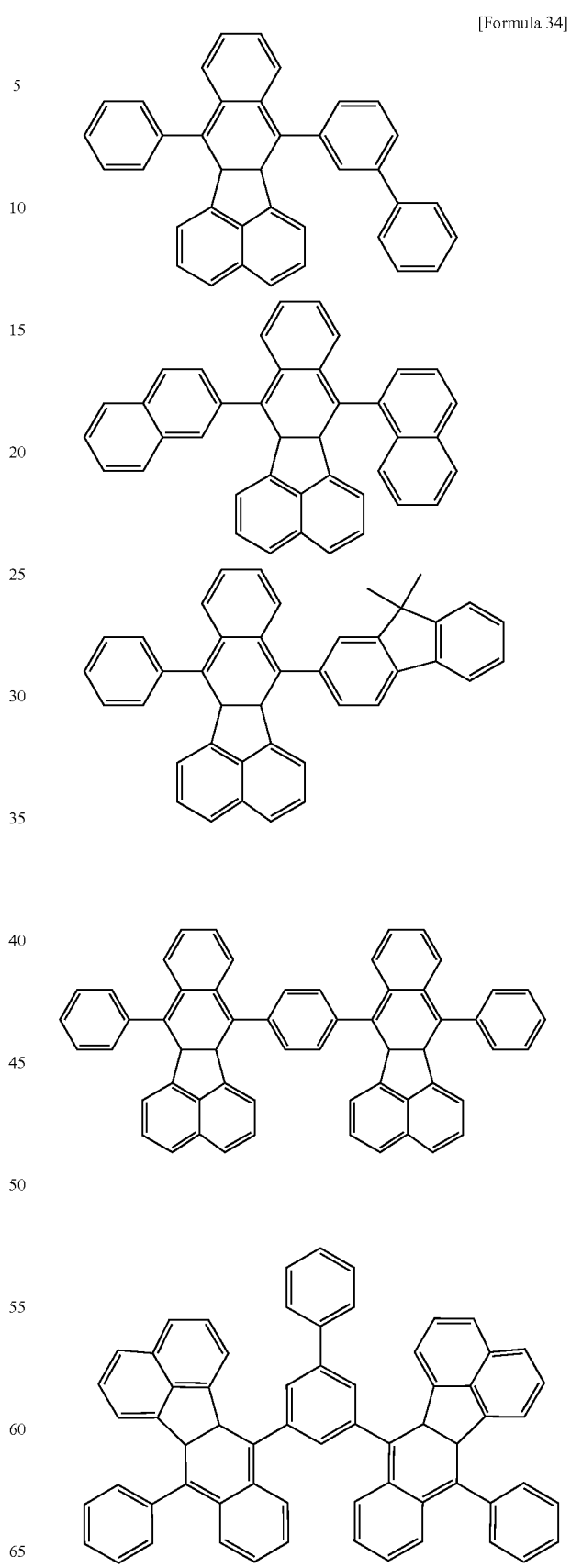

-continued
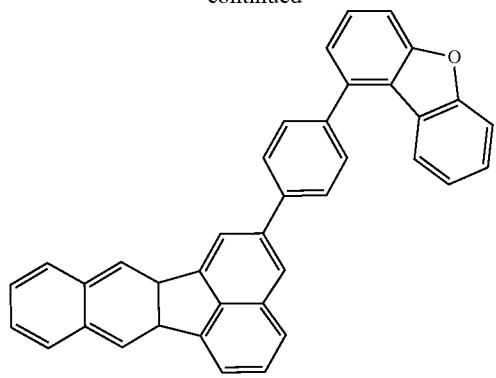
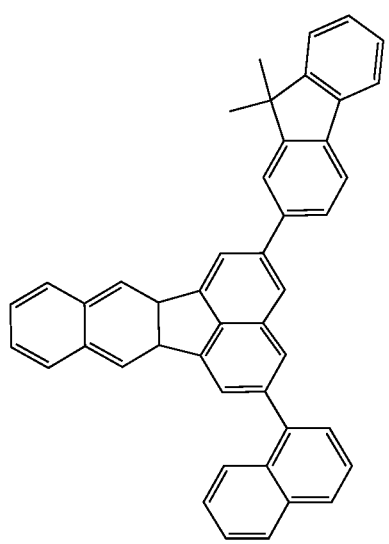
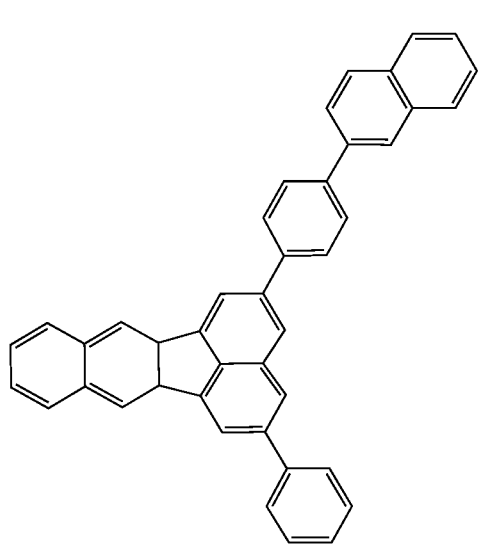
-continued
[Formula 35]
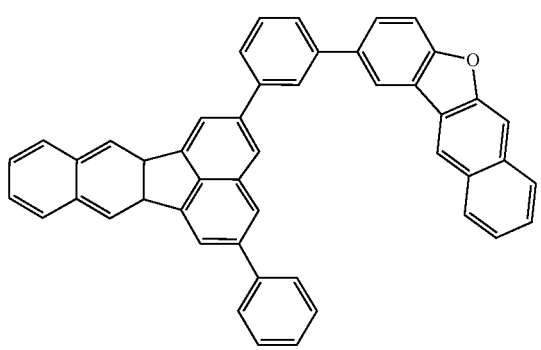
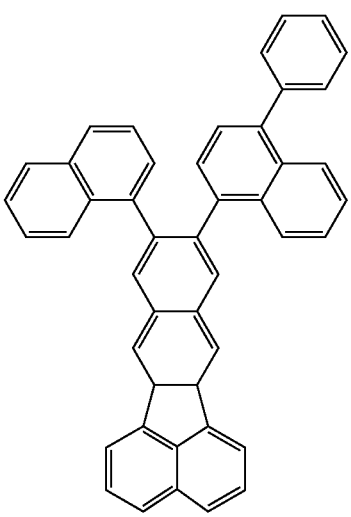

71
-continued
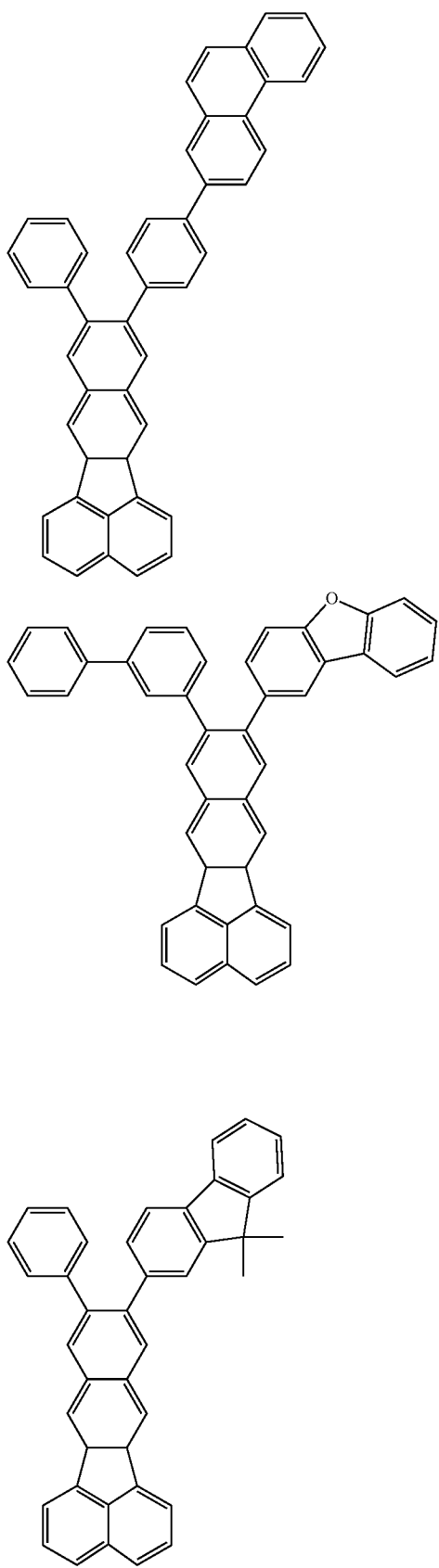
72
-continued
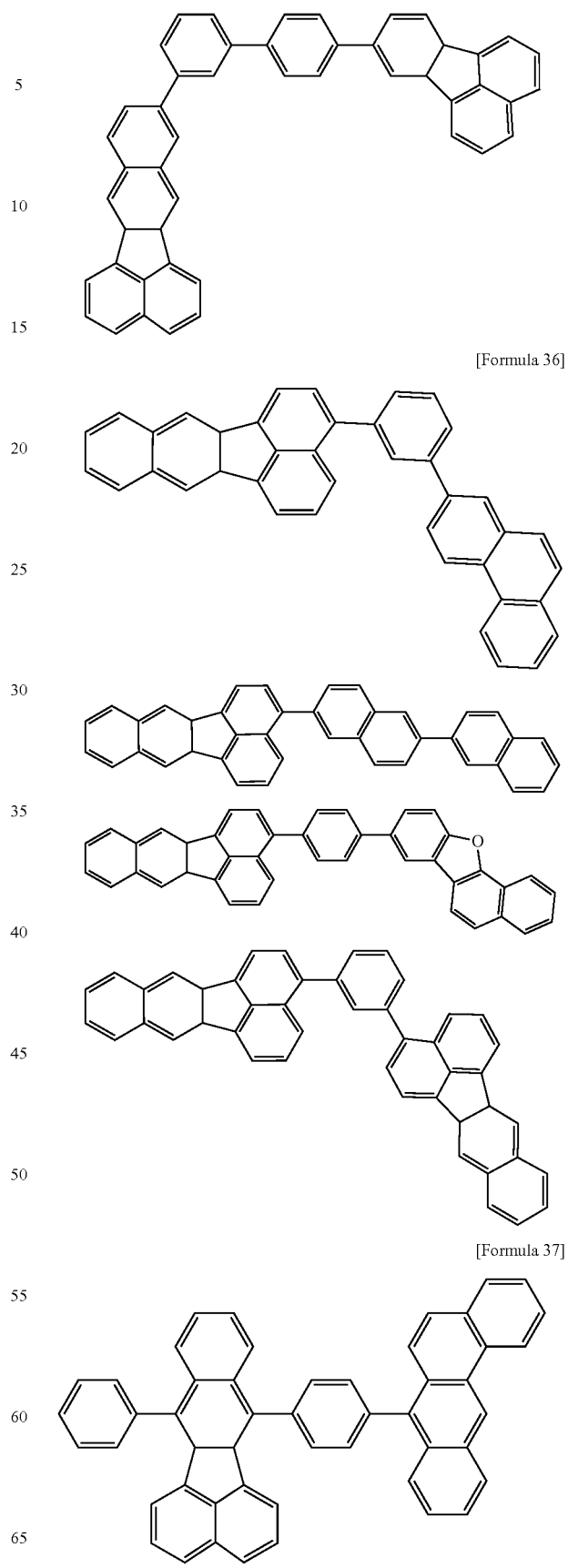
[Formula 36]
[Formula 37]

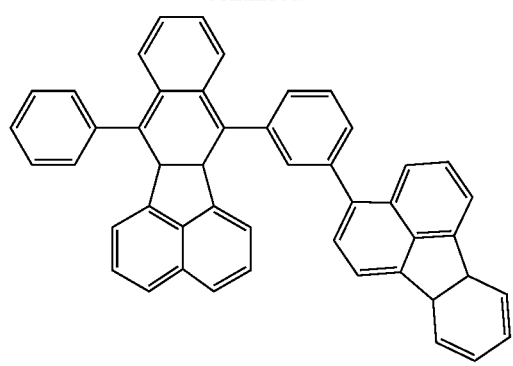
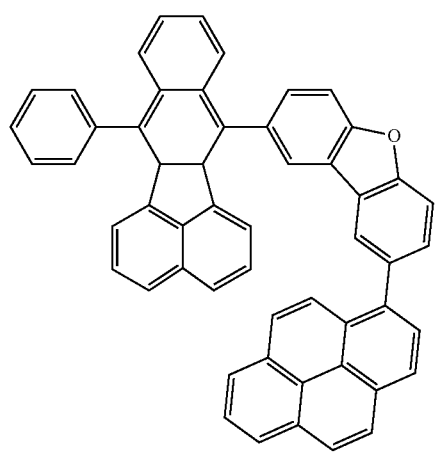
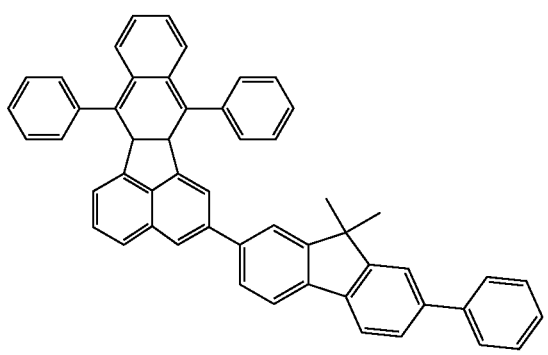
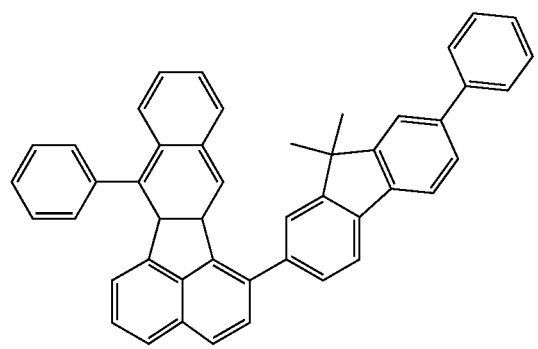
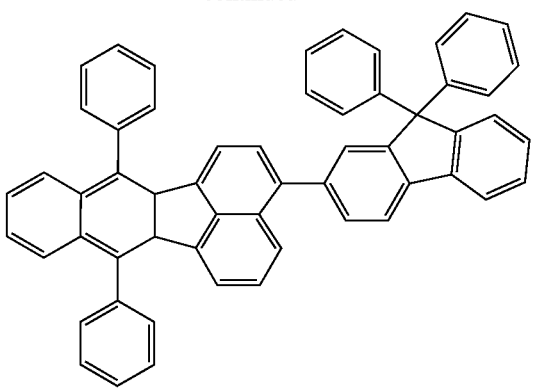
[Formula 38]
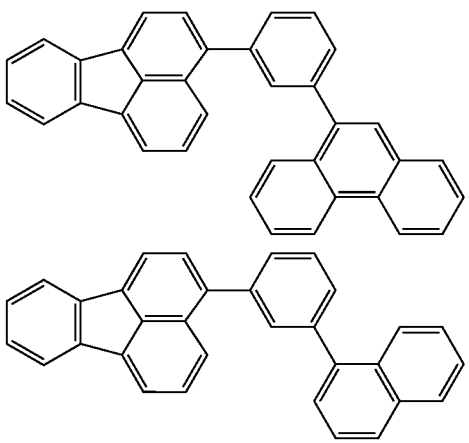
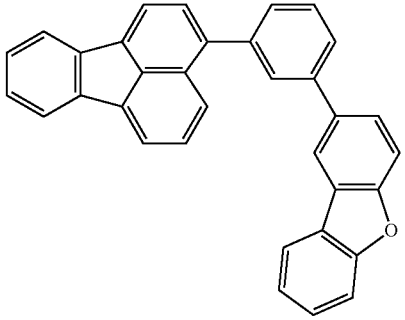
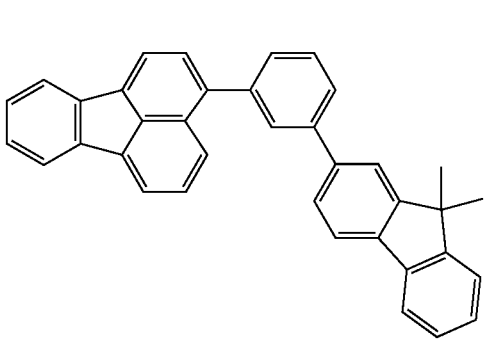

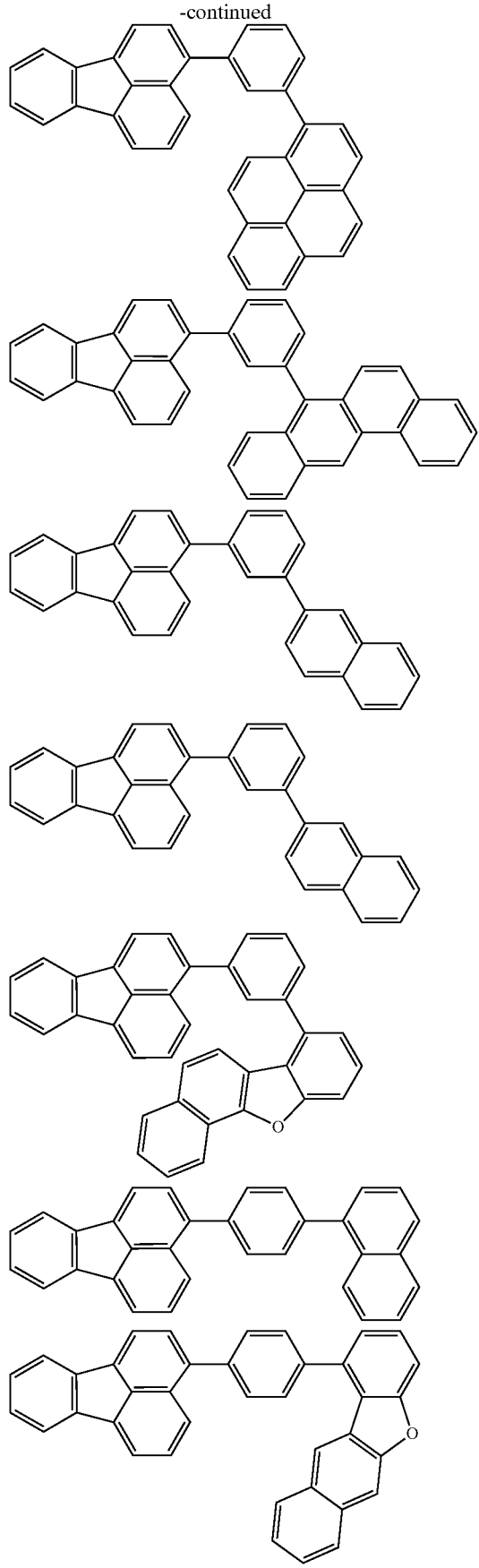
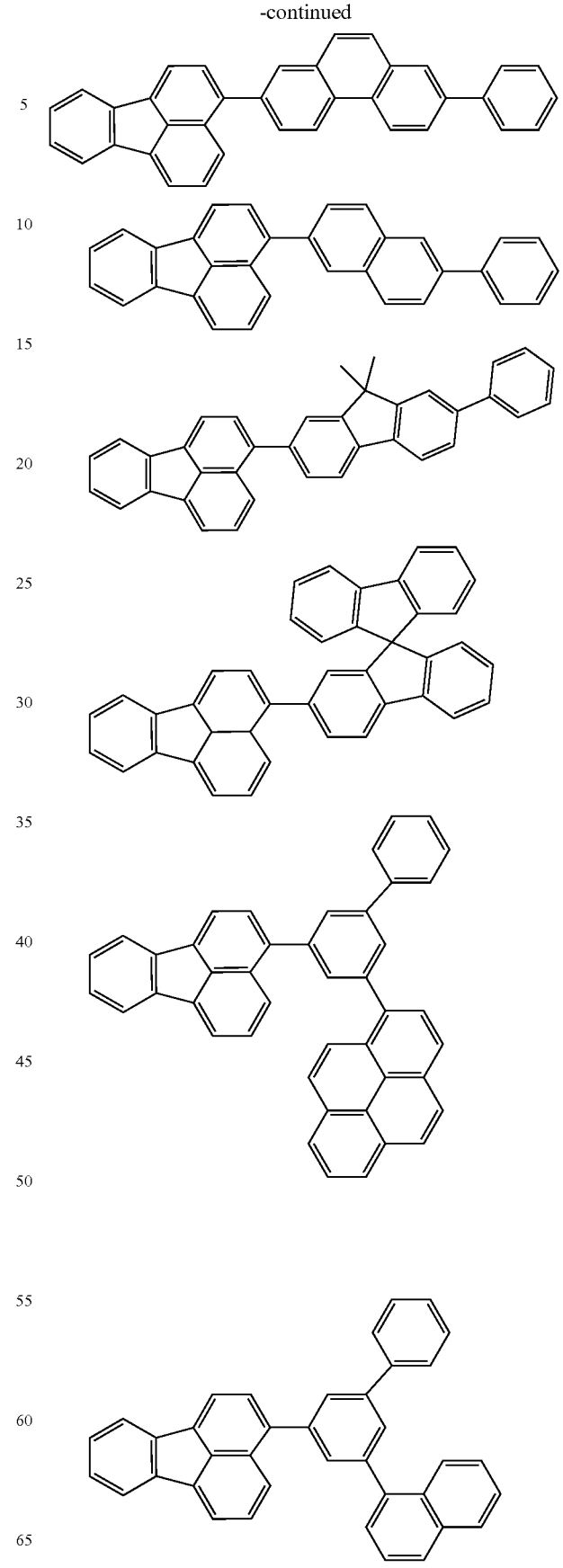

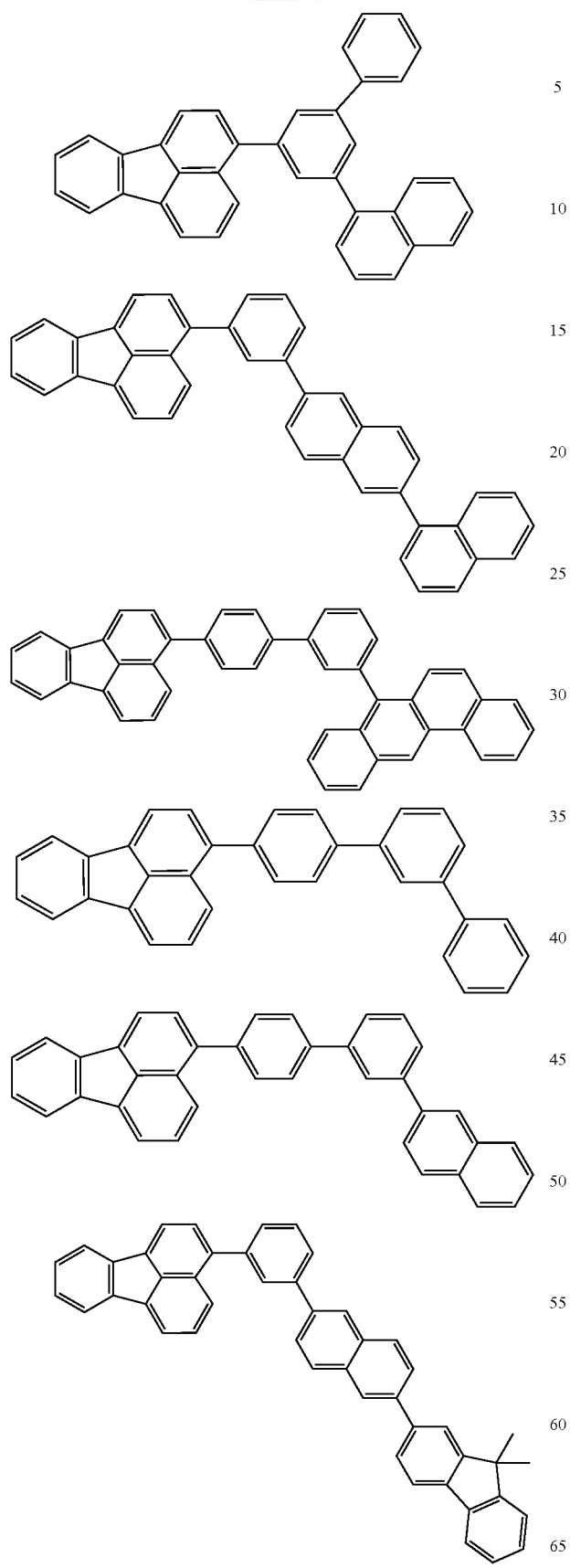
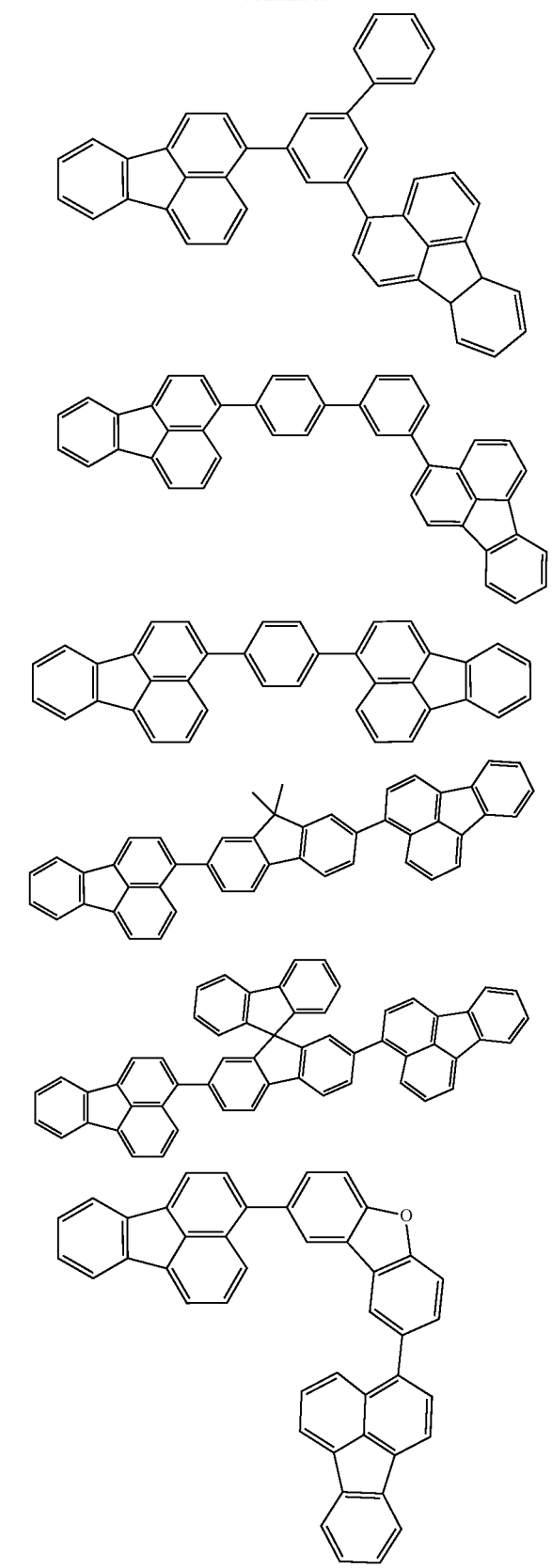

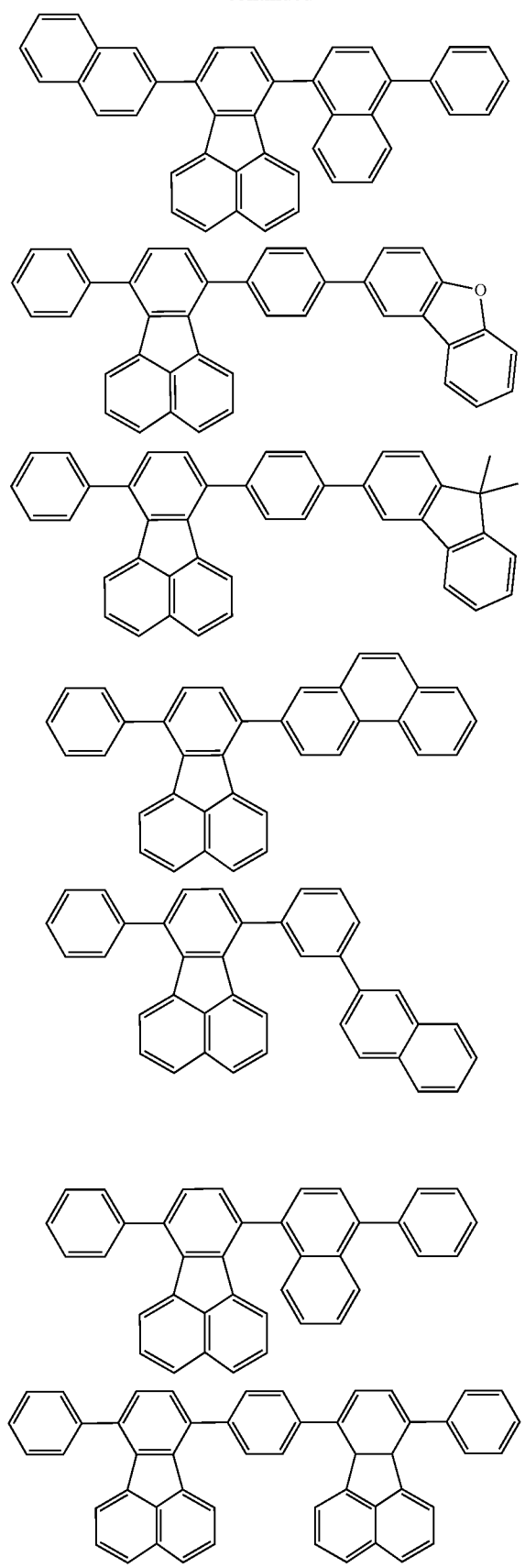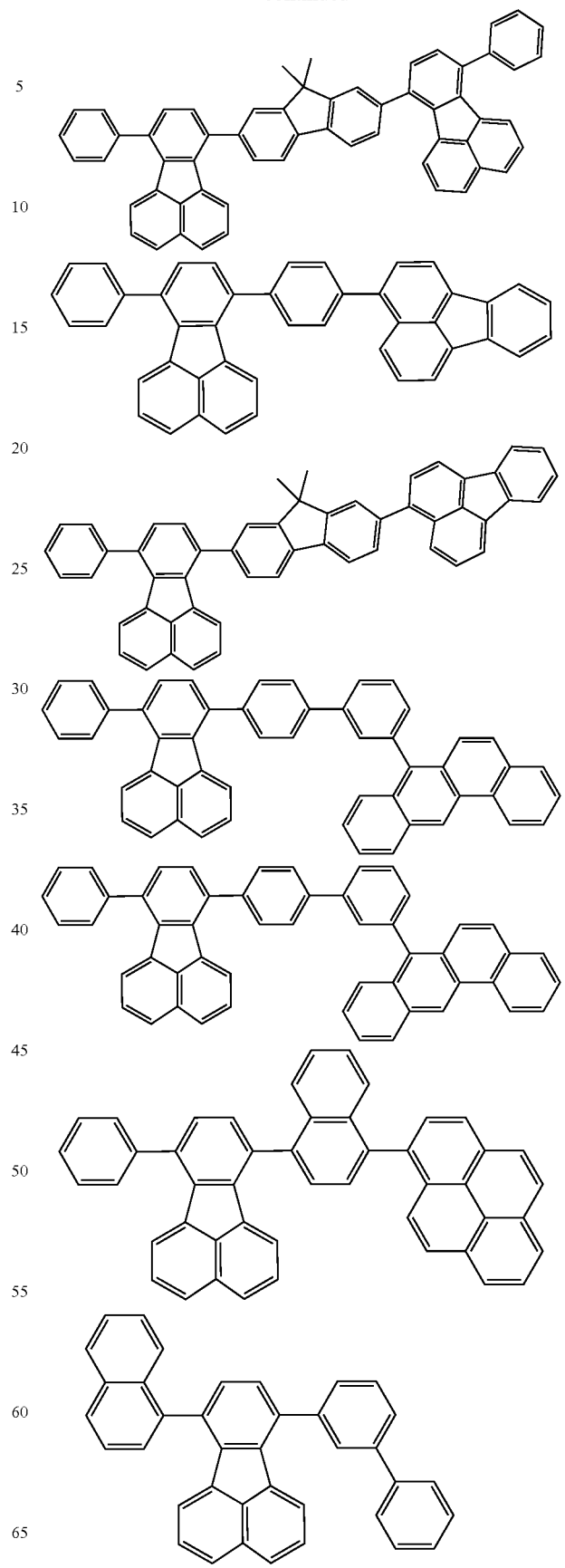

-continued

[Formula 39]

83
-continued
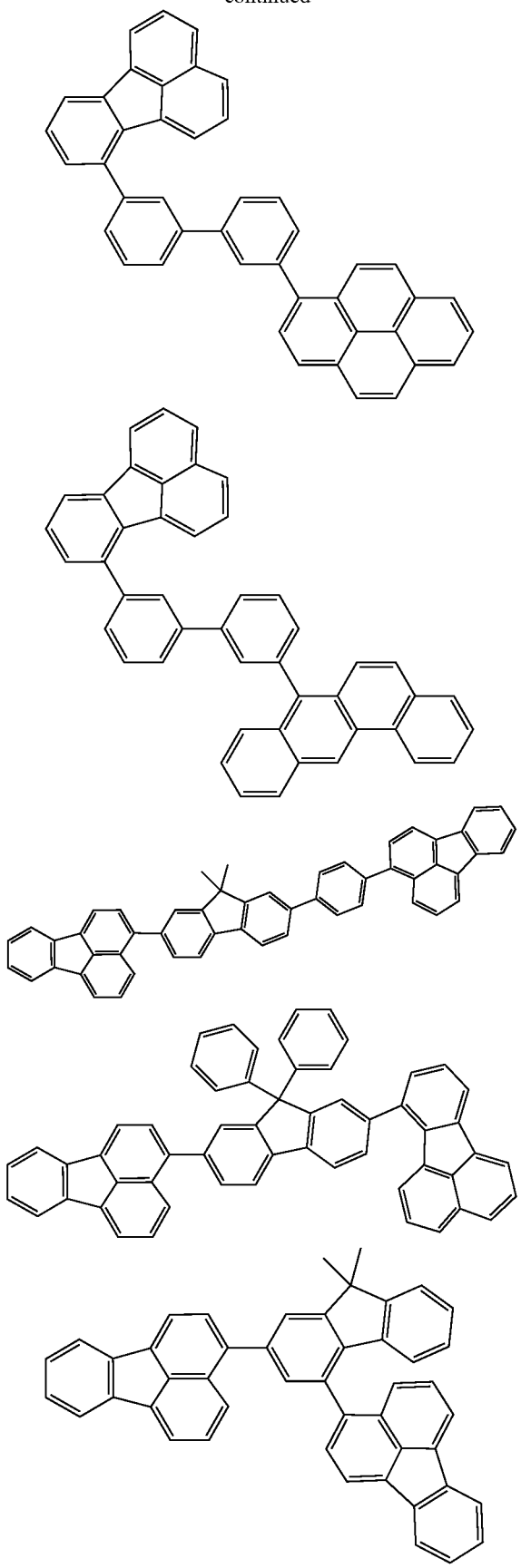
84
-continued
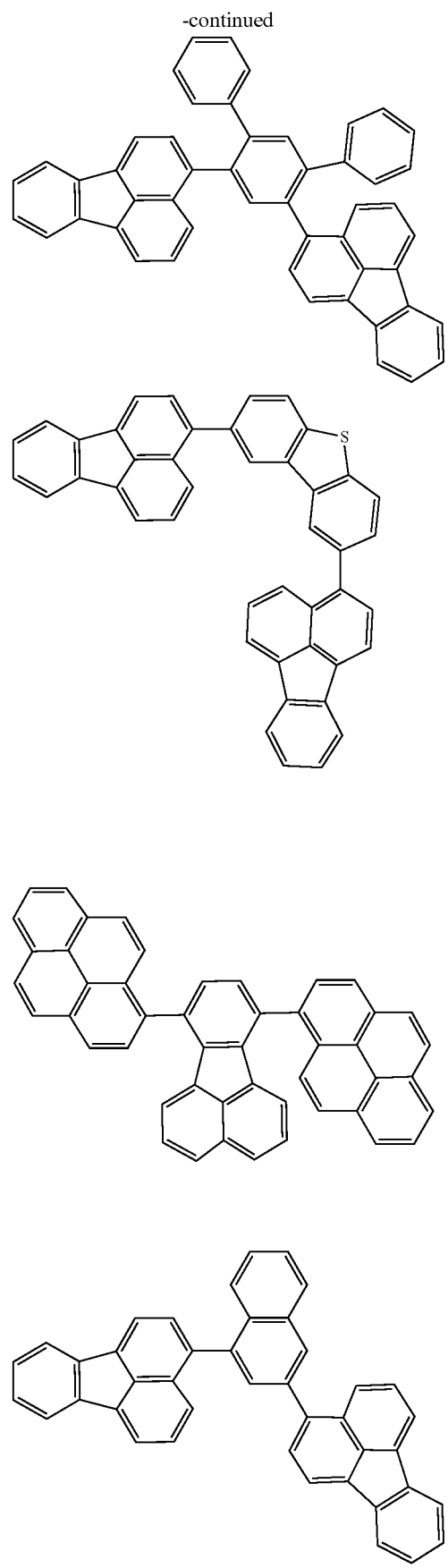

85
-continued
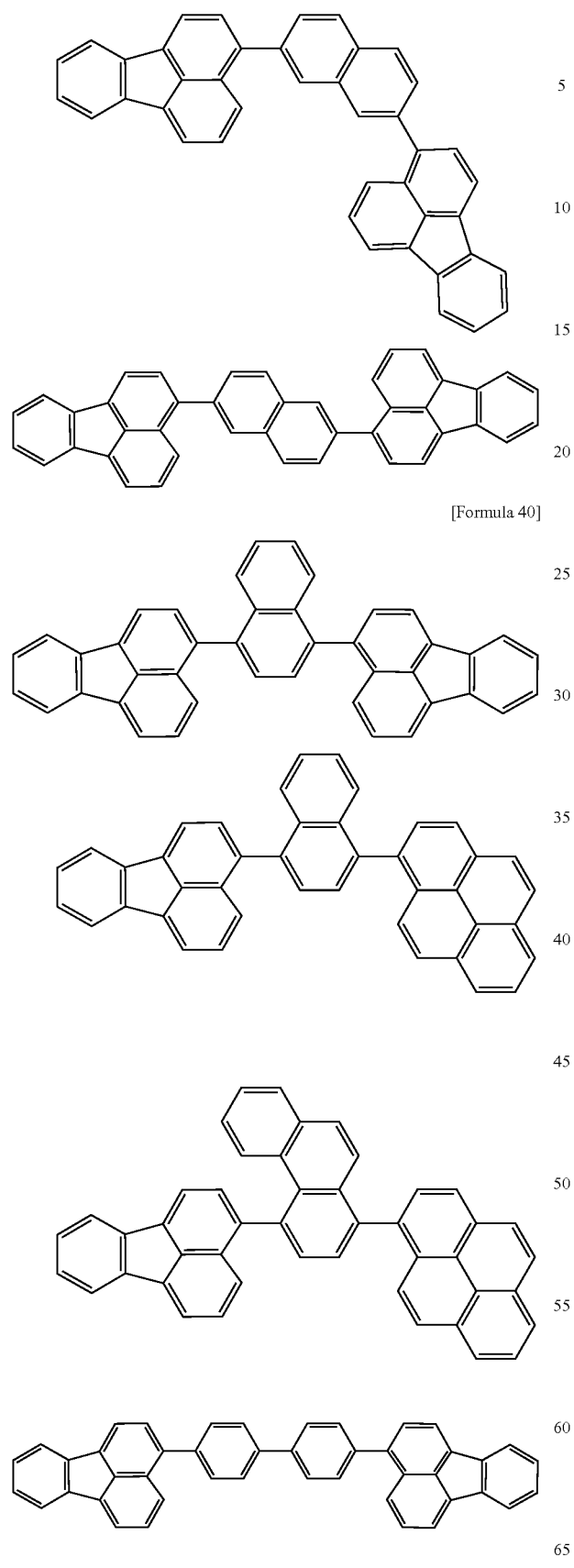
[Formula 40]
86
-continued
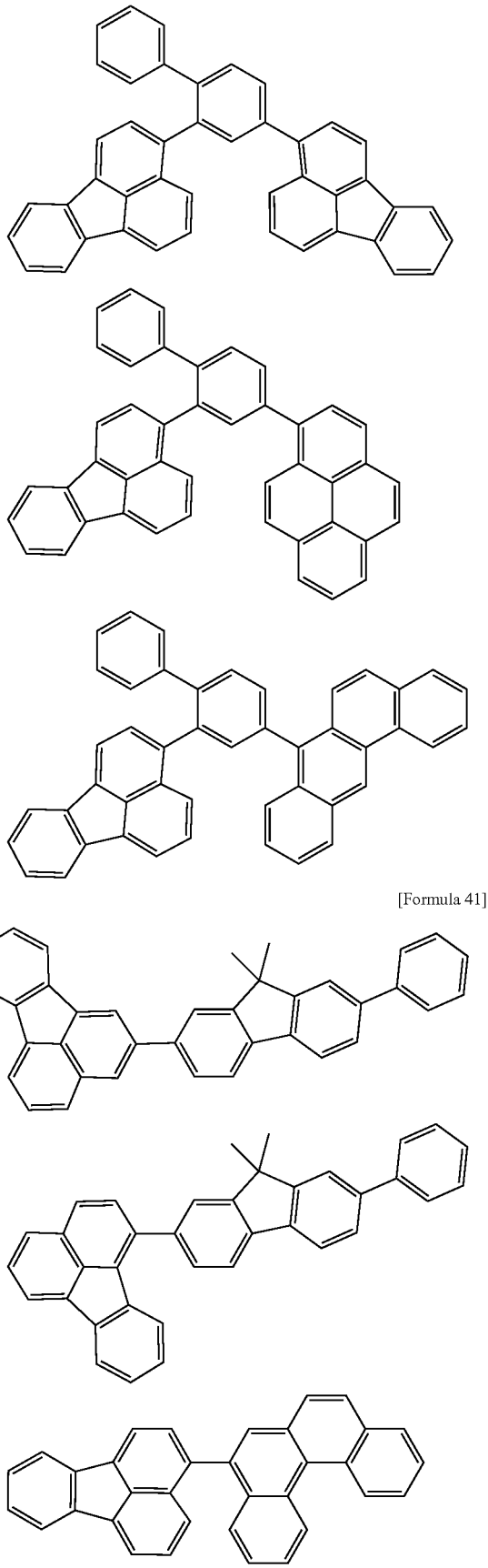
[Formula 41]

-continued
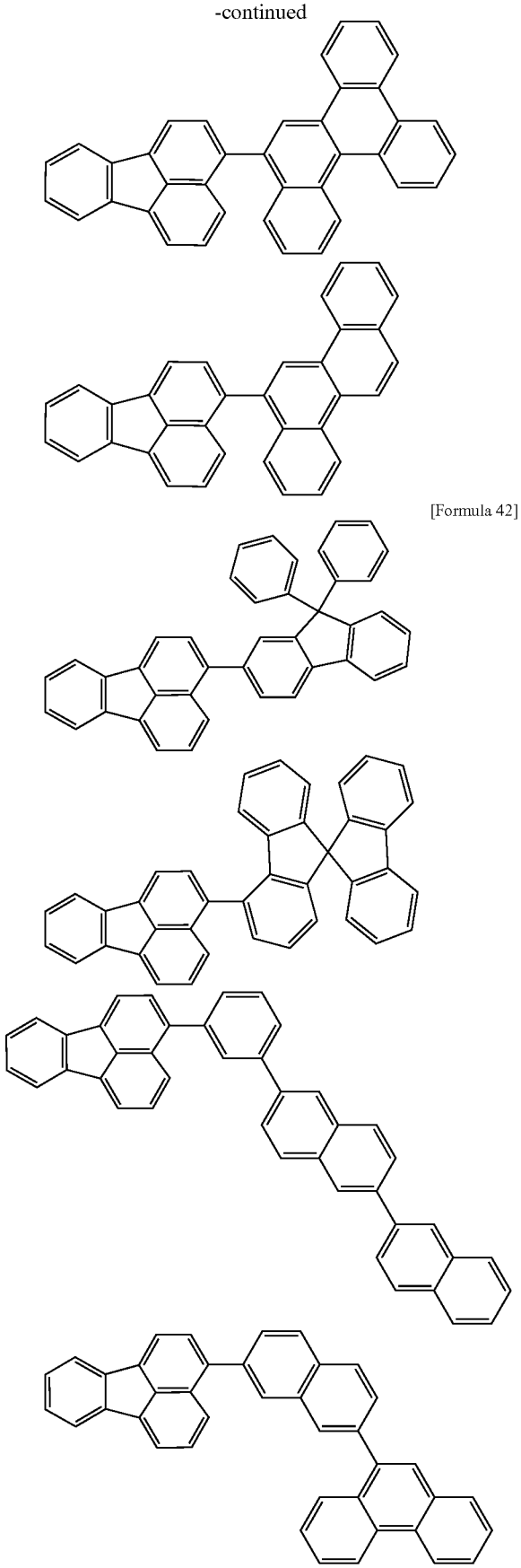
[Formula 42]
-continued
[Formula 43]
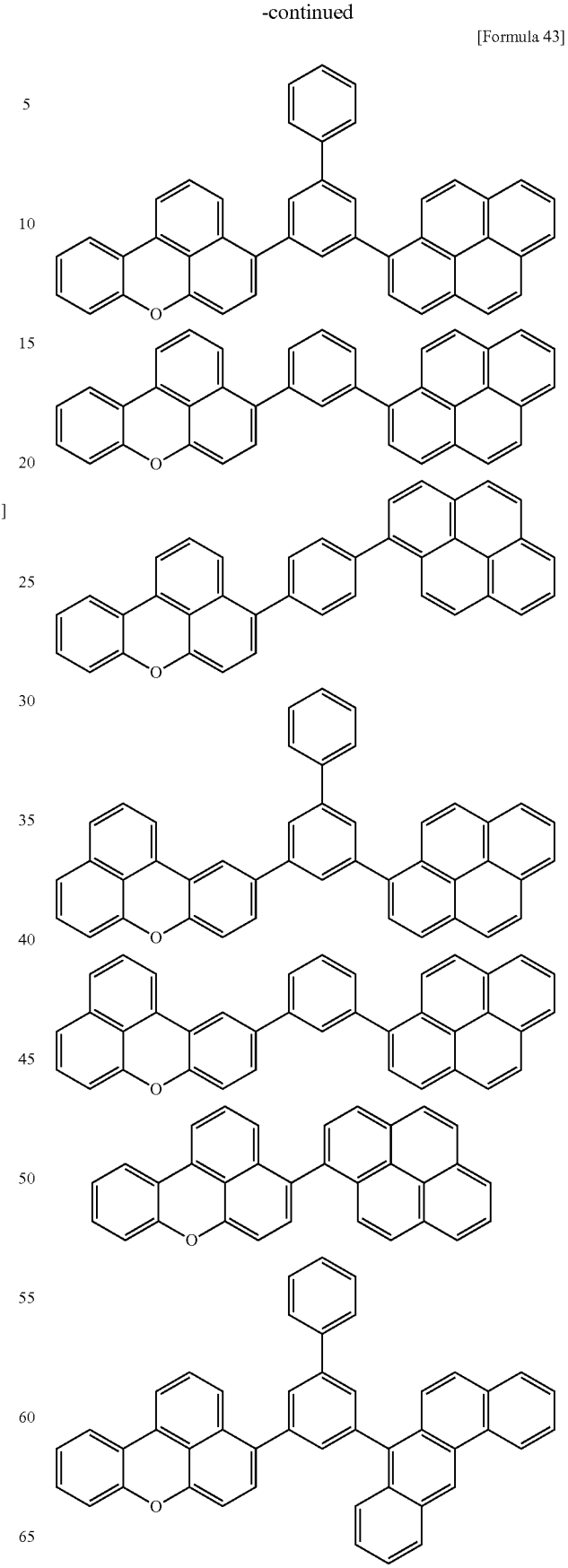

-continued

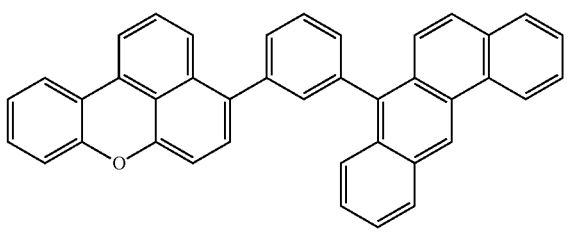

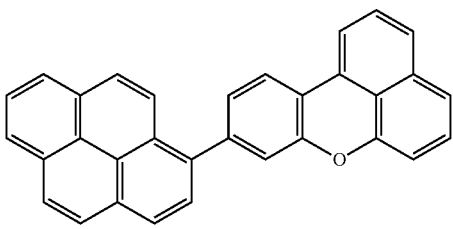

[Formula 44]

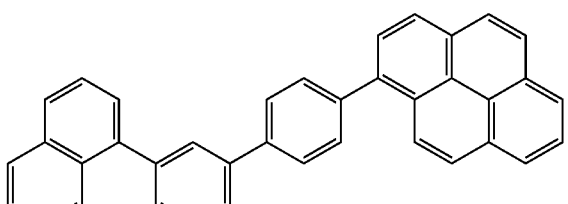

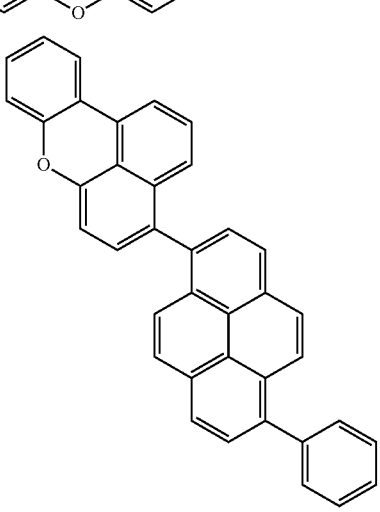

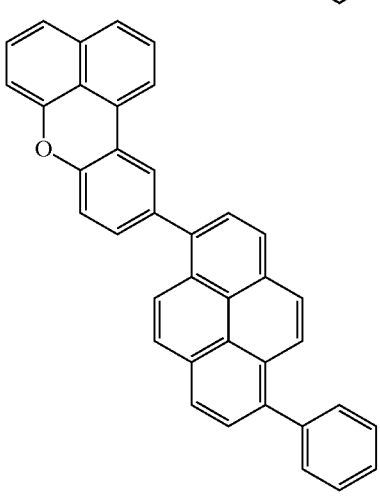

-continued

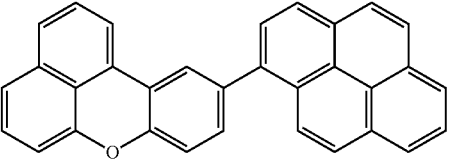

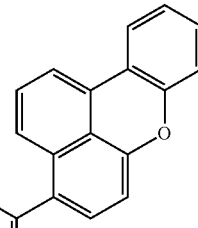

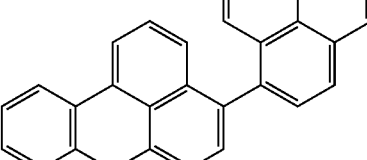

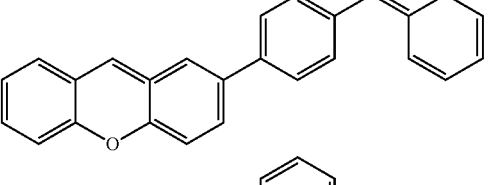

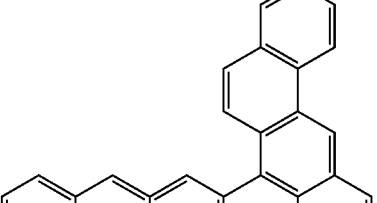

Second Compound

The second compound described in the first exemplary embodiment can be used also in the organic EL display device according to the present exemplary embodiment.

In the organic EL display device according to the present exemplary embodiment, $R_{201}$ to $R_{208}$, which are substituents on the anthracene skeleton in the second compound represented by the formula (2), are preferably each a hydrogen atom in order to prevent intermolecular interaction from being inhibited and suppress a decrease in electron mobility, but $R_{201}$ to $R_{208}$ may each be a substituted or unsubstituted aryl group having 6 to 50 ring carbon atom or a substituted or unsubstituted heterocyclic group having 5 to 50 ring atoms.

If $R_{201}$ to $R_{208}$ are bulky substituents such as alkyl groups and cycloalkyl groups, intermolecular interaction may be inhibited to decrease the electron mobility of the second host material relative to that of the first host material, thus failing to satisfy the relationship of the above numerical formula (Numerical Formula 6) µH2>µH1. In the case where the second compound is used in the fourth emitting layer, the decrease in the recombination performance of holes and electrons in the first emitting layer and the decrease in luminous efficiency can be expected to be suppressed when the relationship µH2>µH1 is satisfied. As the substituents, haloalkyl groups, alkenyl groups, alkynyl groups, groups represented by —Si($R_{901}$)($R_{902}$)($R_{903}$), groups represented by —O—($R_{904}$), groups represented by —S—($R_{905}$), groups represented by —N($R_{906}$)($R_{907}$), aralkyl groups, groups represented by —C(=O)$R_{801}$, groups represented by —COO$R_{802}$, halogen atoms, cyano groups, and nitro groups may be bulky, and alkyl groups and cycloalkyl groups may be further bulky.

$R_{201}$ to $R_{208}$, which are substituents on the anthracene skeleton in the second compound represented by the formula (2), are preferably not bulky substituents, preferably not alkyl groups or cycloalkyl groups, more preferably not alkyl groups, cycloalkyl groups, haloalkyl groups, alkenyl groups, alkynyl groups, groups represented by —Si($R_{901}$)($R_{902}$)($R_{903}$), groups represented by —O—($R_{904}$), groups represented by —S—($R_{905}$), groups represented by —N($R_{906}$)($R_{907}$), aralkyl groups, groups represented by —C(=O)$R_{801}$, groups represented by —COO$R_{802}$, halogen atoms, cyano groups, or nitro groups.

In the second compound, "substituted or unsubstituted" substituents represented by $R_{201}$ to $R_{208}$ also preferably do not include any of the above-described substituents that may be bulky, particularly, a substituted or unsubstituted alkyl group or a substituted or unsubstituted cycloalkyl group. When the "substituted or unsubstituted" substituents represented by $R_{201}$ to $R_{208}$ do not include a substituted or unsubstituted alkyl group or a substituted or unsubstituted cycloalkyl group, the inhibition of intermolecular interaction due to the presence of a bulky substituent such as an alkyl group or a cycloalkyl group is prevented, and the decrease in electron mobility can be prevented. In addition, when such a second compound is used in the fourth emitting layer, the decrease in the recombination performance of holes and electrons in the first emitting layer and the decrease in luminous efficiency can be suppressed.

More preferably, $R_{201}$ to $R_{208}$, which are substituents on the anthracene skeleton, are not bulky substituents and are unsubstituted. In the case where $R_{201}$ to $R_{208}$, which are substituents on the anthracene skeleton, are not bulky substituents, when $R_{201}$ to $R_{208}$, which are non-bulky substituents, are substituted with substituents, the substituents are also preferably not bulky substituents, and the substituents bonded to $R_{201}$ to 8208 are more preferably not alkyl groups or cycloalkyl groups, more preferably not alkyl groups, cycloalkyl groups, haloalkyl groups, alkenyl groups, alkynyl groups, groups represented by —Si($R_{901}$)($R_{902}$)($R_{903}$), groups represented by —O—($R_{904}$), groups represented by —S—($R_{905}$), groups represented by —N($R_{906}$)($R_{907}$), aralkyl groups, groups represented by —C(=O)$R_{801}$, groups represented by —COO$R_{802}$, halogen atoms, cyano groups, or nitro groups.

Method of Producing Second Compound

The second compound usable in the organic EL display device according to the present exemplary embodiment can be produced by a known method. The second compound can also be produced in accordance with a known method and using known alternative reactions and materials according to the target compound.

Specific Examples of Second Compound

Specific examples of the second compound usable in the organic EL display device according to the present exemplary embodiment include the specific examples of the second compound described in the first exemplary embodiment. It should however be noted that the invention is not limited to these specific examples of the second compound.
First Dopant Material and Second Dopant Material In the organic EL display device according to the present exemplary embodiment, the first dopant material and the second dopant material may be, for example, the third compound and the fourth compound described in the first exemplary embodiment.

According to the present exemplary embodiment, similarly to the first exemplary embodiment, an organic EL display device that can improve the performance of an organic EL device serving as a pixel without greatly increasing the cost of processing can be provided. According to the present exemplary embodiment, the luminous efficiency of the blue organic EL device serving as a pixel can be improved.

Third Exemplary Embodiment

Electronic Device

An electronic device according to an exemplary embodiment includes any one of the organic EL display devices according to the above exemplary embodiments. The electronic device may be, for example, a display or a light-emitting apparatus. Examples of the display device include display components (e.g., organic EL panel modules), televisions, cellular phones, tablets, and personal computers. Examples of the light-emitting apparatus include illuminators and lighting fixtures for vehicles.

Definitions

Herein, hydrogen includes isotopes having different numbers of neutrons, specifically, protium, deuterium, and tritium.

In chemical structural formulae herein, a hydrogen atom, that is, a protium atom, a deuterium atom, or a tritium atom, is bonded to a bondable position not denoted by any symbols, such as "R", or "D" representing a deuterium atom.

Herein, the number of ring carbon atoms refers to the number of carbon atoms among atoms constituting a ring of a compound having a structure in which atoms are bonded to each other to form the ring (e.g., a monocyclic compound, a fused-ring compound, a cross-linking compound, a carbon ring compound, or a heterocyclic compound). When the ring is substituted with a substituent, carbon atoms included in the substituent are not counted as ring carbon atoms. Unless otherwise specified, the same applies to "ring carbon atoms" described later. For example, a benzene ring has 6 ring carbon atoms, a naphthalene ring has 10 ring carbon atoms, a pyridine ring has 5 ring carbon atoms, and a furan ring has 4 ring carbon atoms. For example, a 9,9-diphenylfluorenyl group has 13 ring carbon atoms, and a 9,9'-spirobifluorenyl group has 25 ring carbon atoms.

When a benzene ring is substituted with, for example, an alkyl group, carbon atoms of the alkyl group are not counted as ring carbon atoms of the benzene ring. Therefore, a benzene ring substituted with an alkyl group has 6 ring carbon atoms. When a naphthalene ring is substituted with, for example, an alkyl group, carbon atoms of the alkyl group are not counted as ring carbon atoms of the naphthalene ring.

Therefore, a naphthalene ring substituted with an alkyl group has 10 ring carbon atoms.

Herein, the number of ring atoms refers to the number of atoms constituting a ring of a compound (e.g., a monocyclic compound, a fused-ring compound, a cross-linking compound, a carbon ring compound, or a heterocyclic compound) having a structure in which atoms are bonded to each other to form the ring (e.g., a monocyclic ring, a fused ring, or a ring assembly). Atoms not constituting the ring (e.g., hydrogen atoms terminating bonds of atoms constituting the ring) and atoms included in a substituent with which the ring is substituted are not counted as ring atoms. Unless otherwise specified, the same applies to "ring atoms" described later. For example, a pyridine ring has 6 ring atoms, a quinazoline ring has 10 ring atoms, and a furan ring has 5 ring atoms. For example, hydrogen atoms bonded to a pyridine ring and atoms constituting a substituent of the pyridine ring are not counted as pyridine ring atoms. Therefore, a pyridine ring to which hydrogen atoms or a substituent is bonded has 6 ring atoms. For example, hydrogen atoms bonded to carbon atoms of a quinazoline ring and atoms constituting a substituent of the quinazoline ring are not counted as ring atoms of the quinazoline ring. Therefore, a quinazoline ring to which hydrogen atoms or a substituent is bonded has 10 ring atoms.

Herein, "XX to YY carbon atoms" in the expression "substituted or unsubstituted ZZ group having XX to YY carbon atoms" are carbon atoms in the case where the ZZ group is unsubstituted and do not include carbon atoms of substituents in the case where the ZZ group is substituted. Here, "YY" is larger than "XX", "XX" is an integer of 1 or more, and "YY" is an integer of 2 or more.

Herein, "XX to YY atoms" in the expression "substituted or unsubstituted ZZ group having XX to YY atoms" are atoms in the case where the ZZ group is unsubstituted and do not include atoms of substituents in the case where the ZZ group is substituted. Here, "YY" is larger than "XX", "XX" is an integer of 1 or more, and "YY" is an integer of 2 or more.

Herein, an unsubstituted ZZ group refers to the case where a "substituted or unsubstituted ZZ group" is an "unsubstituted ZZ group", and a substituted ZZ group refers to the case where a "substituted or unsubstituted ZZ group" is a "substituted ZZ group".

Herein, "unsubstituted" in "substituted or unsubstituted ZZ group" means that hydrogen atoms in the ZZ group are not substituted with any substituents. A hydrogen atom in an "unsubstituted ZZ group" is a protium atom, a deuterium atom, or a tritium atom.

Herein, "substituted" in "substituted or unsubstituted ZZ group" means that at least one hydrogen atom in the ZZ group is substituted with a substituent. Similarly, "substituted" in "BB group substituted with AA group" means that at least one hydrogen atom in the BB group is substituted with the AA group.

Substituents Mentioned Herein

Substituents mentioned herein will be described below.

An "unsubstituted aryl group" mentioned herein has 6 to 50, preferably 6 to 30, more preferably 6 to 18 ring carbon atoms, unless otherwise specified herein.

An "unsubstituted heterocyclic group" mentioned herein has 5 to 50, preferably 5 to 30, more preferably 5 to 18 ring atoms, unless otherwise specified herein.

An "unsubstituted alkyl group" mentioned herein has 1 to 50, preferably 1 to 20, more preferably 1 to 6 carbon atoms, unless otherwise specified herein.

An "unsubstituted alkenyl group" mentioned herein has 2 to 50, preferably 2 to 20, more preferably 2 to 6 carbon atoms, unless otherwise specified herein.

An "unsubstituted alkynyl group" mentioned herein has 2 to 50, preferably 2 to 20, more preferably 2 to 6 carbon atoms, unless otherwise specified herein.

An "unsubstituted cycloalkyl group" mentioned herein has 3 to 50, preferably 3 to 20, more preferably 3 to 6 ring carbon atoms, unless otherwise specified herein.

An "unsubstituted arylene group" mentioned herein has 6 to 50, preferably 6 to 30, more preferably 6 to 18 ring carbon atoms, unless otherwise specified herein.

An "unsubstituted divalent heterocyclic group" mentioned herein has 5 to 50, preferably 5 to 30, more preferably 5 to 18 ring atoms, unless otherwise specified herein.

An "unsubstituted alkylene group" mentioned herein has 1 to 50, preferably 1 to 20, more preferably 1 to 6 carbon atoms, unless otherwise specified herein.

Substituted or Unsubstituted Aryl Group

Specific examples (specific example group G1) of a "substituted or unsubstituted aryl group" mentioned herein include unsubstituted aryl groups (specific example group G1A) and substituted aryl groups (specific example group G1B) below. (Here, an unsubstituted aryl group refers to the case where a "substituted or unsubstituted aryl group" is an "unsubstituted aryl group", and a substituted aryl group refers to the case where a "substituted or unsubstituted aryl group" is a "substituted aryl group".) Herein, when simply referred to as an "aryl group", it includes both an "unsubstituted aryl group" and a "substituted aryl group".

A "substituted aryl group" means a group derived by substituting at least one hydrogen atom of an "unsubstituted aryl group" with a substituent. Examples of the "substituted aryl group" include groups derived by substituting at least one hydrogen atom of an "unsubstituted aryl group" in the specific example group G1A with a substituent and examples of substituted aryl groups in the specific example group G1B. It should be noted that the examples of the "unsubstituted aryl group" and the "substituted aryl group" listed here are merely examples, and the "substituted aryl group" mentioned herein also includes groups derived by further substituting a hydrogen atom bonded to a carbon atom of the aryl group itself of a "substituted aryl group" in the specific example group G1B with a substituent and groups derived by further substituting a hydrogen atom of the substituent of a "substituted aryl group" in the specific example group G1B with a substituent.

Unsubstituted Aryl Group (Specific Example Group G1A): phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and monovalent aryl groups derived by removing one hydrogen atom from cyclic structures represented by formulae (TEMP-1) to (TEMP-15) below.

[Formula 45]

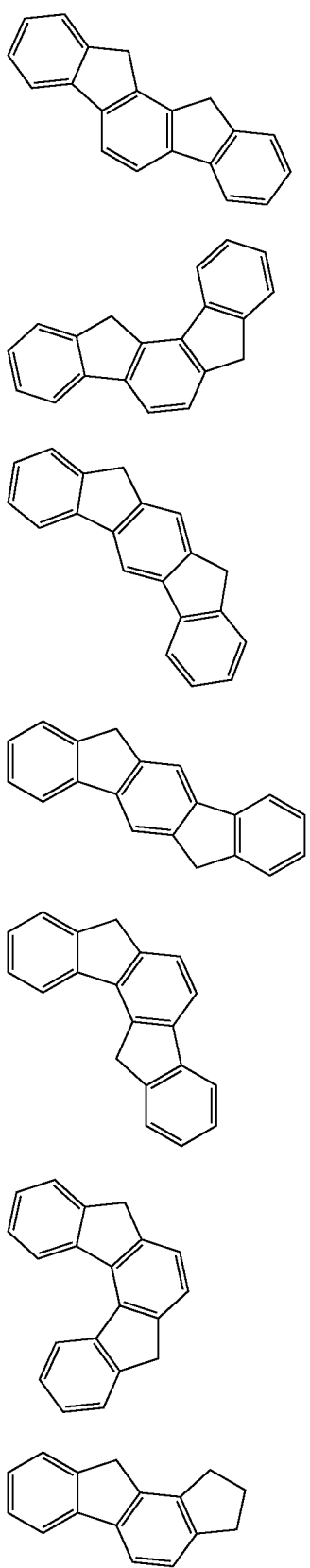

(TEMP-1)

(TEMP-2)

(TEMP-3)

(TEMP-4)

(TEMP-5)

(TEMP-6)

(TEMP-7)

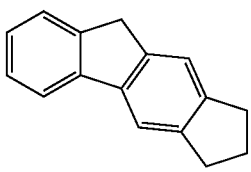
(TEMP-8)

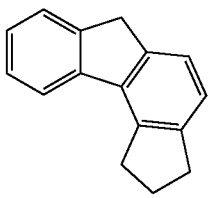
(TEMP-9)

[Formula 46]

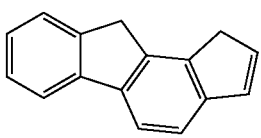
(TEMP-10)

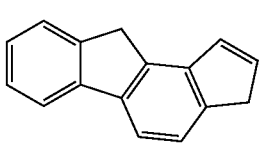
(TEMP-11)

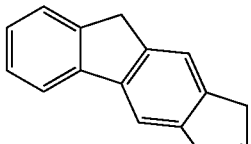
(TEMP-12)

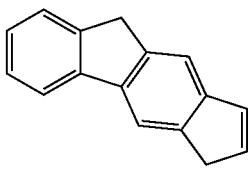
(TEMP-13)

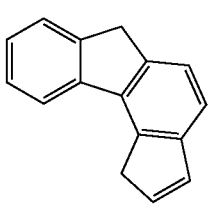
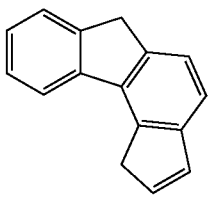
(TEMP-14)

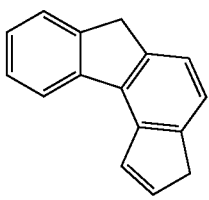
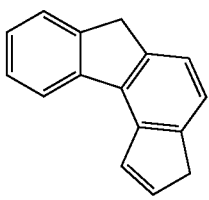
(TEMP-15)

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5- trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and groups derived by substituting at least one hydrogen atom of monovalent groups derived from the cyclic structures represented by the formulae (TEMP-1) to (TEMP-15) with a substituent.

Substituted or Unsubstituted Heterocyclic Group"

A "heterocyclic group" mentioned herein is a cyclic group including at least one heteroatom as a ring atom. Specific examples of the heteroatom include a nitrogen atom, an oxygen atom, a sulfur atom, a silicon atom, a phosphorus atom, and a boron atom.

A "heterocyclic group" mentioned herein is a monocyclic group or a fused-ring group.

A "heterocyclic group" mentioned herein is an aromatic heterocyclic group or a non-aromatic heterocyclic group.

Specific examples (specific example group G2) of a "substituted or unsubstituted heterocyclic group" mentioned herein include unsubstituted heterocyclic groups (specific example group G2A) and substituted heterocyclic groups (specific example group G2B) below. (Here, an unsubstituted heterocyclic group refers to the case where a "substituted or unsubstituted heterocyclic group" is an "unsubstituted heterocyclic group", and a substituted heterocyclic group refers to the case where a "substituted or unsubstituted heterocyclic group" is a "substituted heterocyclic group".) Herein, when simply referred to as a "heterocyclic group", it includes both an "unsubstituted heterocyclic group" and a "substituted heterocyclic group".

A "substituted heterocyclic group" means a group derived by substituting at least one hydrogen atom of an "unsubstituted heterocyclic group" with a substituent. Specific examples of the "substituted heterocyclic group" include groups derived by substituting a hydrogen atom of an "unsubstituted heterocyclic group" in the specific example group G2A and examples of substituted heterocyclic groups in the specific example group G2B. It should be noted that the examples of the "unsubstituted heterocyclic group" and the "substituted heterocyclic group" listed here are merely examples, and the "substituted heterocyclic group" mentioned herein also includes groups derived by further substituting a hydrogen atom bonded to a ring atom of the heterocyclic group itself of a "substituted heterocyclic group" in the specific example group G2B with a substituent and groups derived by further substituting a hydrogen atom of the substituent of a "substituted heterocyclic group" in the specific example group G2B with a substituent.

The specific example group G2A includes, for example, the following nitrogen-containing unsubstituted heterocyclic groups (specific example group G2A1), oxygen-containing unsubstituted heterocyclic groups (specific example group G2A2), sulfur-containing unsubstituted heterocyclic groups (specific example group G2A3), and monovalent heterocyclic groups (specific example group G2A4) derived by removing one hydrogen atom from cyclic structures represented by formulae (TEMP-16) to (TEMP-33) below.

The specific example group G2B includes, for example, the following nitrogen-containing substituted heterocyclic groups (specific example group G2B1), oxygen-containing substituted heterocyclic groups (specific example group G2B2), sulfur-containing substituted heterocyclic groups (specific example group G2B3), and groups (specific example group G2B4) derived by substituting at least one hydrogen atom of monovalent heterocyclic groups derived from the cyclic structures represented by the formulae (TEMP-16) to (TEMP-33) with a substituent.

Unsubstituted Heterocyclic Groups Including Nitrogen Atom (Specific Example Group G2A1):
pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazinyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):
furyl group, oxazolyl group, isoxazolyl group, oxadiazolyl group, xanthenyl group, benzofuranyl group, isobenzofuranyl group, dibenzofuranyl group, naphthobenzofuranyl group, benzooxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):
thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (naphthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), zanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

[Formula 47]

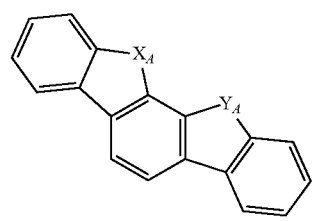

(TEMP-16)

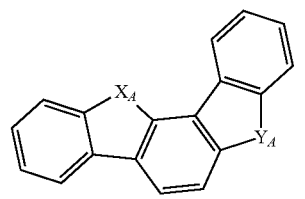

(TEMP-17)

-continued
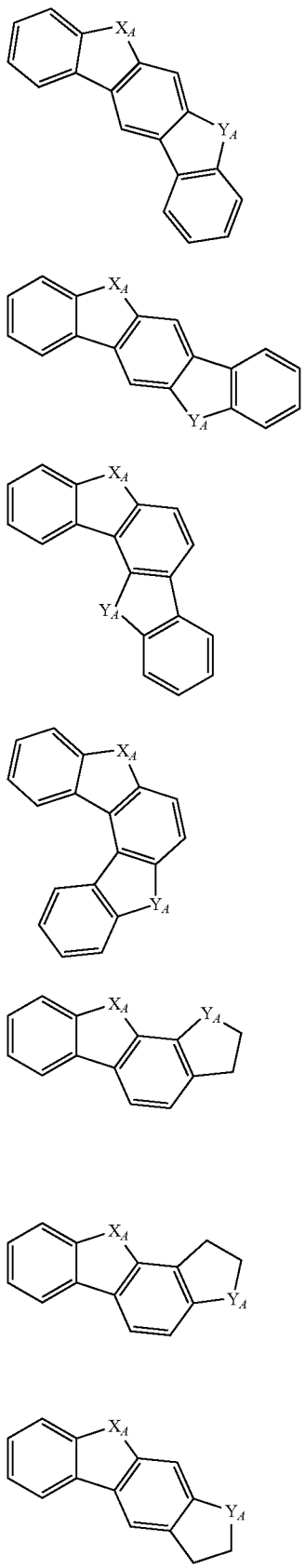
(TEMP-18)
(TEMP-19)
(TEMP-20)
(TEMP-21)
(TEMP-22)
(TEMP-23)
(TEMP-24)
-continued
[Formula 48]
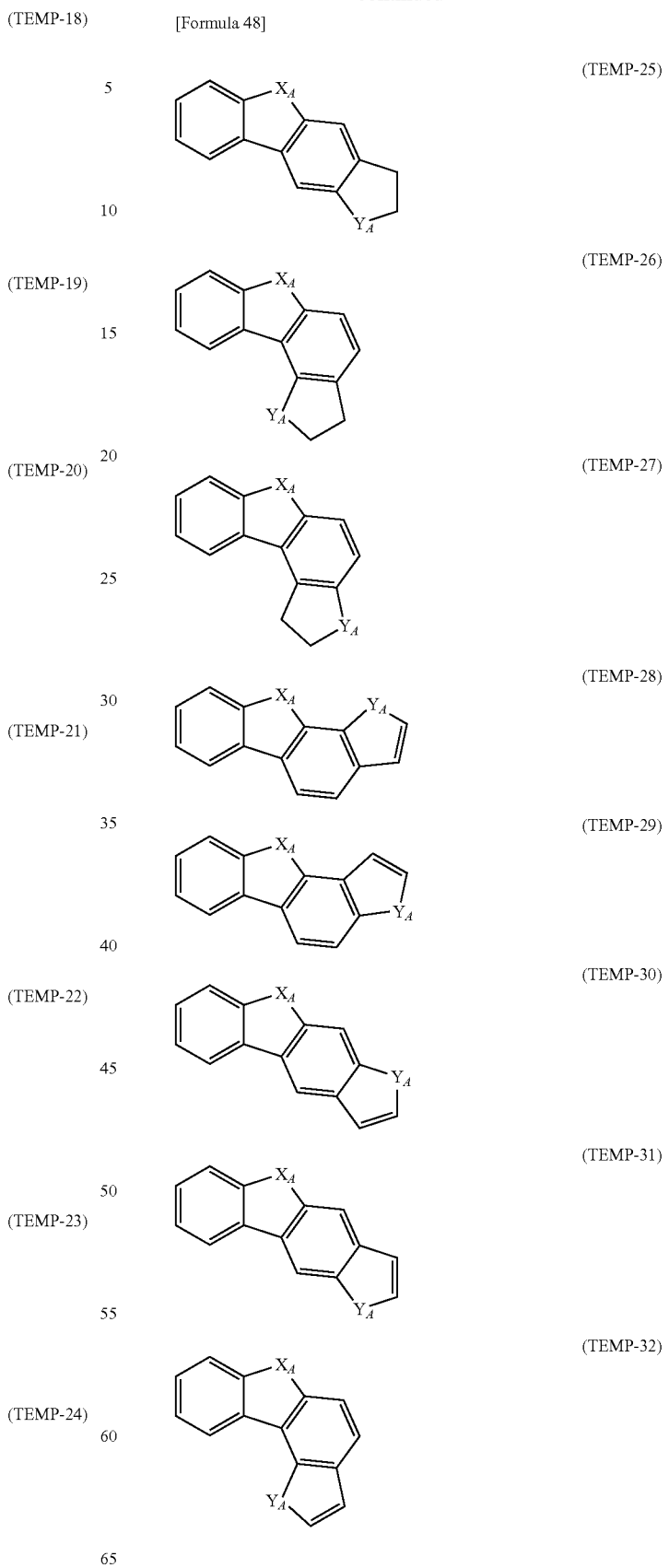
(TEMP-25)
(TEMP-26)
(TEMP-27)
(TEMP-28)
(TEMP-29)
(TEMP-30)
(TEMP-31)
(TEMP-32)

-continued

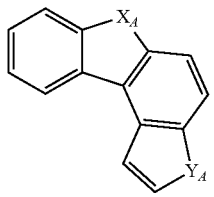

(TEMP-33)

In the formulae (TEMP-16) to (TEMP-33), $X_A$ and $Y_A$ are each independently an oxygen atom, a sulfur atom, NH, or $CH_2$. At least one of $X_A$ or $Y_A$ is an oxygen atom, a sulfur atom, or NH.

In the formulae (TEMP-16) to (TEMP-33), when at least one of $X_A$ or $Y_A$ is NH or $CH_2$, the monovalent heterocyclic groups derived from the cyclic structures represented by the formulae (TEMP-16) to (TEMP-33) include monovalent groups obtained by removing one hydrogen atom from NH or $CH_2$.

Substituted Heterocyclic Groups Including Nitrogen Atom (Specific Example Group G2B1):
(9-phenyl)carbazolyl group, (9-biphenyl)carbazolyl group, (9-phenyl)phenylcarbazolyl group, (9-naphthyl)carbazolyl group, diphenylcarbazol-9-yl group, phenylcarbazol-9-yl group, methylbenzimidazolyl group, ethylbenzimidazolyl group, phenyltriazinyl group, biphenyltriazinyl group, diphenyltriazinyl group, phenylquinazolinyl group, and biphenylquinazolinyl group.

Substituted Heterocyclic Groups Including Oxygen (Specific Example Group G2B2):
phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur (Specific Example Group G2B3):
phenyldibenzothiophenyl group, methyldibenzothiophenyl group, t-butyldibenzothiophenyl group, and monovalent residue of spiro[9H-thioxanthene-9,9'-[9H]fluorene].

Groups Derived by Substituting at Least One Hydrogen Atom of Monovalent
Heterocyclic Groups Derived from Cyclic Structures Represented by Formulae (TEMP-16) to (TEMP-33) with Substituent (Specific Example Group G2B4)

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom in the case where at least one of $X_A$ or $Y_A$ is NH, and a hydrogen atom of a methylene group in the case where one of $X_A$ or $Y_A$ is $CH_2$.

Substituted or Unsubstituted Alkyl Group

Specific examples (specific example group G3) of a "substituted or unsubstituted alkyl group" mentioned herein include unsubstituted alkyl groups (specific example group G3A) and substituted alkyl groups (specific example group G3B) below. (Here, an unsubstituted alkyl group refers to the case where a "substituted or unsubstituted alkyl group" is an "unsubstituted alkyl group", and a substituted alkyl group refers to the case where a "substituted or unsubstituted alkyl group" is a "substituted alkyl group".) Hereinafter, when simply referred to as an "alkyl group", it includes both an "unsubstituted alkyl group" and a "substituted alkyl group".

A "substituted alkyl group" means a group derived by substituting at least one hydrogen atom of an "unsubstituted alkyl group" with a substituent. Specific examples of the "substituted alkyl group" include groups derived by substituting at least one hydrogen atom of an "unsubstituted alkyl group" (specific example group G3A) below with a substituent and examples of the substituted alkyl group (specific example group G3B). Herein, the alkyl group of the "unsubstituted alkyl group" means a chain alkyl group. Therefore, the "unsubstituted alkyl group" includes a linear "unsubstituted alkyl group" and a branched "unsubstituted alkyl group". It should be noted that the examples of the "unsubstituted alkyl group" and the "substituted alkyl group" listed here are merely examples, and the "substituted alkyl group" mentioned herein also includes groups derived by further substituting a hydrogen atom of the alkyl group itself of a "substituted alkyl group" in the specific example group G3B with a substituent and groups derived by further substituting a hydrogen atom of the substituent of a "substituted alkyl group" in the specific example group G3B with a substituent.

Unsubstituted Alkyl Groups (Specific Example Group G3A):
methyl group, ethyl group, n-propyl group, isopropyl group, n-butyl group, isobutyl group, s-butyl group, and t-butyl group.

Substituted Alkyl Groups (Specific Example Group G3B):
heptafluoropropyl group (including isomers), pentafluoroethyl group, 2,2,2-trifluoroethyl group, and trifluoromethyl group.

Substituted or Unsubstituted Alkenyl Group

Specific examples (specific example group G4) of a "substituted or unsubstituted alkenyl group" mentioned herein include unsubstituted alkenyl groups (specific example group G4A) and substituted alkenyl groups (specific example group G4B) below. (Here, an unsubstituted alkenyl group refers to the case where a "substituted or unsubstituted alkenyl group" is an "unsubstituted alkenyl group", and a "substituted alkenyl group" refers to the case where a "substituted or unsubstituted alkenyl group" is a "substituted alkenyl group".) Herein, when simply referred to as an "alkenyl group", it includes both an "unsubstituted alkenyl group" and a "substituted alkenyl group".

A "substituted alkenyl group" means a group derived by substituting at least one hydrogen atom of an "unsubstituted alkenyl group" with a substituent. Specific examples of the "substituted alkenyl group" include groups derived by substituting an "unsubstituted alkenyl group" (specific example group G4A) below with a substituent and examples of the substituted alkenyl group (specific example group G4B). It should be noted that the examples of the "unsubstituted alkenyl group" and the "substituted alkenyl group" listed here are merely examples, and the "substituted alkenyl group" mentioned herein also includes groups derived by further substituting a hydrogen atom of the alkenyl group itself of a "substituted alkenyl group" in the specific example group G4B with a substituent and groups derived by further substituting a hydrogen atom of the substituent of a "substituted alkenyl group" in the specific example group G4B with a substituent.

Unsubstituted Alkenyl Groups (Specific Example Group G4A):
vinyl group, allyl group, 1-butenyl group, 2-butenyl group, and 3-butenyl group.

Substituted Alkenyl Groups (Specific Example Group G4B):
1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of a "substituted or unsubstituted alkynyl group" mentioned herein include unsubstituted alkynyl groups (specific example group G5A) below. (Here, an unsubstituted alkynyl group refers to the case where a "substituted or unsubstituted alkynyl group" is an "unsubstituted alkynyl group".) Hereinafter, when simply referred to as "alkynyl group", it includes both an "unsubstituted alkynyl group" and a "substituted alkynyl group".

A "substituted alkynyl group" means a group derived by substituting at least one hydrogen atom of an "unsubstituted alkynyl group" with a substituent. Specific examples of the "substituted alkynyl group" include groups derived by substituting at least one hydrogen atom of an "unsubstituted alkynyl group" (specific example group G5A) below with a substituent.

Unsubstituted Alkynyl Groups (Specific Example Group G5A):
ethynyl group

Substituted or Unsubstituted Cycloalkyl Group

Specific examples (specific example group G6) of a "substituted or unsubstituted cycloalkyl group" mentioned herein include unsubstituted cycloalkyl groups (specific example group G6A) and substituted cycloalkyl groups (specific example group G6B) below. (Here, an unsubstituted cycloalkyl group refers to the case where a "substituted or unsubstituted cycloalkyl group" is an "unsubstituted cycloalkyl group", and a substituted cycloalkyl group refers to the case where a "substituted or unsubstituted cycloalkyl group" is a "substituted cycloalkyl group".) Herein, when simply referred to as "cycloalkyl group", it includes both an "unsubstituted cycloalkyl group" and a "substituted cycloalkyl group".

A "substituted cycloalkyl group" means a group derived by substituting at least one hydrogen atom of an "unsubstituted cycloalkyl group" with a substituent. Specific examples of the "substituted cycloalkyl group" include groups derived by substituting at least one hydrogen atom of an "unsubstituted cycloalkyl group" (specific example group G6A) below with a substituent and examples of the substituted cycloalkyl group (specific example group G6B). It should be noted that the examples of the "unsubstituted cycloalkyl group" and the "substituted cycloalkyl group" listed here are merely examples, and the "substituted cycloalkyl group" mentioned herein also includes groups derived by substituting at least one hydrogen atom bonded to a carbon atom of the cycloalkyl group itself of a "substituted cycloalkyl group" in the specific example group G6B with a substituent and groups derived by further substituting a hydrogen atom of the substituent of a "substituted cycloalkyl group" in the specific example group G6B with a substituent.

Unsubstituted Cycloalkyl Groups (Specific Example Group G6A):
cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Groups (Specific Example Group G6B):
4-methylcyclohexyl group.

Group Represented by —Si($R_{901}$)($R_{902}$)($R_{903}$)

Specific examples (specific example group G7) of the group represented by —Si($R_{901}$)($R_{902}$)($R_{903}$) mentioned herein include —Si(G1)(G1)(G1), —Si(G1)(G2)(G2), —Si(G1)(G1)(G2), —Si(G2)(G2)(G2), —Si(G3)(G3)(G3), and —Si(G6)(G6)(G6). Here, G1 is a "substituted or unsubstituted aryl group" in the specific example group G1. G2 is a "substituted or unsubstituted heterocyclic group" in the specific example group G2. G3 is a "substituted or unsubstituted alkyl group" in the specific example group G3. G6 is a "substituted or unsubstituted cycloalkyl group" in the specific example group G6. A plurality of G1 in —Si(G1)(G1)(G1) are mutually the same or different. A plurality of G2 in —Si(G1)(G2)(G2) are mutually the same or different. A plurality of G1 in —Si(G1)(G1)(G2) are mutually the same or different. A plurality of G2 in —Si(G2)(G2)(G2) are mutually the same or different. A plurality of G3 in —Si(G3)(G3)(G3) are mutually the same or different. A plurality of G6 in —Si(G6)(G6)(G6) are mutually the same or different.

Group Represented by —O—($R_{904}$)

Specific examples (specific example group G8) of the group represented by —O—($R_{904}$) mentioned herein include —O(G1), —O(G2), —O(G3), and —O(G6).

Here, G1 is a "substituted or unsubstituted aryl group" in the specific example group G1. G2 is a "substituted or unsubstituted heterocyclic group" in the specific example group G2. G3 is a "substituted or unsubstituted alkyl group" in the specific example group G3. G6 is a "substituted or unsubstituted cycloalkyl group" in the specific example group G6.

Group Represented by —S—($R_{905}$)

Specific examples (specific example group G9) of the group represented by —S—($R_{905}$) mentioned herein include —S(G1), —S(G2), —S(G3), and —S(G6).

Here, G1 is a "substituted or unsubstituted aryl group" in the specific example group G1. G2 is a "substituted or unsubstituted heterocyclic group" in the specific example group G2. G3 is a "substituted or unsubstituted alkyl group" in the specific example group G3. G6 is a "substituted or unsubstituted cycloalkyl group" in the specific example group G6.

Group Represented by —N($R_{906}$)($R_{907}$)

Specific examples (specific example group G10) of the group represented by —N($R_{906}$)($R_{907}$) mentioned herein include —N(G1)(G1), —N(G2)(G2), —N(G1)(G2), —N(G3)(G3), and —N(G6)(G6).

Here, G1 is a "substituted or unsubstituted aryl group" in the specific example group G1. G2 is a "substituted or unsubstituted heterocyclic group" in the specific example group G2. G3 is a "substituted or unsubstituted alkyl group" in the specific example group G3. G6 is a "substituted or unsubstituted cycloalkyl group" in the specific example group G6. A plurality of G1 in —N(G1)(G1) are mutually the same or different. A plurality of G2 in —N(G2)(G2) are mutually the same or different. A plurality of G3 in —N(G3)(G3) are mutually the same or different. A plurality of G6 in —N(G6)(G6) are mutually the same or different.

Halogen Atom

Specific examples (specific example group G11) of a "halogen atom" mentioned herein include a fluorine atom, a chlorine atom, a bromine atom, and an iodine atom.

Substituted or Unsubstituted Fluoroalkyl Group

A "substituted or unsubstituted fluoroalkyl group" mentioned herein means a group derived by substituting at least one hydrogen atom bonded to a carbon atom constituting the alkyl group of a "substituted or unsubstituted alkyl group" with a fluorine atom, and also includes a group (perfluoro group) derived by substituting all hydrogen atoms bonded to carbon atoms constituting the alkyl group of a "substituted or unsubstituted alkyl group" with fluorine atoms. An "unsubstituted fluoroalkyl group" has 1 to 50, preferably 1 to 30, more preferably 1 to 18 carbon atoms, unless otherwise specified herein. A "substituted fluoroalkyl group" means a group derived by substituting at least one hydrogen atom of a "fluoroalkyl group" with a substituent. It should be noted that the "substituted fluoroalkyl group" mentioned herein also includes a group derived by further substituting at least one hydrogen atom bonded to a carbon atom of the alkyl chain of the "substituted fluoroalkyl group" with a substituent and a group derived by further substituting at least one hydrogen atom of the substituent of the "substituted fluoroalkyl group" with a substituent. Specific examples of the "unsubstituted fluoroalkyl group" include examples of groups derived by substituting at least one hydrogen atom of the above "alkyl group" (specific example group G3) with a fluorine atom.

Substituted or Unsubstituted Haloalkyl Group

A "substituted or unsubstituted haloalkyl group" mentioned herein means a group derived by substituting at least one hydrogen atom bonded to a carbon atom constituting the alkyl group of a "substituted or unsubstituted alkyl group" with a halogen atom, and also includes a group derived by substituting all hydrogen atoms bonded to carbon atoms constituting the alkyl group of a "substituted or unsubstituted alkyl group" with halogen atoms. An "unsubstituted haloalkyl group" has 1 to 50, preferably 1 to 30, more preferably 1 to 18 carbon atoms, unless otherwise specified herein. A "substituted haloalkyl group" means a group derived by substituting at least one hydrogen atom of a "haloalkyl group" with a substituent. It should be noted that the "substituted haloalkyl group" mentioned herein also includes a group derived by further substituting at least one hydrogen atom bonded to a carbon atom of the alkyl chain of the "substituted haloalkyl group" with a substituent and a group derived by further substituting at least one hydrogen atom of the substituent of the "substituted haloalkyl group" with a substituent. Specific examples of the "unsubstituted haloalkyl group" include examples of groups derived by substituting at least one hydrogen atom of the above "alkyl group" (specific example group G3) with a halogen atom. The haloalkyl group is also referred to as an alkyl halide group.

Substituted or Unsubstituted Alkoxy Group

Specific examples of a "substituted or unsubstituted alkoxy group" mentioned herein include groups represented by —O(G3), where G3 is a "substituted or unsubstituted alkyl group" in the specific example group G3. An "unsubstituted alkoxy group" has 1 to 50, preferably 1 to 30, more preferably 1 to 18 carbon atoms, unless otherwise specified herein.

Substituted or Unsubstituted Alkylthio Group

Specific examples of a "substituted or unsubstituted alkylthio group" mentioned herein include groups represented by —S(G3), where G3 is a "substituted or unsubstituted alkyl group" in the specific example group G3. An "unsubstituted alkylthio group" has 1 to 50, preferably 1 to 30, more preferably 1 to 18 carbon atoms, unless otherwise specified herein.

Substituted or Unsubstituted Aryloxy Group

Specific examples of a "substituted or unsubstituted aryloxy group" mentioned herein include groups represented by —O(G1), where G1 is a "substituted or unsubstituted aryl group" in the specific example group G1. An "unsubstituted aryloxy group" has 6 to 50, preferably 6 to 30, more preferably 6 to 18 ring carbon atoms, unless otherwise specified herein.

Substituted or Unsubstituted Arylthio Group

Specific examples of a "substituted or unsubstituted arylthio group" mentioned herein include groups represented by —S(G1), where G1 is a "substituted or unsubstituted aryl group" in the specific example group G1. An "unsubstituted arylthio group" has 6 to 50, preferably 6 to 30, more preferably 6 to 18 ring carbon atoms, unless otherwise specified herein.

Substituted or Unsubstituted Trialkylsilyl Group

Specific examples of a "trialkylsilyl group" mentioned herein include groups represented by —Si(G3)(G3)(G3), where G3 is a "substituted or unsubstituted alkyl group" in the specific example group G3. The plurality of G3 in —Si(G3)(G3)(G3) are mutually the same or different. The alkyl groups of the "trialkylsilyl group" each have 1 to 50, preferably 1 to 20, more preferably 1 to 6 carbon atoms, unless otherwise specified herein.

Substituted or Unsubstituted Aralkyl Group

Specific examples of a "substituted or unsubstituted aralkyl group" mentioned herein include groups represented by -(G3)-(G1), where G3 is a "substituted or unsubstituted alkyl group" in the specific example group G3, and G1 is a "substituted or unsubstituted aryl group" in the specific example group G1. Therefore, an "aralkyl group" is a group derived by substituting a hydrogen atom of an "alkyl group" with a substituent "aryl group", which is an example of the "substituted alkyl group". An "unsubstituted aralkyl group" is an "unsubstituted alkyl group" substituted with an "unsubstituted aryl group", and the "unsubstituted aralkyl group" has 7 to 50, preferably 7 to 30, more preferably 7 to 18 carbon atoms, unless otherwise specified herein.

Specific examples of a "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, and a 2-β-naphthylisopropyl group.

The substituted or unsubstituted aryl group mentioned herein is preferably, for example, a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-a spirobifluorenyl group, a 9,9-dimethylfluorenyl group, or a 9,9-diphenylfluorenyl group, unless otherwise specified herein.

The substituted or unsubstituted heterocyclic group mentioned herein is preferably, for example, a pyridyl group, a pyrimidinyl group, a triazinyl group, a quinolyl group, an isoquinolyl group, a quinazolinyl group, a benzimidazolyl group, a phenanthrolinyl group, a carbazolyl group (1-carbazolyl group, 2-carbazolyl group, 3-carbazolyl group, 4-carbazolyl group, or 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group ((9-phenyl) carbazol-1-yl group, (9-phenyl)carbazol-2-yl group, (9-phenyl)carbazol-3-yl group, or (9-phenyl)carbazol-4-yl group), a (9-biphenyl)carbazolyl group, a (9-phenyl)phenylcarbazolyl group, a diphenylcarbazol-9-yl group, a phenylcarbazol-9-yl group, a phenyltriazinyl group, a biphenyltriazinyl group, a diphenyltriazinyl group, a phenyldibenzofuranyl group, or a phenyldibenzothiophenyl group, unless otherwise specified herein.

Herein, the carbazolyl group is specifically any one of the following groups, unless otherwise specified herein.

[Formula 49]

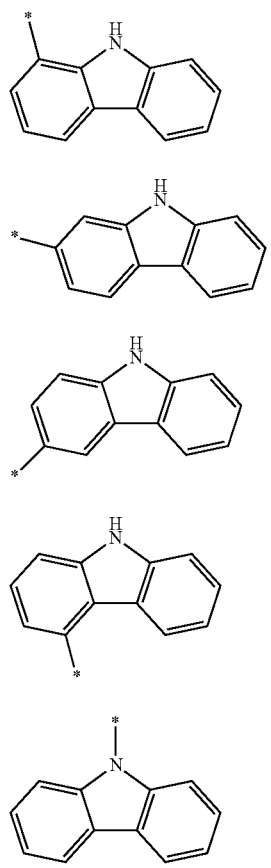

(TEMP-Cz1)

(TEMP-Cz2)

(TEMP-Cz3)

(TEMP-Cz4)

(TEMP-Cz5)

Herein, the (9-phenyl)carbazolyl group is specifically any one of the following groups, unless otherwise specified herein.

[Formula 50]

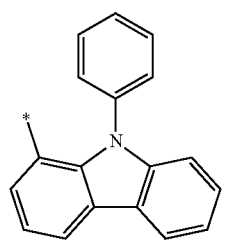

(TEMP-Cz6)

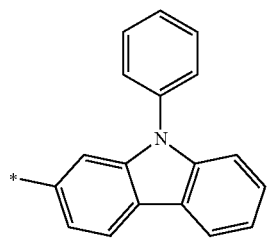

(TEMP-Cz7)

(TEMP-Cz8)

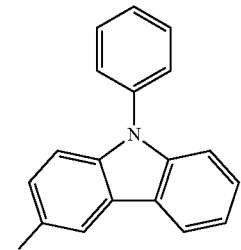

(TEMP-Cz9)

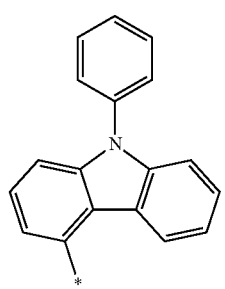

In the formulae (TEMP-Cz1) to (TEMP-Cz9), * represents a bonding position.

Herein, the dibenzofuranyl group and the dibenzothiophenyl group are each specifically any one of the following groups, unless otherwise specified herein.

[Formula 51]

(TEMP-34)

(TEMP-35)

(TEMP-36)

(TEMP-37)

-continued (TEMP-38)
(TEMP-39)
(TEMP-40)
(TEMP-41)

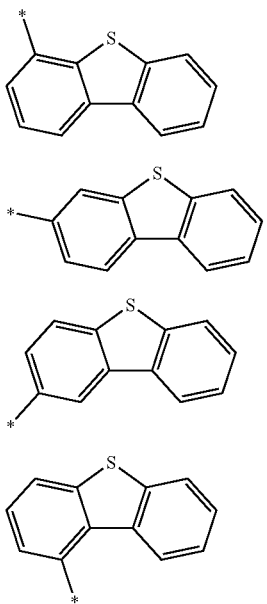

In the formulae (TEMP-34) to (TEMP-41), * represents a bonding position.

The substituted or unsubstituted alkyl group mentioned herein is preferably, for example, a methyl group, an ethyl group, a propyl group, an isopropyl group, a n-butyl group, an isobutyl group, or a t-butyl group, unless otherwise specified herein.

Substituted or Unsubstituted Arylene Group

A "substituted or unsubstituted arylene group" mentioned herein is a divalent group derived by removing one hydrogen atom on an aryl ring from the above "substituted or unsubstituted aryl group", unless otherwise specified. Specific examples (specific example group G12) of the "substituted or unsubstituted arylene group" include divalent groups derived by removing one hydrogen atom on an aryl ring from a "substituted or unsubstituted aryl group" in the specific example group G1.

Substituted or Unsubstituted Divalent Heterocyclic Group

A "substituted or unsubstituted divalent heterocyclic group" mentioned herein is a divalent group derived by removing one hydrogen atom on a heterocycle from the above "substituted or unsubstituted heterocyclic group", unless otherwise specified. Specific examples (specific example group G13) of the "substituted or unsubstituted divalent heterocyclic group" include divalent groups derived by removing one hydrogen atom on a heterocycle from a "substituted or unsubstituted heterocyclic group" in the specific example group G2.

Substituted or Unsubstituted Alkylene Group

A "substituted or unsubstituted alkylene group" mentioned herein is a divalent group derived by removing one hydrogen atom on an alkyl chain from the above "substituted or unsubstituted alkyl group", unless otherwise specified. Specific examples (specific example group G14) of the "substituted or unsubstituted alkylene group" include divalent groups derived by removing one hydrogen atom on an alkyl chain from a "substituted or unsubstituted alkyl group" in the specific example group G3.

The substituted or unsubstituted arylene group mentioned herein is preferably any one of the groups represented by formulae (TEMP-42) to (TEMP-68) below, unless otherwise specified herein.

[Formula 52]

(TEMP-42)
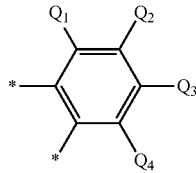

(TEMP-43)
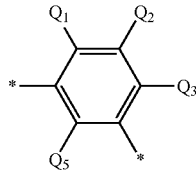

(TEMP-44)
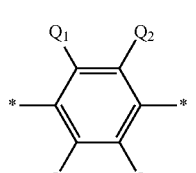

(TEMP-45)
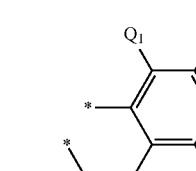

(TEMP-46)
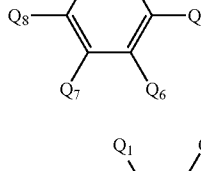

(TEMP-47)
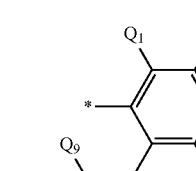

[Formula 53]
(TEMP-48)
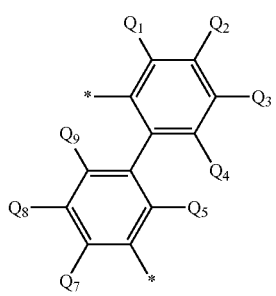
(TEMP-49)
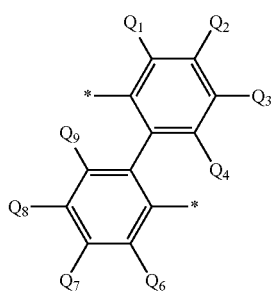
(TEMP-50)
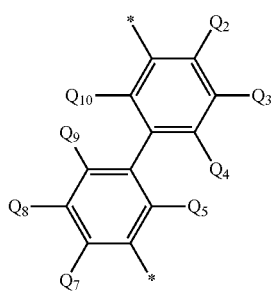
(TEMP-51)
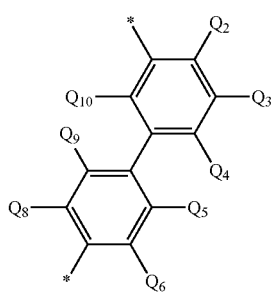
(TEMP-52)
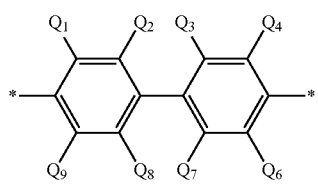
[Formula 54]
(TEMP-53)
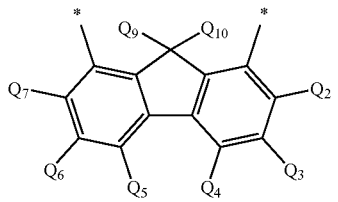
(TEMP-54)
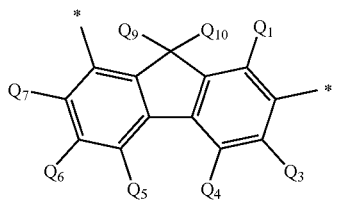
(TEMP-55)
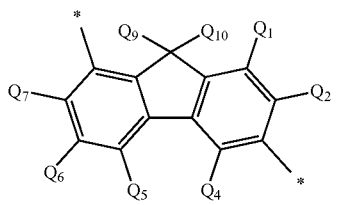
(TEMP-56)
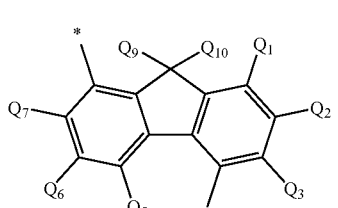
(TEMP-57)
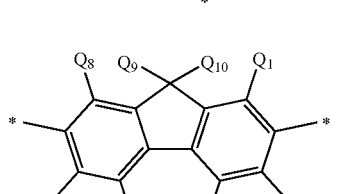
(TEMP-58)
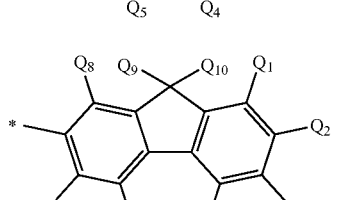
(TEMP-59)
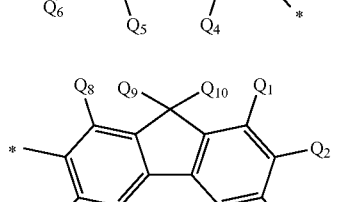
In the formulae (TEMP-42) to (TEMP-52), $Q_1$ to $Q_{10}$ are each independently a hydrogen atom or a substituent.
In the formulae (TEMP-42) to (TEMP-52), * represents a bonding position.

-continued

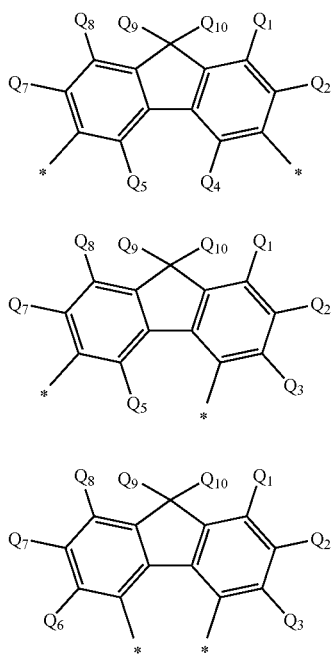

(TEMP-60)

(TEMP-61)

(TEMP-62)

In the formulae (TEMP-53) to (TEMP-62), $Q_1$ to $Q_{10}$ are each independently a hydrogen atom or a substituent.

$Q_9$ and $Q_{10}$ may be mutually bonded through a single bond to form a ring.

In the formulae (TEMP-53) to (TEMP-62), * represents a bonding position.

[Formula 55]

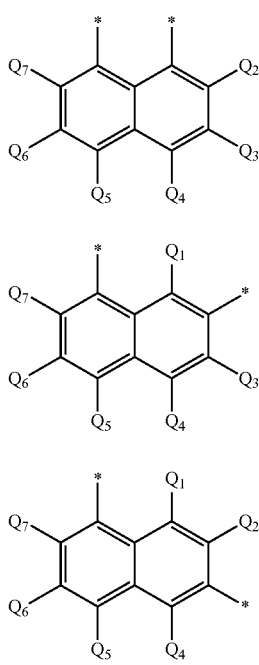

(TEMP-63)

(TEMP-64)

(TEMP-65)

-continued

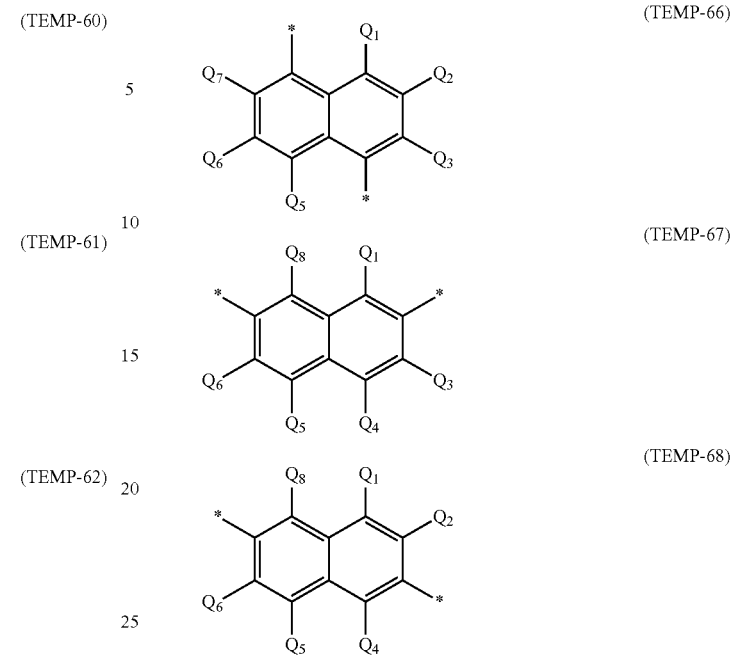

(TEMP-66)

(TEMP-67)

(TEMP-68)

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is preferably any one of the groups represented by formulae (TEMP-69) to (TEMP-102) below, unless otherwise specified herein.

[Formula 56]

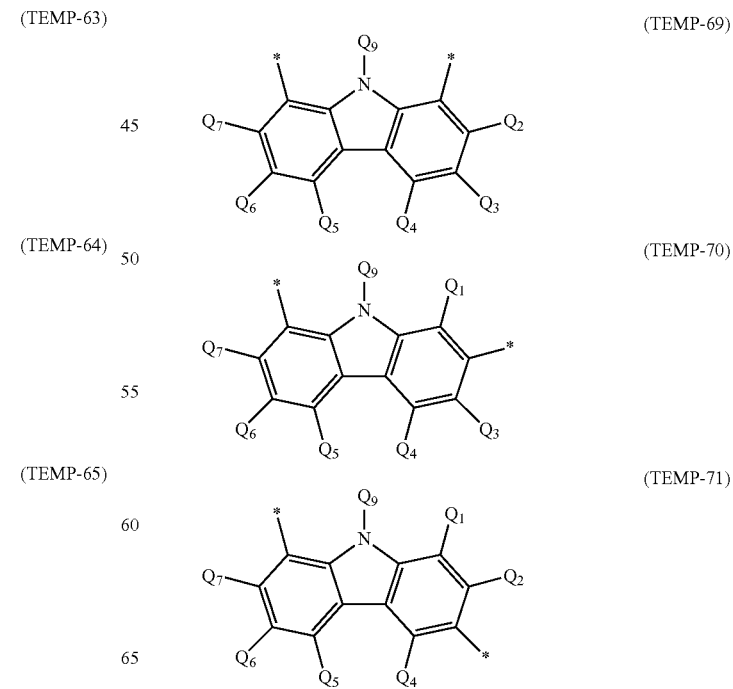

(TEMP-69)

(TEMP-70)

(TEMP-71)

(TEMP-72)
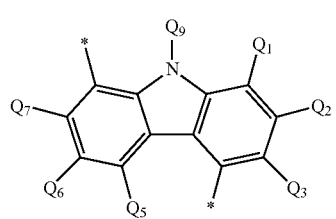
(TEMP-73)
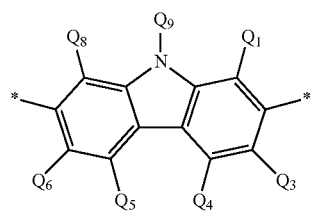
[Formula 57]
(TEMP-74)
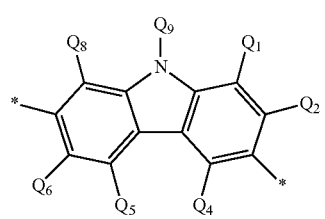
(TEMP-75)
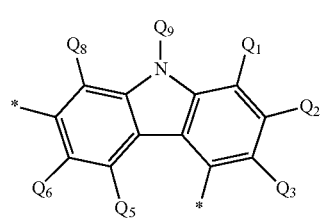
(TEMP-76)
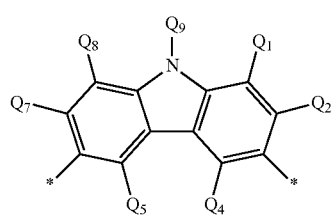
(TEMP-77)
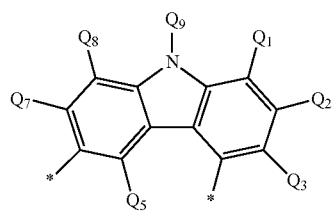
(TEMP-78)
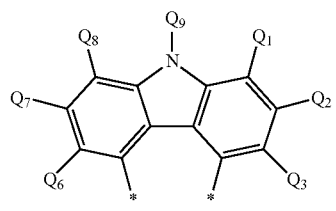
(TEMP-79)
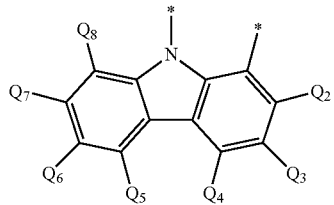
(TEMP-80)
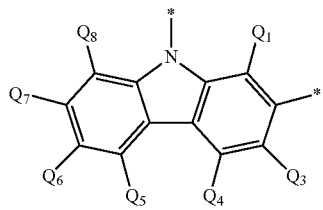
[Formula 58]
(TEMP-81)
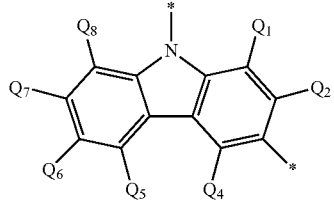
(TEMP-82)
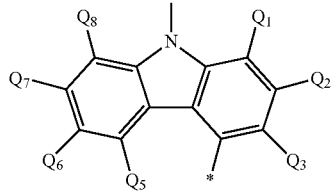
In the formulae (TEMP-69) to (TEMP-82), $Q_1$ to $Q_9$ are each independently a hydrogen atom or a substituent.
[Formula 59]
(TEMP-83)
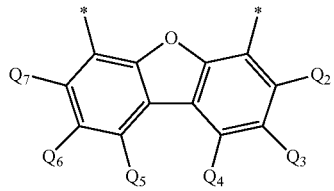
(TEMP-84)
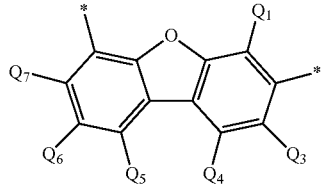

[Formula 60]
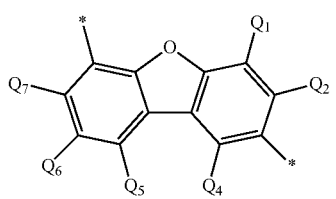
(TEMP-85)
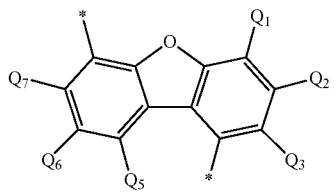
(TEMP-86)
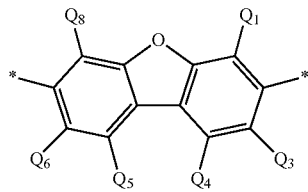
(TEMP-87)
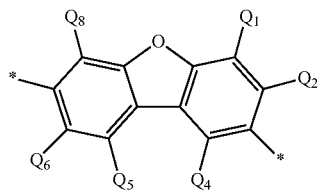
(TEMP-88)
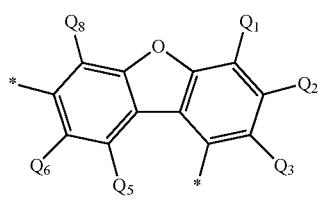
(TEMP-89)
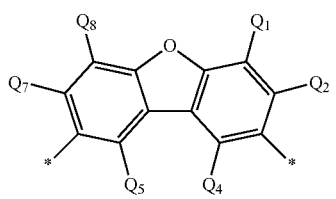
(TEMP-90)
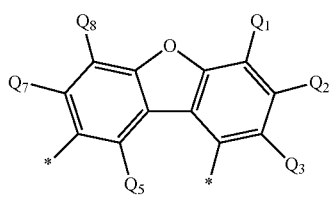
(TEMP-91)
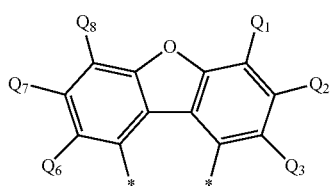
(TEMP-92)
[Formula 61]
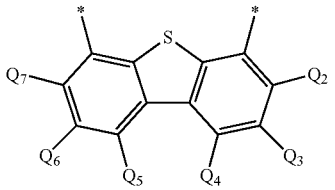
(TEMP-93)
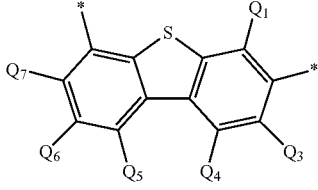
(TEMP-94)
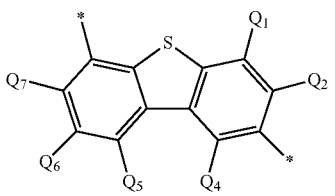
(TEMP-95)
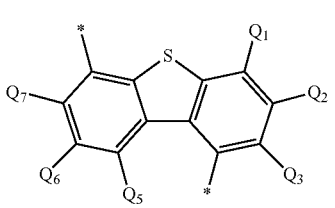
(TEMP-96)
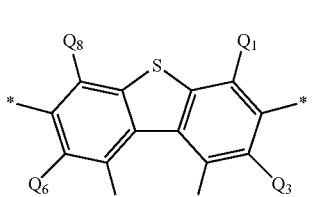
(TEMP-97)
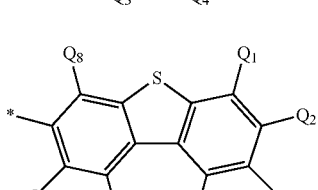
(TEMP-98)
[Formula 62]
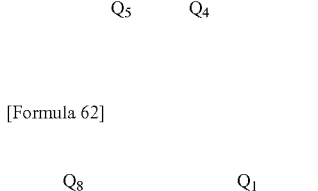
(TEMP-99)
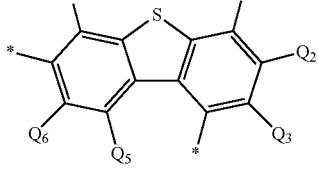

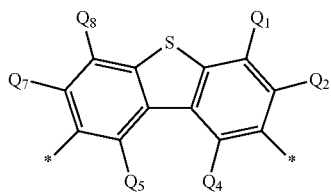
(TEMP-100)

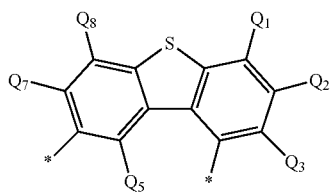
(TEMP-101)

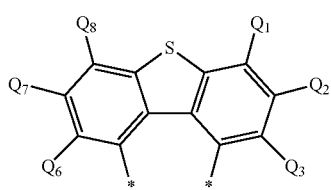
(TEMP-102)

In the formulae (TEMP-83) to (TEMP-102), $Q_1$ to $Q_8$ are each independently a hydrogen atom or a substituent.

The above is the description of "Substituents Mentioned Herein".

Case of being Bonded to Form Ring

Herein, a case where "at least one combination of adjacent two or more are bonded to each other to form a substituted or unsubstituted monocyclic ring, bonded to each other to form a substituted or unsubstituted fused ring, or not bonded to each other" refers to a case where "at least one combination of adjacent two or more are bonded to each other to form a substituted or unsubstituted monocyclic ring", "at least one combination of adjacent two or more are bonded to each other to form a substituted or unsubstituted fused ring", or "at least one combination of adjacent two or more are not bonded to each other".

Cases where "at least one combination of adjacent two or more are bonded to each other to form a substituted or unsubstituted monocyclic ring" and "at least one combination of adjacent two or more are bonded to each other to form a substituted or unsubstituted fused ring" (hereinafter these cases may be collectively referred to as a "case of being bonded to form a ring") herein will be described below. The description will be made using, as an example, an anthracene compound having an anthracene ring as a basic skeleton and represented by a formula (TEMP-103) below.

[Formula 63]

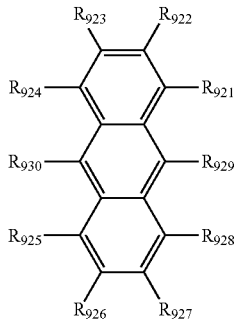
(TEMP-103)

For example, in the case where "at least one combination of adjacent two or more" of $R_{921}$ to $R_{930}$ "are bonded to each other to form a ring", the combination of adjacent two is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The "at least one combination" means that two or more of the above combinations of adjacent two or more may simultaneously form rings. For example, when $R_{921}$ and $R_{922}$ are bonded to each other to form a ring $Q_A$ and simultaneously $R_{925}$ and $R_{926}$ are bonded to each other to form a ring $Q_B$, the anthracene compound represented by the formula (TEMP-103) is represented by a formula (TEMP-104) below.

[Formula 64]

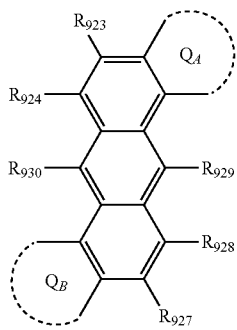
(TEMP-104)

The case where a "combination of adjacent two or more" form a ring includes not only a case where a combination of adjacent "two" are bonded, as in the above example, but also a case where a combination of adjacent "three or more" are bonded, which means, for example, a case where $R_{921}$ and $R_{922}$ are bonded to each other to form a ring $Q_A$, $R_{922}$ and $R_{923}$ are bonded to each other to form a ring $Q_C$, and a combination of the mutually adjacent three ($R_{921}$, $R_{922}$, and $R_{923}$) are bonded to each other to form a ring fused to the anthracene basic skeleton. In this case, the anthracene compound represented by the formula (TEMP-103) is represented by a formula (TEMP-105) below. In the formula (TEMP-105), the ring $Q_A$ and ring $Q_C$ share $R_{922}$.

[Formula 65]

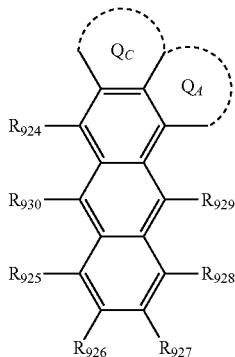

(TEMP-105)

The formed "monocyclic ring" or "fused ring" may be a saturated ring or an unsaturated ring in terms of the structure of the formed ring alone. When "one combination of adjacent two" form a "monocyclic ring" or a "fused ring", the "monocyclic ring" or the "fused ring" may be a saturated ring or an unsaturated ring. For example, the ring $Q_A$ and the ring $Q_B$ formed in the formula (TEMP-104) are each a "monocyclic ring" or a "fused ring". The ring $Q_A$ and the ring $Q_C$ formed in the formula (TEMP-105) form a "fused ring". The ring $Q_A$ and the ring $Q_C$ in the formula (TEMP-105) are fused to each other to form the fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

An "unsaturated ring" means an aromatic hydrocarbon ring or an aromatic heterocycle. A "saturated ring" means an aliphatic hydrocarbon ring or a non-aromatic heterocycle.

Specific examples of the aromatic hydrocarbon ring include structures formed by terminating groups listed as specific examples in the specific example group G1 with a hydrogen atom.

Specific examples of the aromatic heterocycle include structures formed by terminating aromatic heterocyclic groups listed as specific examples in the specific example group G2 with a hydrogen atom.

Specific examples of the aliphatic hydrocarbon ring include structures formed by terminating groups listed as specific examples in the specific example group G6 with a hydrogen atom.

The phrase "to form a ring" means that a ring is formed only by a plurality of atoms of a basic skeleton, or by the plurality of atoms of the basic skeleton and one or more optional elements. For example, the ring $Q_A$ formed as a result of bonding of $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional elements. Specifically, for example, in the case where the ring $Q_A$ is formed by $R_{921}$ and $R_{922}$, when a monocyclic unsaturated ring is formed by a carbon atom of the anthracene skeleton bonded to $R_{921}$, a carbon atom of the anthracene skeleton bonded to $R_{922}$, and four carbon atoms, the ring formed by $R_{921}$ and $R_{922}$ is a benzene ring.

Here, the "optional element" is preferably at least one element selected from the group consisting of carbon, nitrogen, oxygen, and sulfur, unless otherwise specified herein. A bond of the optional element (e.g., carbon or nitrogen) not forming a ring may be terminated with a hydrogen atom or the like or may be substituted with an "optional substituent" described later. When an optional element other than carbon is included, the formed ring is a heterocycle.

The number of "one or more optional elements" constituting the monocyclic ring or the fused ring is preferably in a range from 2 to 15, more preferably in a range from 3 to 12, further preferably in a range from 3 to 5, unless otherwise specified herein.

Unless otherwise specified herein, the ring, which may be a "monocyclic ring" or a "fused ring", is preferably a "monocyclic ring".

Unless otherwise specified herein, the ring, which may be a "saturated ring" or an "unsaturated ring", is preferably an "unsaturated ring".

Unless otherwise specified herein, the "monocyclic ring" is preferably a benzene ring.

Unless otherwise specified herein, the "unsaturated ring" is preferably a benzene ring.

When "at least one combination of adjacent two or more" are "bonded to each other to form a substituted or unsubstituted monocyclic ring" or "bonded to each other to form a substituted or unsubstituted fused ring", the at least one combination of adjacent two or more are preferably bonded to each other to form a substituted or unsubstituted "unsaturated ring" constituted by a plurality of atoms of the basic skeleton and 1 to 15 atoms of at least one element selected from the group consisting of carbon, nitrogen, oxygen, and sulfur, unless otherwise specified herein.

When the above "monocyclic ring" or "fused ring" has a substituent, the substituent is, for example, an "optional substituent" described later. When the above "monocyclic ring" or "fused ring" has a substituent, specific examples of the substituent are substituents described in the section "Substituents Mentioned Herein" above.

When the above "saturated ring" or "unsaturated ring" has a substituent, the substituent is, for example, an "optional substituent" described later. When the above "monocyclic ring" or "fused ring" has a substituent, specific examples of the substituent are substituents described in the section "Substituents Mentioned Herein" above.

The above is the description of the case where "at least one combination of adjacent two or more are bonded to each other to form a substituted or unsubstituted monocyclic ring" and the case where "at least one combination of adjacent two or more are bonded to each other to form a substituted or unsubstituted fused ring" ("the case of being bonded to form a ring").

Substituent for "Substituted or Unsubstituted Group"

In an exemplary embodiment herein, a substituent for the above "substituted or unsubstituted group" (hereinafter also referred to as an "optional substituent") is, for example, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms.

Here, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, a substituent for the above "substituted or unsubstituted group" is a group selected from the group consisting of an alkyl group having 1 to 50 carbon atoms, an aryl group having 6 to 50 ring carbon atoms, and a heterocyclic group having 5 to 50 ring atoms.

In an exemplary embodiment, a substituent for the above "substituted or unsubstituted group" is a group selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituents described in the section "Substituents Mentioned Herein" above.

Unless otherwise specified herein, any adjacent substituents may together form a "saturated ring" or an "unsaturated ring", preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further has a substituent. Examples of the further substituent for the optional substituent are the same as the examples of the optional substituent.

Herein, numerical ranges expressed as "AA to BB" represent ranges including the value AA given before "to" as the lower limit and the value BB given after "to" as the upper limit.

Modification of Exemplary Embodiments

It should be noted that the scope of the invention is not limited by the above-described exemplary embodiments, and any modification and improvement are included in the scope of the invention as long as the object of the invention can be achieved.

Specific structures, shapes, and the like in the practice of the invention may be other structures as long as the object of the invention can be achieved.

EXAMPLES

The present invention will now be described in more detail with reference to Examples. It should be noted that the invention is not limited to these Examples.

Compound

The structure of a compound represented by the formula (1) used to produce organic EL display devices according to Example 1 and Comparative Examples 1 and 2 is shown below.

[Formula 66]

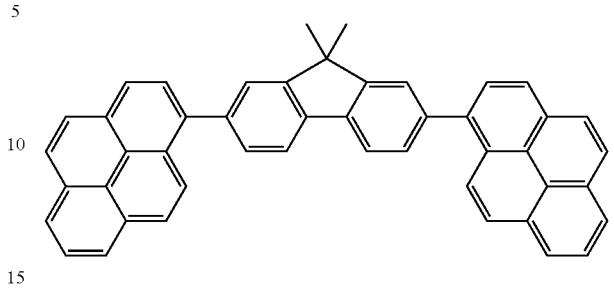

BH1

The structure of a compound represented by the formula (1X) used to produce organic EL display devices according to Example 2 and Comparative Example 3 is shown below.

[Formula 67]

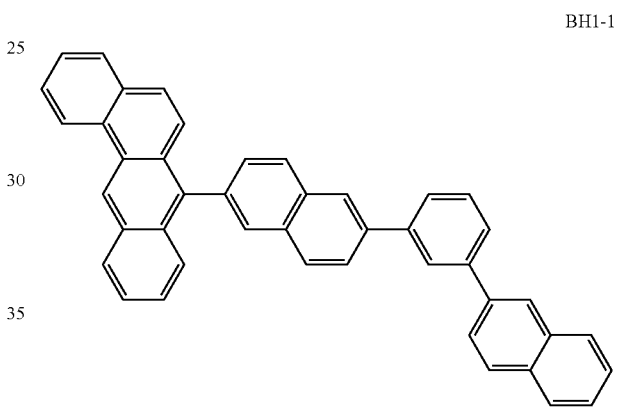

BH1-1

The structure of a compound represented by the formula (14X) used to produce organic EL display devices according to Example 3 and Comparative Example 4 is shown below.

[Formula 68]

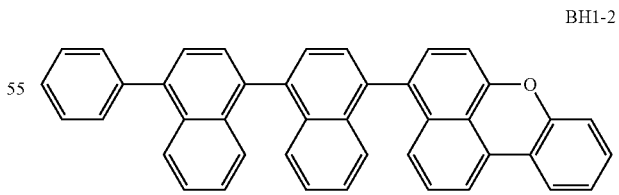

BH1-2

The structure of a compound represented by the formula (2) used to produce organic EL display devices according to Examples 1 to 3 and Comparative Examples 1 to 4 is shown below.

[Formula 69]
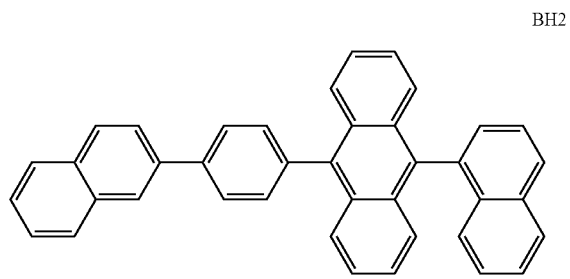
BH2
The structures of other compounds used to produce organic EL display devices according to Examples 1 to 3 and Comparative Examples 1 to 4 are shown below.
[Formula 70]
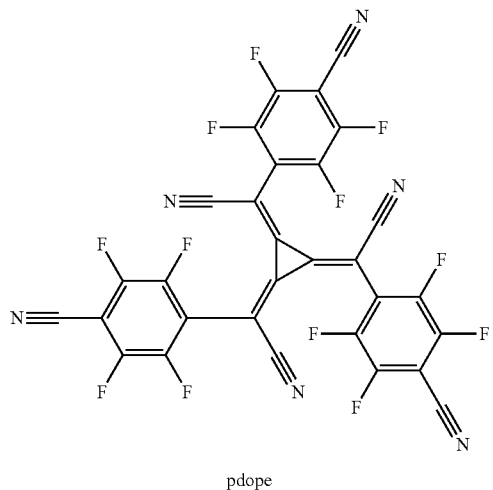
pdope
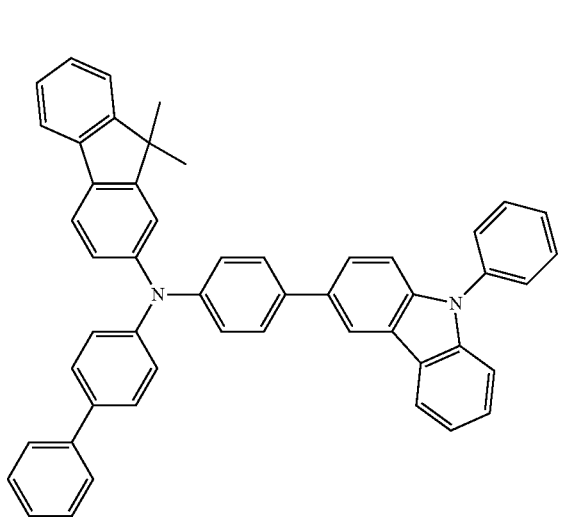
HT1
[Formula 71]
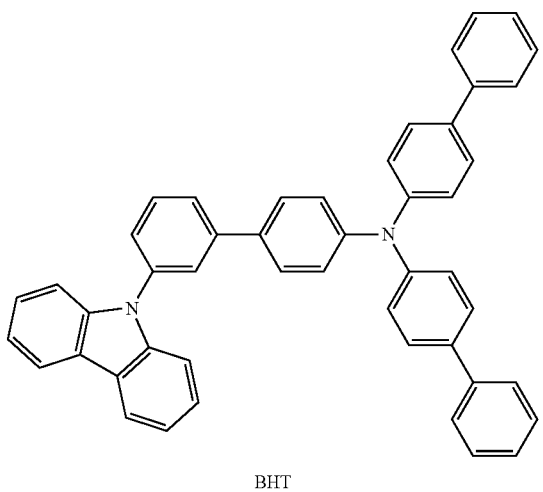
BHT
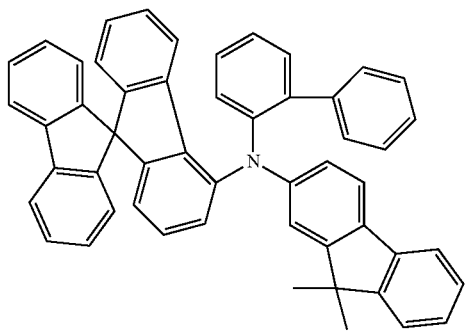
GHT
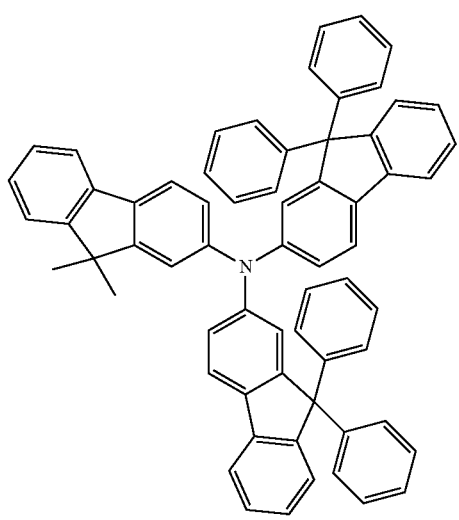
RHT

[Formula 72]
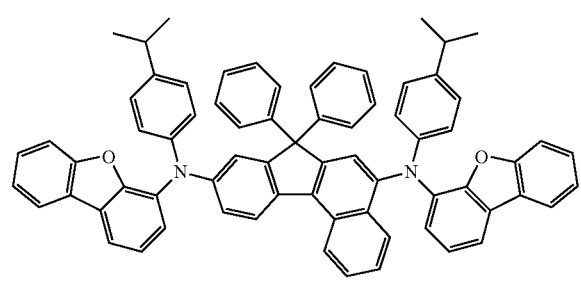
BD
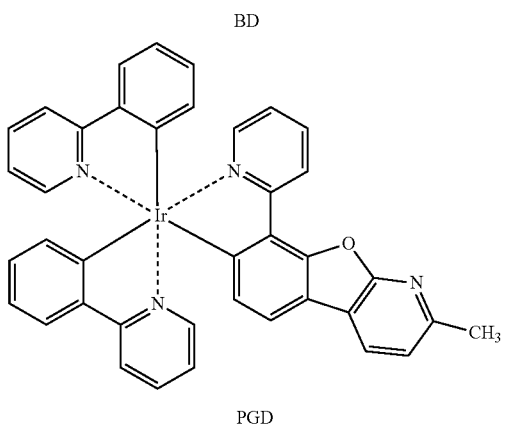
PGD
[Formula 73]
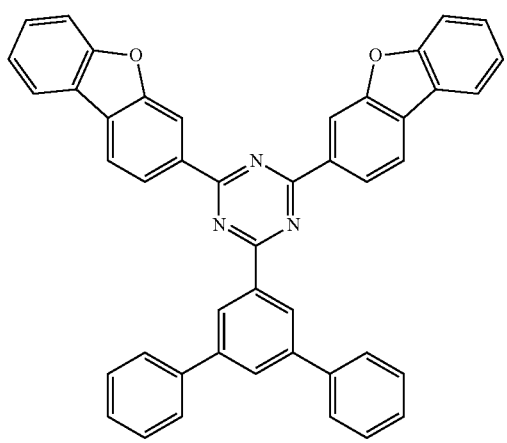
ePGH
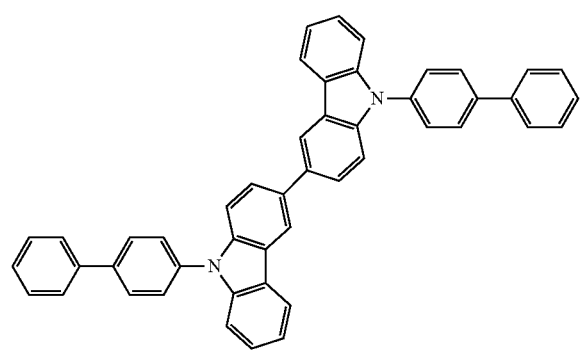
hPGH
[Formula 74]
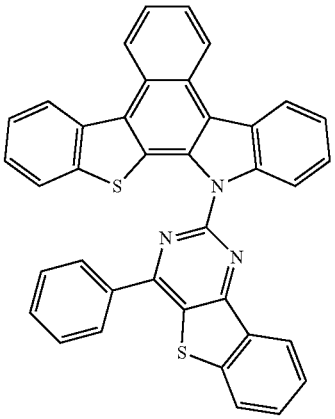
PRH
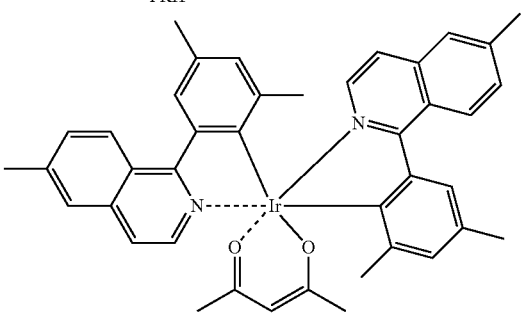
PRD
[Formula 75]
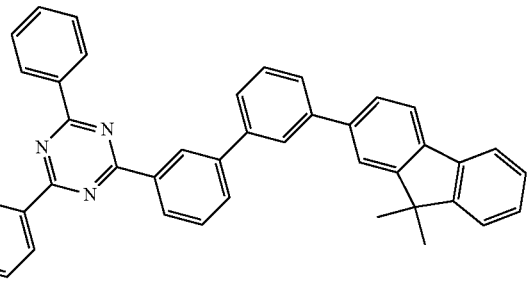
ET1
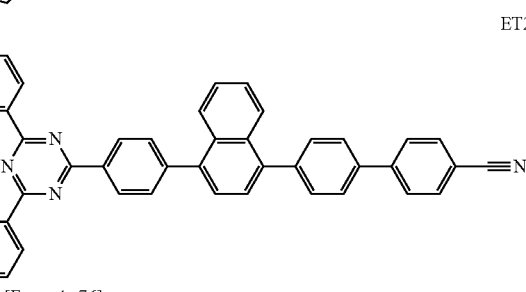
ET2
[Formula 76]
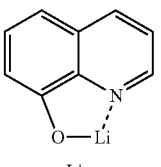
Liq Production of Organic EL Display Device The organic EL display devices were produced and evaluated as described below.

Example 1

Production of Blue Organic EL Device Serving as Blue Pixel

A 25 mm×75 mm×1.1 mm (thickness) glass substrate (manufactured by Geomatec Co., Ltd.) having an ITO (indium tin oxide) transparent electrode (anode) was ultrasonic-cleaned in isopropyl alcohol for five minutes and then UV-ozone cleaned for 30 minutes. The film thickness of the ITO transparent electrode was 130 nm.

The cleaned glass substrate having a transparent electrode line was mounted to a substrate holder of a vacuum deposition apparatus, and Compound HT1 and Compound pdope were co-deposited first on a surface on which the transparent electrode line was formed so as to cover the transparent electrode, thereby forming a hole injecting layer having a film thickness of 10 nm. In the hole injecting layer, the ratio of Compound HT1 was 97 mass %, and the ratio of Compound pdope was 3 mass %.

Subsequently to the formation of the hole injecting layer, Compound HT1 was deposited to form a fourth hole transporting layer having a film thickness of 80 nm.

Subsequently to the formation of the fourth hole transporting layer, Compound BHT was deposited to form a first hole transporting layer having a film thickness of 10 nm.

Compound BH1 (host material) and Compound BD (dopant material) were co-deposited on the first hole transporting layer such that the ratio of Compound BD was 4 mass %, thereby forming a first emitting layer having a film thickness of 5 nm.

Compound BH2 (host material) and Compound BD (dopant material) were co-deposited on the first emitting layer such that the ratio of Compound BD was 4 mass %, thereby forming a fourth emitting layer having a film thickness of 20 nm.

Compound ET1 was deposited on the fourth emitting layer to form a first electron transporting layer (also referred to as a hole blocking layer, HBL) having a film thickness of 5 nm.

Compound ET2 and Compound Liq were co-deposited on the first electron transporting layer to form a second electron transporting layer (ET) having a film thickness of 25 nm. In the second electron transporting layer, the ratio of Compound ET2 was 70 mass %, and the ratio of Compound Liq was 30 mass %. Liq is the abbreviation of (8-quinolinolato) lithium.

Yb (ytterbium) was deposited on the second electron transporting layer to form an electron injecting layer having a film thickness of 1 nm.

Metallic Al was deposited on the electron injecting layer to form a cathode having a film thickness of 80 nm.

The structure of the blue organic EL device of Example 1 can be abbreviatedly shown as follows.
ITO (130)/HT1:pdope (10, 97%:3%)/HT1 (80)/BHT (10)/BH1:BD (5, 96%:4%)/BH2:BD (20, 96%:4%)/ET1 (5)/ET2:Liq (25, 70%:30%)/Yb (1)/Al (80)

Numerals in parentheses each represent a film thickness (unit: nm).

Likewise, the numeral (97%:3%) expressed in percentage in parenthesis indicates the ratio (mass %) of Compound HT1 to Compound pdope in the hole injecting layer, the numeral (96%:4%) expressed in percentage in parenthesis indicates the ratio (mass %) of the host material (Compound BH1 or BH2) to the dopant material (Compound BD) in the first emitting layer or the second emitting layer, and the numeral (70%:30%) expressed in percentage in parenthesis indicates the ratio (mass %) of Compound ET2 to Compound Liq in the second electron transporting layer. The same shall apply hereinafter.

Production of Green Organic EL Device Serving as Green Pixel

In the production of a green organic EL device according to Example 1, an ITO film on a glass substrate, a hole injecting layer, a fourth hole transporting layer, a fourth emitting layer, a first electron transporting layer, a second electron transporting layer, an electron injecting layer, and a cathode were formed in the same manner as in the production of the blue organic EL device since they were common layers in the organic EL display device according to Example 1.

A second hole transporting layer and a second emitting layer as non-common layers were formed in the following manner.

Compound GHT was deposited on the fourth hole transporting layer to form a second hole transporting layer having a film thickness of 35 nm.

Compound ePGH (host material), Compound hPGH, and Compound PGD (dopant material) were co-deposited on the second hole transporting layer to form a second emitting layer having a film thickness of 40 nm. The co-deposition was performed such that the ratio of Compound ePGH was 47.5 mass %, the ratio of Compound hPGH was 47.5 mass %, and the ratio of Compound PGD was 5 mass % in the second emitting layer.

A fourth emitting layer as a common layer was formed on the second emitting layer.

The structure of the green organic EL device of Example 1 can be abbreviatedly shown as follows.
ITO (130)/HT1:pdope (10, 97%:3%)/HT1 (80)/GHT (35)/ePGH:hPGH:PGD (40, 47.5%:47.5%:5%)/BH2:BD (20, 96%:4%)/ET1 (5)/ET2: Liq (25, 70%:30%)/Yb (1)/Al (80)

Production of Red Organic EL Device Serving as Red Pixel

In the production of a red organic EL device according to Example 1, an ITO film on a glass substrate, a hole injecting layer, a fourth hole transporting layer, a fourth emitting layer, a first electron transporting layer, a second electron transporting layer, an electron injecting layer, and a cathode were formed in the same manner as in the production of the blue organic EL device since they were common layers in the organic EL display device according to Example 1.

A third hole transporting layer and a third emitting layer as non-common layers were formed in the following manner.

Compound RHT was deposited on the fourth hole transporting layer to form a third hole transporting layer having a film thickness of 70 nm.

Compound PRH (host material) and Compound PRD (dopant material) were co-deposited on the third hole transporting layer to form a third emitting layer having a film thickness of 40 nm. The co-deposition was performed such that the ratio of Compound PRH was 98 mass % and the ratio of Compound PRD was 2 mass % in the third emitting layer.

A fourth emitting layer as a common layer was formed on the third emitting layer.

The structure of the red organic EL device of Example 1 can be abbreviatedly shown as follows.
ITO (130)/HT1:pdope (10, 97%:3%)/HT1 (80)/RHT (70)/PRH:PRD (40, 98%:2%)/BH2:BD (20, 96%:4%)/ET1 (5)/ET2:Liq (25, 70%:30%)/Yb (1)/Al (80)

Example 2

An organic EL display device according to Example 2 was produced in the same manner as the organic EL display device according to Example 1 except that Compound BH1 (host material) in the first emitting layer was replaced with Compound BH1-1 in producing the blue organic EL device serving as a blue pixel.

Example 3

An organic EL display device according to Example 3 was produced in the same manner as the organic EL display device according to Example 1 except that Compound BH1 (host material) in the first emitting layer was replaced with Compound BH1-2 in producing the blue organic EL device serving as a blue pixel.

Comparative Example 1

An organic EL display device according to Comparative Example 1 was produced in the following manner.

A blue organic EL device according to Comparative Example 1 was produced in the same manner as in Example 1 except that the fourth emitting layer was directly formed on the first hole transporting layer without forming the first emitting layer and the film thickness of the fourth emitting layer was changed to 25 nm.

A green organic EL device according to Comparative Example 1 was produced in the same manner as in Example 1 except that the first electron transporting layer was formed on the second emitting layer without forming the fourth emitting layer as a common layer.

A red organic EL device according to Comparative Example 1 was produced in the same manner as in Example 1 except that the first electron transporting layer was formed on the third emitting layer without forming the fourth emitting layer as a common layer.

Comparative Example 2

An organic EL display device according to Comparative Example 2 was produced in the following manner.

A blue organic EL device according to Comparative Example 2 was produced in the same manner as in Example 1 except that the fourth emitting layer was formed on the first emitting layer not as a common layer but as a non-common layer.

A green organic EL device according to Comparative Example 2 was produced in the same manner as in Example 1 except that the first electron transporting layer was formed on the second emitting layer without forming the fourth emitting layer as a common layer.

A red organic EL device according to Comparative Example 2 was produced in the same manner as in Example 1 except that the first electron transporting layer was formed on the third emitting layer without forming the fourth emitting layer as a common layer.

Comparative Example 3

An organic EL display device according to Comparative Example 3 was produced in the same manner as the organic EL display device according to Comparative Example 2 except that Compound BH1 (host material) in the first emitting layer was replaced with Compound BH1-1 in producing the blue organic EL device serving as a blue pixel.

Comparative Example 4

An organic EL display device according to Comparative Example 4 was produced in the same manner as the organic EL display device according to Comparative Example 2 except that Compound BH1 (host material) in the first emitting layer was replaced with Compound BH1-2 in producing the blue organic EL device serving as a blue pixel.

Evaluation of Organic EL Device

Each organic EL device in the organic EL display devices produced in Examples 1 to 3 and Comparative Examples 1 to 4 was evaluated as described below. The evaluation results are shown in Table 1.

Drive Voltage

A current was applied between an anode and a cathode such that a current density was 100 mA/cm$^2$, where a voltage (unit: V) was measured.

External Quantum Efficiency (EQE)

A voltage was applied to each device such that a current density was 10 mA/cm$^2$, where a spectral radiance spectrum was measured with a CS—2000 spectroradiometer (manufactured by Konica Minolta Inc.). The external quantum efficiency EQE (unit: %) was calculated based on the obtained spectral radiance spectrum assuming that Lambertian radiation was performed.

Lifetime (LT90)

A voltage was applied to each organic EL device such that a current density was 50 mA/cm$^2$, and the time (LT90 (unit: h)) until the luminance became 90% of the initial luminance measured.

TABLE 1

|  | Blue Organic EL Device | | | Green Organic EL Device | | | Red Organic EL Device | | |
| --- | --- | --- | --- | --- | --- | --- | --- | --- | --- |
|  | Drive Voltage [V] | EQE [%] | LT90 [hr] | Drive Voltage [V] | EQE [%] | LT90 [hr] | Drive Voltage [V] | EQE [%] | LT90 [hr] |
| Example 1 | 5.23 | 10.0 | 511 | 5.35 | 20.1 | 325 | 5.11 | 20.4 | 484 |
| Comparative Ex. 1 | 5.37 | 8.3 | 350 | 5.15 | 19.5 | 325 | 4.93 | 20.3 | 518 |
| Comparative Ex. 2 | 5.23 | 10.0 | 511 | 5.15 | 19.5 | 325 | 4.93 | 20.3 | 518 |

TABLE 2

| | Blue Organic EL Device | | | Green Organic EL Device | | | Red Organic EL Device | | |
|---|---|---|---|---|---|---|---|---|---|
| | Drive Voltage [V] | EQE [%] | LT90 [hr] | Drive Voltage [V] | EQE [%] | LT90 [hr] | Drive Voltage [V] | EQE [%] | LT90 [hr] |
| Example 2 | 5.45 | 10.3 | 480 | 5.35 | 20.1 | 325 | 5.11 | 20.4 | 484 |
| Comparative Ex. 1 | 5.37 | 8.3 | 350 | 5.15 | 19.5 | 325 | 4.93 | 20.3 | 518 |
| Comparative Ex. 3 | 5.45 | 10.3 | 480 | 5.15 | 19.5 | 325 | 4.93 | 20.3 | 518 |

TABLE 3

| | Blue Organic EL Device | | | Green Organic EL Device | | | Red Organic EL Device | | |
|---|---|---|---|---|---|---|---|---|---|
| | Drive Voltage [V] | EQE [%] | LT90 [hr] | Drive Voltage [V] | EQE [%] | LT90 [hr] | Drive Voltage [V] | EQE [%] | LT90 [hr] |
| Example 3 | 5.68 | 9.8 | 550 | 5.35 | 20.1 | 325 | 5.11 | 20.4 | 484 |
| Comparative Ex. 1 | 5.37 | 8.3 | 350 | 5.15 | 19.5 | 325 | 4.93 | 20.3 | 518 |
| Comparative Ex. 4 | 5.68 | 9.8 | 550 | 5.15 | 19.5 | 325 | 4.93 | 20.3 | 518 |

As shown in Tables 1 to 3, in the organic EL display devices according to Examples 1 to 3, the green organic EL device and the red organic EL device exhibited performance comparable to those in Comparative Example 1 and Comparative Example 2 although the fourth emitting layer was formed in the green organic EL device and the red organic EL device as a common layer.

Furthermore, the blue organic EL device of the organic EL display device according to Example 1, as compared to the blue organic EL device of the organic EL display device according to Comparative Example 1 not including a first emitting layer, had a lower drive voltage, higher luminous efficiency, and a longer lifetime due to the lamination of the first emitting layer and the fourth emitting layer. The blue organic EL devices of the organic EL display devices according to Example 2 and Example 3, as compared to the blue organic EL device of the organic EL display device according to Comparative Example 1 not including a first emitting layer, each had higher luminous efficiency and a longer lifetime due to the lamination of the first emitting layer and the fourth emitting layer.

The blue organic EL device of the organic EL display device according to Comparative Example 2 also exhibited improved performance as compared to Comparative Example 1. In Comparative Example 2, however, the fourth emitting layer was formed not as a common layer but as a non-common layer, and thus it was necessary to form three non-common layers in succession for the formation of the blue pixel. Accordingly, the cost of processing in Comparative Example 2 is much higher than that in Example 1, the cost of processing in Comparative Example 3 is much higher than that in Example 2, and the cost of processing in Comparative Example 4 is much higher than that in Example 3. In this respect, the organic EL display device according to Example 1 is greatly superior to that of Comparative Example 2, the organic EL display device according to Example 2 is greatly superior to that of Comparative Example 3, and the organic EL display device according to Example 3 is greatly superior to that of Comparative Example 4.

According to the organic EL display devices according to Examples 1 to 3, an organic EL display device that emits light with high luminous efficiency can be produced without greatly increasing the cost of processing.

Evaluation of Compound

Triplet Energy $T_1$

A target compound was dissolved in EPA (diethyl ether: isopentane:ethanol=5:5:2 (volume ratio)) at a concentration of 10 µmol/L, and the solution was placed in a quartz cell to prepare a measurement sample. For this measurement sample, a phosphorescence spectrum (ordinate axis: phosphorescent luminous intensity, abscissa axis: wavelength) was measured at a low temperature (77K). A tangent was drawn to the rise on the short-wavelength side of the phosphorescence spectrum, and on the basis of a wavelength value $\lambda_{edge}$ [nm] at the intersection of the tangent and the abscissa axis, the amount of energy was calculated from the following conversion equation (F1) to determine the triplet energy $T_1$. It should be noted that the triplet energy $T_1$ may have an error of plus or minus about 0.02 eV depending on the measurement conditions.

$$T_1[eV]=1239.85/\lambda_{edge} \quad \text{Conversion equation (F1):}$$

The tangent to the rise on the short-wavelength side of the phosphorescence spectrum is drawn as follows. While moving on a spectrum curve from the short-wavelength side of the phosphorescence spectrum to the local maximum value closest to the short-wavelength side among local maximum values of the spectrum, a tangent at each point on the curve is imagined toward long-wavelength side. As the curve rises (i.e., as the value on the ordinate axis increases), the inclination of the tangent increases. A tangent drawn at a point where the inclination is at its maximum (i.e., a tangent at an inflection point) is employed as the tangent to the rise on the short-wavelength side of the phosphorescence spectrum.

Local maximum points with peak intensities that are 15% or less of the maximum peak intensity of the spectrum are not regarded as the above-mentioned local maximum value closest to the short-wavelength side, and a tangent drawn at a point that is closest to the local maximum value closest to the short-wavelength side and where the inclination is at its maximum is employed as the tangent to the rise on the short-wavelength side of the phosphorescence spectrum.

For phosphorescence measurement, an F-4500 spectrophotofluorometer body manufactured by Hitachi High-Tech Corporation was used.

Singlet Energy $S_1$

A toluene solution of a target compound at a concentration of 10 µmol/L was prepared and put in a quartz cell, and an absorption spectrum (ordinate axis: absorption intensity, abscissa axis: wavelength) of this sample was measured at normal temperature (300 K). A tangent was drawn to the fall on the long-wavelength side of the absorption spectrum, and a wavelength value $\lambda_{edge}$ [nm] at the intersection of the tangent and the abscissa axis was substituted into the following conversion equation (F2) to calculate the singlet energy.

$$S_1[eV]=1239.85/\lambda_{edge} \quad \text{Conversion equation (F2):}$$

A spectrophotometer (device name: U3310) manufactured by Hitachi, Ltd. was used as an absorption spectrum measuring device.

The tangent to the fall on the long-wavelength side of the absorption spectrum is drawn as follows. While moving on a spectrum curve from a local maximum value closest to the long-wavelength region among local maximum values of the absorption spectrum toward the long-wavelength side, a tangent at each point on the curve is imagined. As the curve falls (i.e., as the value on the ordinate axis decreases), the inclination of the tangent decreases and then increases in a repeated manner. A tangent drawn at a point where the inclination is at its local minimum and that is closest to the long-wavelength region (except where the absorbance is 0.1 or less) is employed as the tangent to the fall on the long-wavelength side of the absorption spectrum.

Local maximum points with absorbance values of 0.2 or less are not regarded as the local maximum value closest to the long-wavelength region.

The singlet energy $S_1$ and the triplet energy $T_1$ of each compound are shown in Table 4.

TABLE 4

| Compound | $S_1$ [eV] | $T_1$ [eV] |
|---|---|---|
| BH1 | 3.11 | 2.09 |
| BH2 | 3.01 | 1.87 |
| BH1-1 | 3.11 | 2.11 |
| BH1-2 | 3.22 | 2.27 |
| BD | 2.81 | 2.30 |

Preparation of Toluene Solution

Compound BD was dissolved in toluene at a concentration of $4.9\times10^{-6}$ mol/L to prepare a toluene solution of Compound BD.

Measurement of Maximum Fluorescence Peak Wavelength (FL-Peak)

Using a fluorescence spectrum measuring device (F-7000 spectrophotofluorometer (manufactured by Hitachi High-Tech Science Corporation)), the maximum fluorescence peak wavelength of the toluene solution of Compound BD excited at 390 nm was measured.

The maximum fluorescence peak wavelength of Compound BD was 450 nm.

The invention claimed is:

1. An organic EL display device comprising:
an anode and a cathode disposed opposite each other; and
a blue organic EL device serving as a pixel, a green organic EL device serving as a pixel, and a red organic EL device serving as a pixel, wherein
the blue organic EL device comprises a first emitting layer disposed between the anode and the cathode;
the green organic EL device comprises a second emitting layer disposed between the anode and the cathode;
the red organic EL device comprises a third emitting layer disposed between the anode and the cathode;
the blue organic EL device, the green organic EL device, and the red organic EL device comprise a fourth emitting layer disposed in common across the blue organic EL device, the green organic EL device, and the red organic EL device;
the fourth emitting layer is disposed between the cathode and the first emitting layer, the second emitting layer, and the third emitting layer;
the fourth emitting layer is in direct contact with each of the first emitting layer, the second emitting layer, and the third emitting layer;
the first emitting layer contains a first compound serving as a first host material;
the fourth emitting layer contains a second compound serving as a second host material;
the first host material and the second host material are mutually different;
the first emitting layer contains at least a compound that emits light with a maximum peak wavelength of 500 nm or less;
the fourth emitting layer contains at least a compound that emits light with a maximum peak wavelength of 500 nm or less;
the compound that is contained in the first emitting layer and that emits light with a maximum peak wavelength of 500 nm or less and the compound that is contained in the fourth emitting layer and that emits light with a maximum peak wavelength of 500 nm or less are mutually the same or different;
a triplet energy $T_1(H1)$ of the first host material and a triplet energy $T_1(H2)$ of the second host material satisfy a relationship of a numerical formula (Numerical Formula 1A) below:

$$T_1(H1) > T_1(H2) \quad \text{(Numerical Formula 1A), and}$$

the triplet energy $T_1(H1)$ of the first host material satisfies a relationship of a numerical formula (Numerical Formula 12C) below:

$$2.08\ eV > T_1(H1) > 1.87\ eV \quad \text{(Numerical Formula 12C).}$$

2. The organic EL display device according to claim 1, wherein
a triplet energy $T_1(F1)$ of the compound that is contained in the first emitting layer and that emits light with a maximum peak wavelength of 500 nm or less satisfies a relationship of a numerical formula (Numerical Formula 14A) below:

$$2.60\ eV > T_1(F1) \quad \text{(Numerical Formula 14A).}$$

3. The organic EL display device according to claim 1, wherein
a triplet energy $T_1(F2)$ of the compound that is contained in the fourth emitting layer and that emits light with a maximum peak wavelength of 500 nm or less satisfies a relationship of a numerical formula (Numerical Formula 14C) below:

$$2.60\ eV > T_1(F2) \quad \text{(Numerical Formula 14C).}$$

4. The organic EL display device according to claim 1, wherein
the triplet energy $T_1(H2)$ of the second host material satisfies a relationship of a numerical formula (Numerical Formula 13) below:

$$T_1(H2) \geq 1.9\ eV \quad \text{(Numerical Formula 13).}$$

5. The organic EL display device according to claim 1, wherein
the first host material has, in a molecule, a linking structure including a benzene ring and a naphthalene ring linked to each other through a single bond;

the benzene ring and the naphthalene ring in the linking structure are each independently further fused or not fused with a monocyclic ring or a fused ring; and the benzene ring and the naphthalene ring in the linking structure are further linked to each other through a cross-link at at least one position other than the single bond.

6. The organic EL display device according to claim 5, wherein the cross-link includes a double bond.

7. The organic EL display device according to claim 1, wherein the first host material has, in a molecule, a biphenyl structure in which a first benzene ring and a second benzene ring are linked to each other through a single bond, and the first benzene ring and the second benzene ring in the biphenyl structure are further linked to each other through a cross-link at at least one position other than the single bond.

8. The organic EL display device according to claim 7, wherein the first benzene ring and the second benzene ring in the biphenyl structure are further linked to each other through the cross-link at one position other than the single bond.

9. The organic EL display device according to claim 7, wherein the cross-link includes a double bond.

10. The organic EL display device according to claim 8, wherein the first benzene ring and the second benzene ring in the biphenyl structure are further linked to each other through the cross-link at two positions other than the single bond, and the cross-link does not include a double bond.

11. An organic EL display device comprising:

an anode and a cathode disposed opposite each other; and a blue organic EL device serving as a pixel, a green organic EL device serving as a pixel, and a red organic EL device serving as a pixel, wherein the blue organic EL device comprises a first emitting layer disposed between the anode and the cathode;

the green organic EL device comprises a second emitting layer disposed between the anode and the cathode;

the red organic EL device comprises a third emitting layer disposed between the anode and the cathode;

the blue organic EL device, the green organic EL device, and the red organic EL device comprise a fourth emitting layer disposed in common across the blue organic EL device, the green organic EL device, and the red organic EL device;

the fourth emitting layer is disposed between the cathode and the first emitting layer, the second emitting layer, and the third emitting layer;

the fourth emitting layer is in direct contact with each of the first emitting layer, the second emitting layer, and the third emitting layer;

the first emitting layer contains a first compound represented by a formula (1) below;

the first compound has at least one group represented by a formula (11) below; and the fourth emitting layer contains a second compound represented by a formula (2) below;

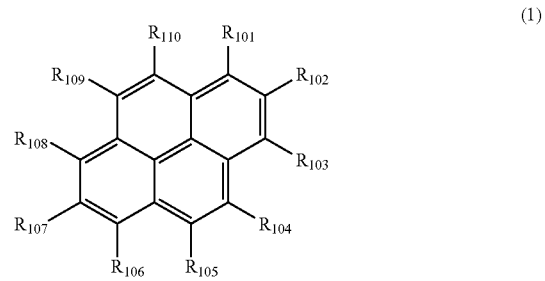

where: in the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1),

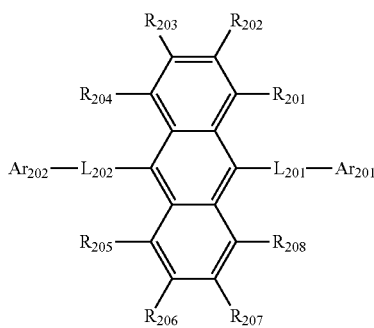

(2)

where:
- $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;
- $L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and
- $Ar_{201}$ and $Ar_{202}$ are each independently a substituted or unsubstituted aryl group having 6 to 50 ring carbon atoms, or a substituted or unsubstituted heterocyclic group having 5 to 50 ring atoms; and
- in the first compound represented by the formula (1) and the second compound represented by the formula (2), $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;
- when a plurality of $R_{901}$ are present, the plurality of $R_{901}$ are mutually the same or different;
- when a plurality of $R_{902}$ are present, the plurality of $R_{902}$ are mutually the same or different;
- when a plurality of $R_{903}$ are present, the plurality of $R_{903}$ are mutually the same or different;
- when a plurality of $R_{904}$ are present, the plurality of $R_{904}$ are mutually the same or different;
- when a plurality of $R_{905}$ are present, the plurality of $R_{905}$ are mutually the same or different;
- when a plurality of $R_{906}$ are present, the plurality of $R_{906}$ are mutually the same or different;
- when a plurality of $R_{907}$ are present, the plurality of $R_{907}$ are mutually the same or different;
- when a plurality of $R_{801}$ are present, the plurality of $R_{801}$ are mutually the same or different;
- when a plurality of $R_{802}$ are present, the plurality of $R_{802}$ are mutually the same or different, and
- a triplet energy $T_1(H1)$ of the first compound represented by the formula (1) satisfies a relationship of a numerical formula (Numerical Formula 12C) below:

$$2.08\ eV > T_1(H1) > 1.87\ eV \quad \text{(Numerical Formula 12C)}.$$

12. The organic EL display device according to claim 1, wherein the first emitting layer contains a third compound that is fluorescent.

13. The organic EL display device according to claim 12, wherein the third compound is a compound that emits light with a maximum peak wavelength in a range from 430 nm to 480 nm.

14. The organic EL display device according to claim 1, wherein the fourth emitting layer contains a fourth compound that is fluorescent.

15. The organic EL display device according to claim 14, wherein the fourth compound is a compound that emits light with a maximum peak wavelength in a range from 430 nm to 480 nm.

16. The organic EL display device according to claim 1, wherein
the blue organic EL device includes a first hole transporting layer that is disposed between the anode and the first emitting layer and that is in direct contact with the first emitting layer;
the green organic EL device includes a second hole transporting layer that is disposed between the anode and the second emitting layer and that is in direct contact with the second emitting layer; and
the red organic EL device includes a third hole transporting layer that is disposed between the anode and the third emitting layer and that is in direct contact with the third emitting layer.

17. The organic EL display device according to claim 16, wherein
a film thickness $D_{HT1}$ of the first hole transporting layer, a film thickness $D_{HT2}$ of the second hole transporting layer, and a film thickness $D_{HT3}$ of the third hole transporting layer satisfy a relationship of a numerical formula (Numerical Formula 1) below:

$$D_{HT1} < D_{HT2} < D_{HT3} \quad \text{(Numerical Formula 1)}.$$

18. The organic EL display device according to claim 16, wherein
layers other than the first emitting layer, the second emitting layer, the third emitting layer, the first hole transporting layer, the second hole transporting layer, and the third hole transporting layer are disposed in common across the blue organic EL device, the green organic EL device, and the red organic EL device.

19. The organic EL display device according to claim 1, wherein the fourth emitting layer has a film thickness $D_{EM4}$ larger than a film thickness $D_{EM1}$ of the first emitting layer.

20. The organic EL display device according to claim 1, wherein
  a film thickness $D_{EM4}$ of the fourth emitting layer and a film thickness $D_{EM1}$ of the first emitting layer satisfy a relationship of a numerical formula (Numerical Formula 2) below:

$$5 \leq D_{EM4} - D_{EM1} \leq 28 \quad \text{(Numerical Formula 2)}.$$

21. The organic EL display device according to claim 1, wherein
  the fourth emitting layer has a film thickness $D_{EM4}$ in a range from 12.5 nm to 30 nm.

22. The organic EL display device according to claim 1, wherein
  the first emitting layer has a film thickness $D_{EM1}$ in a range from 2 nm to 12.5 nm.

23. The organic EL display device according to claim 1, wherein
  the second emitting layer contains a fifth compound that is phosphorescent, and
  the third emitting layer contains a sixth compound that is phosphorescent.

24. An electronic device comprising the organic EL display device according to claim 1.

* * * * *